US012660307B2

(12) United States Patent (10) Patent No.: US 12,660,307 B2
Yu et al. (45) Date of Patent: Jun. 16, 2026

(54) SEMICONDUCTOR DEVICE AND METHOD OF FABRICATING THE SAME

(71) Applicant: Samsung Electronics Co., Ltd., Suwon-si (KR)

(72) Inventors: Hyun-Kwan Yu, Suwon-si (KR); Sunyoung Lee, Suwon-si (KR); Hayoung Jeon, Suwon-si (KR); Hwiseok Jun, Suwon-si (KR); Ji Hoon Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 564 days.

(21) Appl. No.: 18/182,563

(22) Filed: Mar. 13, 2023

(65) Prior Publication Data

US 2024/0055428 A1 Feb. 15, 2024

(30) Foreign Application Priority Data

Aug. 9, 2022 (KR) ........................ 10-2022-0099142

(51) Int. Cl.
| | |
|---|---|
| *H10D 84/85* | (2025.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC ........... *H10D 84/85* (2025.01); *H10D 30/014* (2025.01); *H10D 30/43* (2025.01); *H10D 30/6735* (2025.01); *H10D 62/121* (2025.01);

*H10D 62/151* (2025.01); *H10D 62/292* (2025.01); *H10D 84/0167* (2025.01); *H10D 84/017* (2025.01); *H10D 84/038* (2025.01)

(58) Field of Classification Search
None
See application file for complete search history.

(56) References Cited

U.S. PATENT DOCUMENTS

| | | | |
|---|---|---|---|
| 8,299,453 | B2 | 10/2012 | Zhu |
| 9,627,273 | B2 | 4/2017 | Kim |

(Continued)

FOREIGN PATENT DOCUMENTS

| | | |
|---|---|---|
| CN | 114823525 A | 7/2022 |
| KR | 10-2033579 B1 | 10/2019 |
| TW | 202209574 A | 3/2022 |

*Primary Examiner* — Xiaoming Liu
(74) *Attorney, Agent, or Firm* — Fish & Richardson P.C.

(57) ABSTRACT

A semiconductor device comprises a substrate including NMOSFET and PMOSFET regions, first and second channel patterns on the NMOSFET and PMOSFET regions, respectively, and each including respective semiconductor patterns spaced apart from and vertically stacked on each other, first and second source/drain patterns on the NMOS-FET and NMOSFET regions and connected to the first and second channel patterns, respectively, and a gate electrode on the first and second channel patterns. The gate electrode includes a first inner electrode between neighboring semiconductor patterns of the first channel pattern, and a second inner electrode between neighboring semiconductor patterns of the second channel pattern. A top surface of the first inner electrode is more convex than a top surface of the second inner electrode.

19 Claims, 47 Drawing Sheets

(51) Int. Cl.

| | | |
|---|---|---|
| *H10D 62/13* | (2025.01) | |
| *H10D 62/17* | (2025.01) | |
| *H10D 84/01* | (2025.01) | |
| *H10D 84/03* | (2025.01) | |

(56) References Cited

U.S. PATENT DOCUMENTS

| | | | |
|---|---|---|---|
| 10,692,866 | B2 | 6/2020 | Ando et al. |
| 10,700,064 | B1 | 6/2020 | Zhang et al. |
| 10,886,368 | B2 | 1/2021 | Zhang et al. |
| 11,031,395 | B2 | 6/2021 | Ohtou et al. |
| 2020/0043802 | A1* | 2/2020 | Cheng ............... H01L 21/02236 |
| 2020/0066839 | A1* | 2/2020 | Zhang ................. H10D 30/014 |
| 2021/0066137 | A1 | 3/2021 | Hsu et al. |
| 2021/0202756 | A1 | 7/2021 | Chang et al. |
| 2021/0202758 | A1 | 7/2021 | Yeong et al. |
| 2021/0407998 | A1 | 12/2021 | Yang et al. |
| 2021/0408289 | A1 | 12/2021 | Guha et al. |
| 2022/0069135 | A1 | 3/2022 | Chu et al. |
| 2022/0157811 | A1* | 5/2022 | You ..................... H10D 64/251 |
| 2022/0173253 | A1 | 6/2022 | Yeom et al. |
| 2022/0285533 | A1 | 9/2022 | Lee et al. |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0099142 filed on Aug. 9, 2022 in the Korean Intellectual Property Office, the disclosure of which is hereby incorporated by reference in its entirety.

BACKGROUND

The present inventive concepts relate to semiconductor devices and methods of fabricating the same, and more particularly, to semiconductor devices including a field effect transistor and methods of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some example embodiments of the present inventive concepts provide a semiconductor device with increased reliability and improved electrical properties.

Some example embodiments of the present inventive concepts provide a method of fabricating a semiconductor device with increased reliability and improved electrical properties.

According to some example embodiments of the present inventive concepts, a semiconductor device may comprise: a substrate including an NMOSFET region and a PMOSFET region that are opposite to each other; a first channel pattern on the NMOSFET region and a second channel pattern on the PMOSFET region, each of the first and second channel patterns including a plurality of semiconductor patterns that are spaced apart from and vertically stacked on each other; a first source/drain pattern on the NMOSFET region and a second source/drain pattern on the NMOSFET region, the first source/drain pattern being connected to the first channel pattern, and the second source/drain pattern being connected to the second channel pattern; and a gate electrode on the first and second channel patterns. The gate electrode may include: a first inner electrode between neighboring semiconductor patterns of the plurality of semiconductor patterns of the first channel pattern; and a second inner electrode between neighboring semiconductor patterns of the plurality of semiconductor patterns of the second channel pattern. A top surface of the first inner electrode may be more convex than a top surface of the second inner electrode.

According to some example embodiments of the present inventive concepts, a semiconductor device may comprise: a substrate that includes an active pattern; a channel pattern on the active pattern, the channel pattern including a plurality of semiconductor patterns that are spaced apart from and vertically stacked on each other; a source/drain pattern that connects the plurality of semiconductor patterns to each other; and a gate electrode on the plurality of semiconductor patterns. The gate electrode may include a first inner electrode and a second inner electrode that are adjacent to each other. The plurality of semiconductor patterns may include a first semiconductor pattern between the first and second inner electrodes. The first semiconductor pattern may include: a central part between a convex top surface of the first inner electrode and a convex bottom surface of the second inner electrode; and a side part connected to the source/drain pattern. A thickness of the central part may have a minimum value at a center of the central part of the first semiconductor pattern and may progressively increase in a direction from the center of the central part of the first semiconductor pattern toward the side part of the first semiconductor pattern, the minimum value of the thickness of the central part of the first semiconductor pattern being a minimum thickness of the central part of the first semiconductor pattern. A ratio of the minimum thickness of the central part of the first semiconductor pattern to a thickness of the side part of the first semiconductor pattern may be in a range of about 0.2 to about 0.8.

According to some example embodiments of the present inventive concepts, a semiconductor device may comprise: a substrate including an NMOSFET region and a PMOSFET region that are opposite to each other; a device isolation layer that fills a trench between the NMOSFET region and the PMOSFET region; a first channel pattern on the NMOSFET region and a second channel pattern on the PMOSFET region, each of the first and second channel patterns including a plurality of semiconductor patterns that are spaced apart from and vertically stacked on each other; a first source/drain pattern on the NMOSFET region and a second source/drain pattern on the NMOSFET region, the first source/drain pattern connected to the first channel pattern, and the second source/drain pattern connected to the second channel pattern; a gate electrode on the first and second channel patterns, the gate electrode including a first inner electrode between neighboring semiconductor patterns of the plurality of semiconductor patterns of the first channel pattern and a second inner electrode between neighboring semiconductor patterns of the plurality of semiconductor patterns of the second channel pattern; a gate dielectric layer that surrounds each of the first and second inner electrodes; a gate spacer on a sidewall of the gate electrode; a gate capping pattern on a top surface of the gate electrode; an interlayer dielectric layer on the gate capping pattern; an active contact that penetrates the interlayer dielectric layer to come into electrical connection with one of the first source/drain pattern or the second source/drain pattern; a metal-semiconductor compound layer between the active contact and the first source/drain pattern or the second source/drain pattern; a gate contact that penetrates the interlayer dielectric layer and the gate capping pattern to come into electrical connection with the gate electrode; a first metal layer on the interlayer dielectric layer, the first metal layer including a power line and first wiring lines, the first wiring lines electrically connected to separate, respective contacts of the active contact or the gate contact; and a second metal layer on the first metal layer. The second metal layer may include second wiring lines electrically connected to the first metal layer. The first channel pattern may include a first semiconductor pattern adjacent to a convex top surface of the first inner electrode. The second channel pattern may include a second semiconductor pattern adjacent to a top surface of the second inner electrode. A maximum thickness of the first inner electrode may be greater than a maximum thickness of the second inner electrode. A minimum thickness of the first semiconductor pattern may be less than a minimum thickness of the second semiconductor pattern.

According to some example embodiments of the present inventive concepts, a method of fabricating a semiconductor device may comprise: forming a stack pattern on a substrate, the stack pattern including active layers and sacrificial layers that are alternately stacked on the substrate; forming a sacrificial pattern on the stack pattern, the sacrificial pattern extending in a first direction; using the sacrificial pattern as a mask to etch the stack pattern to form a recess in the stack pattern, such that the active layers of the stack pattern each include neighboring semiconductor patterns that are exposed by the recess; performing a selective epitaxial growth process in which the neighboring semiconductor patterns exposed by the recess are used as a seed to form a source/drain pattern that fills the recess; removing the sacrificial pattern and the sacrificial layers to form an inner region between the neighboring semiconductor patterns; partially forming a spacer layer in the inner region; performing a dry etching process on the spacer layer to reduce a thickness in a vertical direction of the spacer layer; performing a wet etching process on the spacer layer to expose the neighboring semiconductor patterns; and forming an inner electrode in the inner region. The wet etching process may over-etch the neighboring semiconductor patterns to cause the inner region to have a convex floor and a convex ceiling.

DETAILED DESCRIPTION

Figure 1:
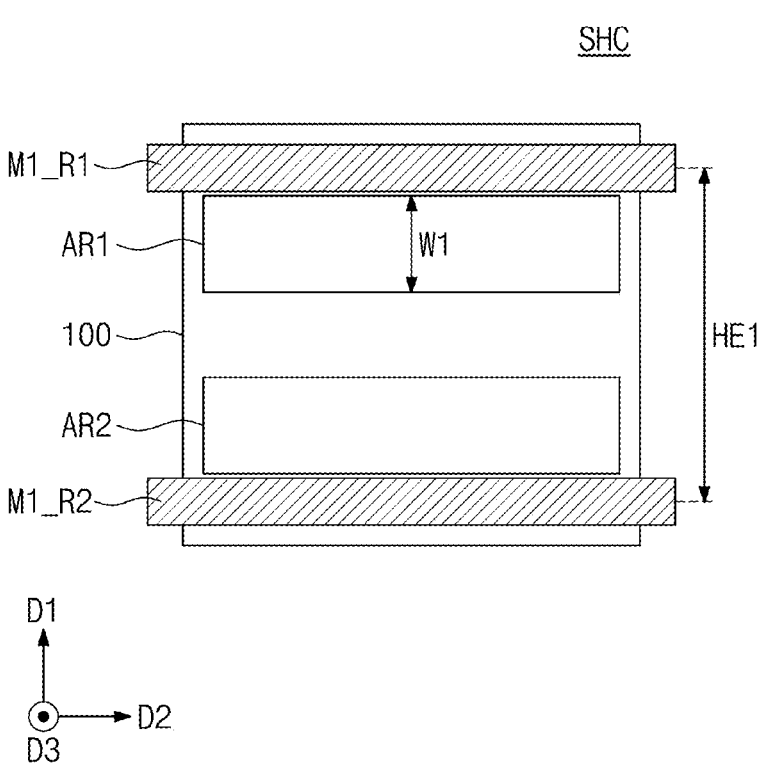
FIGS. 1, 2, and 3 illustrate conceptual views showing logic cells of a semiconductor device according to some example embodiments of the present inventive concepts.

Some example embodiments of the present inventive concepts will now be described in detail with reference to the accompanying drawings to aid in clearly explaining the present inventive concepts. In this specification, terms indicating an order such as first, and second, are used to distinguish components having the same/similar functions as/to each other, and the first and second may be changed depending on an order in which they are mentioned.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Figure 2:
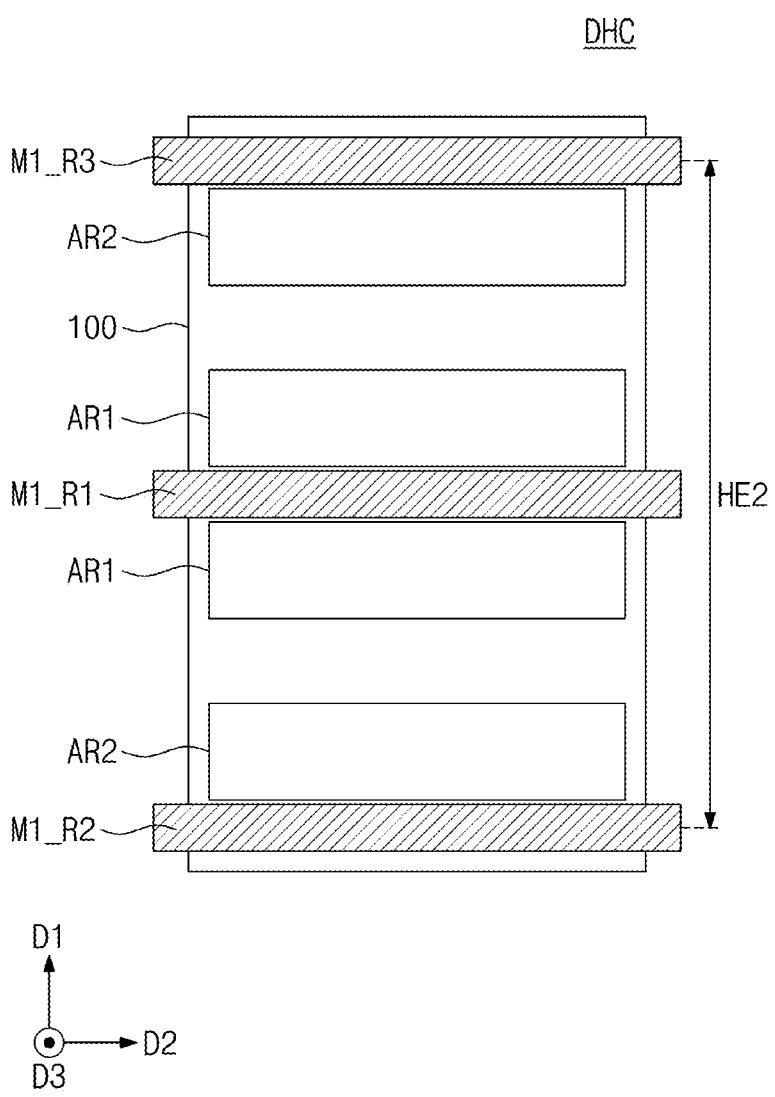
Figure 3:
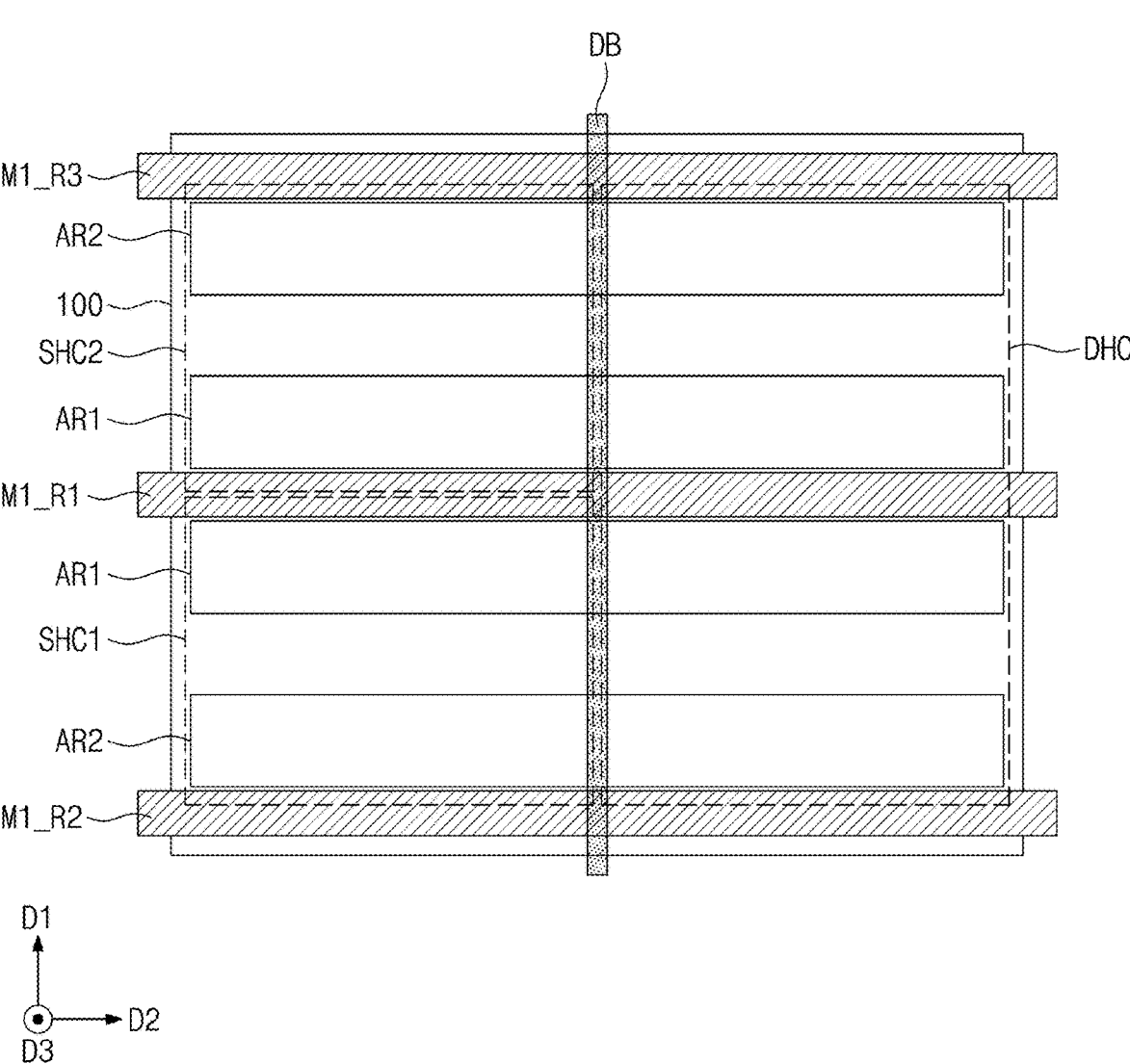

FIGS. 1, 2, and 3 illustrate conceptual views showing logic cells of a semiconductor device according to some example embodiments of the present inventive concepts.

Referring to FIG. 1, a single height cell SHC may be provided. For example, a substrate 100 may be provided thereon with a first power line M1_R1 and a second power line M1_R2. The first power line M1_R1 may be a path for providing a source voltage VSS, for example, a ground voltage. The second power line M1_R2 may be a path for providing a drain voltage VDD, for example, a power voltage.

The single height cell SHC may be defined between the first power line M1_R1 and the second power line M1_R2. The single height cell SHC may include one first active region AR1 and one second active region AR2. One of the first and second active regions AR1 and AR2 may be a PMOSFET region, and the other of the first and second active regions AR1 and AR2 may be an NMOSFET region. For example, the single height cell SHC may have a complementary metal oxide semiconductor (CMOS) structure provided between the first power line M1_R1 and the second power line M1_R2.

Each of the first and second active regions AR1 and AR2 may have a first width W1 in a first direction D1. A first height HE1 may be defined to indicate a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a source voltage VSS.

The double height cell DHC may be defined between the second power line M1_R2 and the third power line M1_R3. The double height cell DHC may include two first active regions AR1 and two second active regions AR2.

One of the two second active regions AR2 may be adjacent to the second power line M1_R2. The other of the two second active regions AR2 may be adjacent to the third power line M1_R3. The two first active regions AR1 may be adjacent to the first power line M1_R1. When viewed in plan, the first power line M1_R1 may be disposed between the two first active regions AR1.

A second height HE2 may be defined to indicate a length in the first direction D1 of the double height cell DHC. The second height HE2 may be about twice the first height HE1 of FIG. 1. The two first active regions AR1 of the double height cell DHC may be collectively connected together to act as one active region.

In the present inventive concepts, the double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be located between a first power line M1_R1 and a second power line M1_R2. The second single height cell SHC2 may be located between the first power line M1_R1 and a third power line M1_R3. The second single height cell SHC2 may be adjacent in a first direction D1 to the first single height cell SHC1.

The double height cell DHC may be disposed between the second power line M1_R2 and the third power line M1_R3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
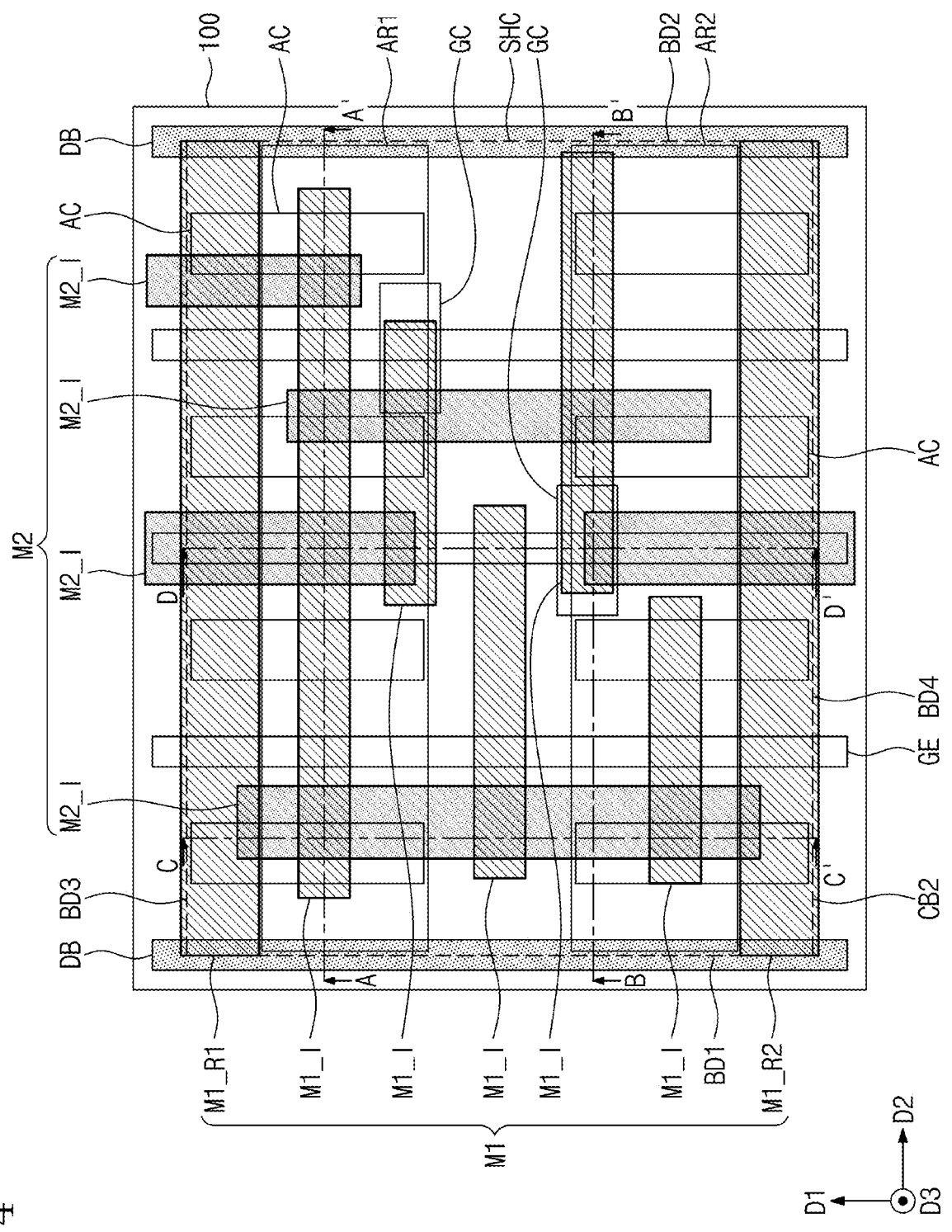
FIG. 4 illustrates a plan view showing a semiconductor device according to some example embodiments of the present inventive concepts.
Figure 5A:
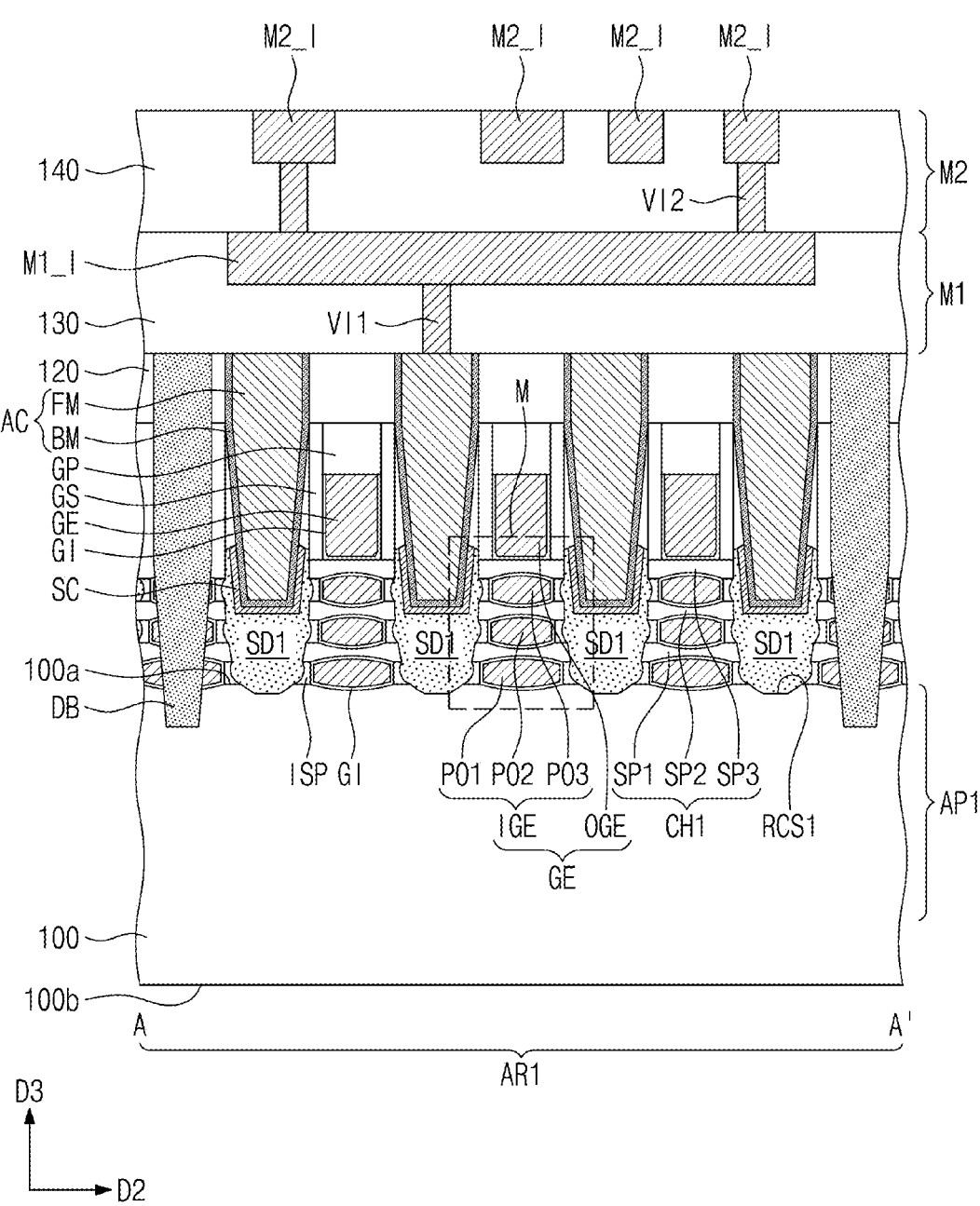
FIGS. 5A, 5B, 5C, and 5D illustrate cross-sectional views respectively taken along lines A-A', B-B', C-C', and D-D' of FIG. 4 according to some example embodiments of the present inventive concepts.
Figure 5B:
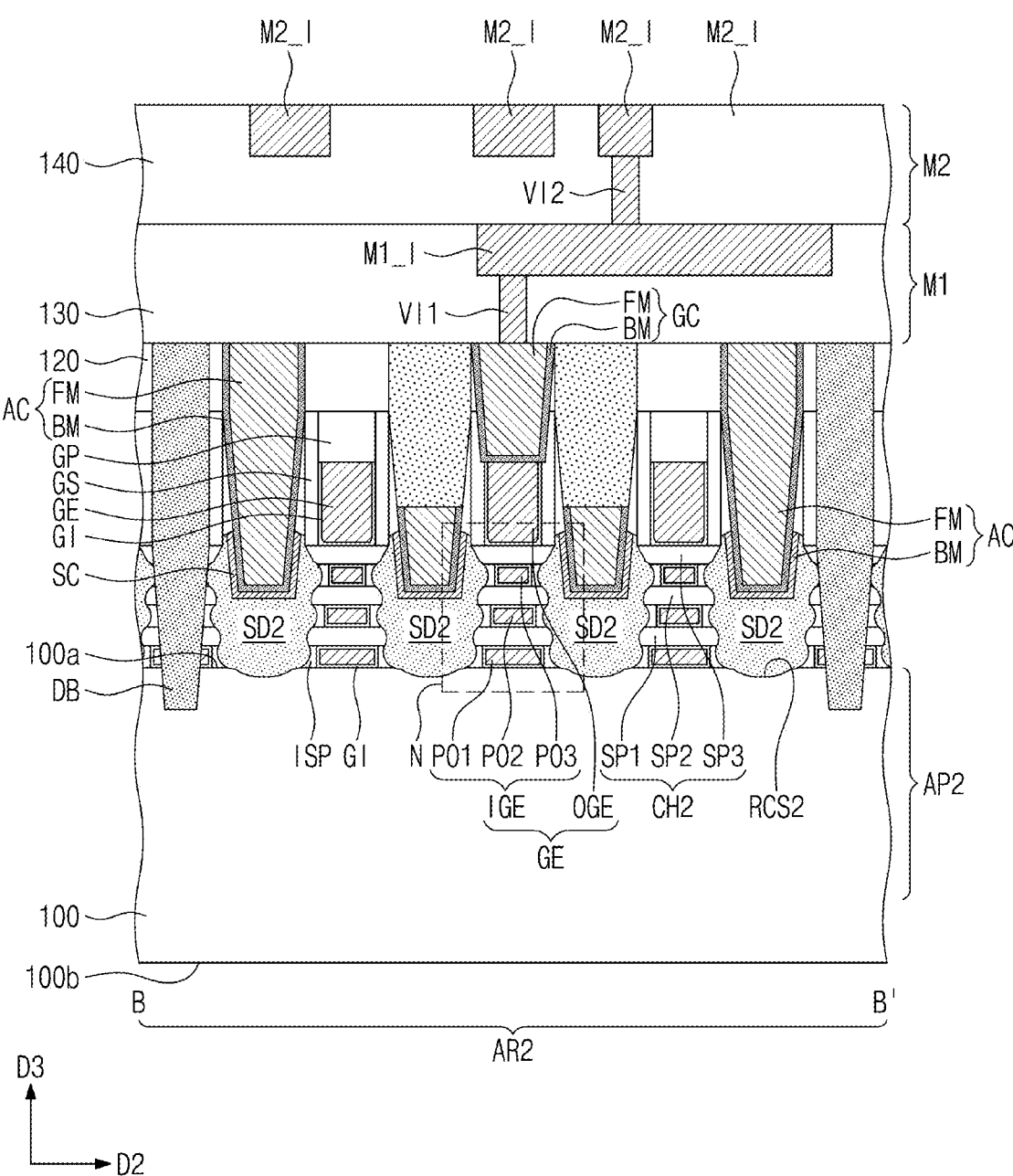
Figure 5C:
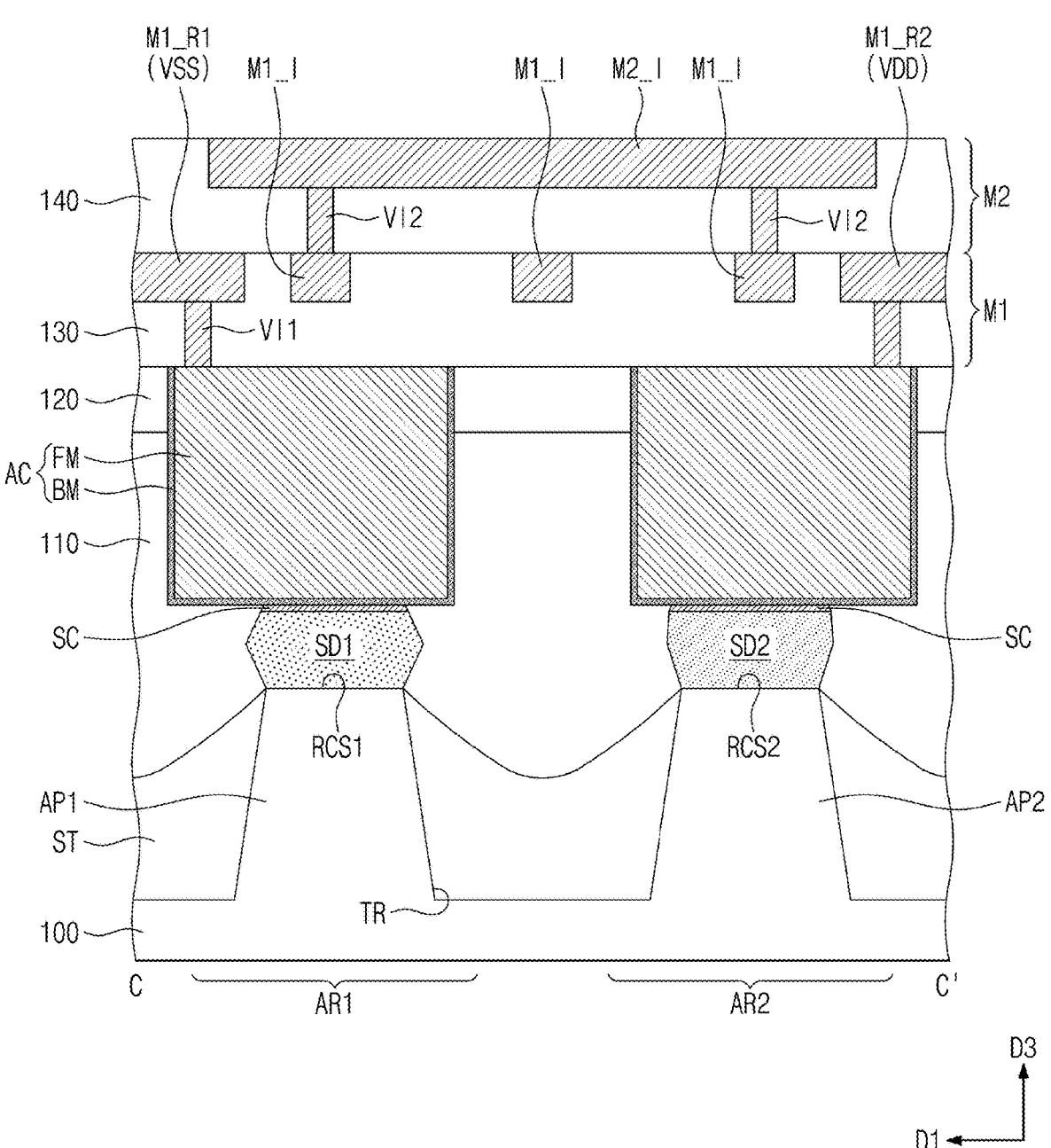

FIG. 4 illustrates a plan view showing a semiconductor device according to some example embodiments of the present inventive concepts. FIGS. 5A, 5B, 5C, and 5D illustrate cross-sectional views respectively taken along lines A-A', B-B', C-C', and D-D', respectively, of FIG. 4 according to some example embodiments of the present inventive concepts. FIG. 6A illustrates an enlarged view showing an example of section M depicted in FIG. 5A according to some example embodiments of the present inventive concepts. FIG. 6B illustrates an enlarged view showing an example of section N depicted in FIG. 5B according to some example embodiments of the present inventive concepts. A semiconductor device depicted in FIGS. 4 and 5A to 5D is a detailed example of the single height cell SHC shown in FIG. 1.

Referring to FIGS. 4 and 5A to 5D, a single height cell SHC may be provided on a substrate 100. The single height cell SHC may be provided thereon with logic transistors included in a logic circuit. The substrate 100 may be a compound semiconductor substrate or a semiconductor substrate including silicon, germanium, or silicon-germanium. For example, the substrate 100 may be a silicon substrate.

The substrate 100 may include a first active region AR1 and a second active region AR2. Each of the first and second active regions AR1 and AR2 may extend in a second direction D2. In some example embodiments, the first active region AR1 may be an NMOSFET region, and the second active region AR2 may be a PMOSFET region.

As shown in FIGS. 4 and 5A to 5D, the first direction D1 may extend in parallel to a top surface 100a and/or a bottom surface 100b of the substrate 100, the second direction D2 may extend in parallel to the top surface 100a and/or the bottom surface 100b of the substrate 100 and may further extend perpendicular to the first direction D1, and the third direction D3 may extend perpendicular to the top surface 100a and/or the bottom surface 100b of the substrate 100 and thus may extend perpendicular to both the first direction D1 and the second direction D2.

A first active pattern AP1 and a second active pattern AP2 may be defined by a trench TR formed on an upper portion of the substrate 100. The first active pattern AP1 may be provided on the first active region AR1, and the second active pattern AP2 may be provided on the second active region AR2. The first and second active patterns AP1 and AP2 may extend in the second direction D2. The first and second active patterns AP1 and AP2 may be vertically protruding portions of the substrate 100.

A device isolation layer ST may be provided on the substrate 100. The device isolation layer ST may fill the trench TR. The device isolation layer ST may include a silicon oxide layer. The device isolation layer ST may not cover any of first and second channel patterns CH1 and CH2 which will be discussed below.

A first channel pattern CH1 may be provided on the first active pattern APE A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction (or a third direction D3).

Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon, for example, monocrystalline silicon. In some example embodiments of the present inventive concepts, the first, second, and third semiconductor patterns SP1, SP2, and SP3 may be stacked nano-sheets.

A plurality of first source/drain patterns SD1 may be provided on the first active pattern AP1. A plurality of first recesses RCS1 may be formed on an upper portion of the first active pattern AP1. The first source/drain patterns SD1 may be correspondingly provided in the first recesses RCS1. As described herein, where an element ("structure") is described to be "correspondingly provided" to another element, structure, space, or the like and/or to have a surface that "corresponds to" a surface of the other element, structure, space, or the like, it will be understood that a surface of the element may be in contact with, and may have a complementary shape to, a corresponding surface of the other element, structure, space, or the like. The first source/drain patterns SD1 may be impurity regions of a first conductivity type (e.g., n-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. A plurality of second recesses RCS2 may be formed on an upper portion of the second active pattern AP2. The second source/drain patterns SD2 may be correspondingly provided in the second recesses RCS2. The second source/drain patterns SD2 may be impurity regions of a second conductivity type (e.g., p-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth process. For example, each of the first and second source/drain patterns SD1 and SD2 may have a top surface higher than that of the third semiconductor pattern SP3. For another example, at least one of the first and second source/drain patterns SD1 and SD2 may have a top surface at substantially the same level as that of a top surface of the third semiconductor pattern SP3.

In the present specification, the term 'level', 'vertical level', 'depth', 'height', or the like may mean a vertical height (e.g., vertical distance in the third direction D3) measured from a reference location (e.g., the top surface 100a or the bottom surface 100b of the substrate 100) in a direction perpendicular to the plane or surface at the reference location (e.g., the third direction D3, which may be a vertical direction perpendicular to the top surface 100a and/or the bottom surface 100b of the substrate 100). For example, where elements (e.g., surfaces) are described herein to be at different levels, it will be understood that the respective distances of the elements from the reference location (e.g., the top surface 100a of the substrate 100) in the vertical direction (e.g., third direction D3) may be different from each other. In another example, where a level of a first element is described herein to be between at least two other elements, it will be understood that the first element is between the at least two other elements in the vertical direction. In another example, where a level of a first element is described herein to be lower, less, or smaller than a level of a second element, it will be understood that the distance of the first element from the reference location (e.g., the top surface 100a of the substrate 100) in the vertical direction may be smaller than the distance of the second element from the reference location in the vertical direction. In another example, where a level of a first element is described herein to be higher, larger, or greater than a level of a second element, it will be understood that the distance of the first element from the reference location (e.g., the top surface 100a of the substrate 100) in the vertical direction may be greater than the distance of the second element from the reference location in the vertical direction. In another example, where a level of a first element is described herein to be the same or substantially the same as a level of a second element or "at" the level of the second element, it will be understood that the distance of the first element from the reference location (e.g., the top surface 100a of the substrate 100) in the vertical direction may be the same or substantially the same as the distance of the second element from the reference location in the vertical direction. In some example embodiments, a 'height' of an element may refer to a dimension of the element in the vertical direction (e.g., length of the element between opposing top/bottom surfaces of the element in the vertical direction). The vertical direction as described herein may be the third direction D3 which may be perpendicular to both the first and second directions D1 and D2. In some example embodiments, a 'tier' at which an element may be located or included within may refer to a level in the vertical direction. The vertical direction as described herein may be the third direction D3 which may be perpendicular to both the first and second directions D1 and D2.

In some example embodiments of the present inventive concepts, the first source/drain patterns SD1 may include the same semiconductor element (e.g., Si) as that of the substrate 100. The second source/drain patterns SD2 may include a semiconductor element (e.g., SiGe) whose lattice constant is greater than that of a semiconductor element of the substrate 100. Therefore, a pair of second source/drain patterns SD2 may provide the second channel pattern CH2 with compressive stress.

Each of the first and second source/drain patterns SD1 and SD2 may have an uneven embossing shape at a sidewall thereof. For example, each of the first and second source/drain patterns SD1 and SD2 may have a wavy profile at a sidewall thereof. The sidewall of each of the first and second source/drain patterns SD1 and SD2 may protrude toward first, second, and third inner electrodes PO1, PO2, and PO3 of a gate electrode GE which will be discussed below. In some example embodiments of the present inventive concepts, the sidewall of the second source/drain pattern SD2 may be more rugged than the sidewall of the first source/drain pattern SD1. For example, the sidewall of the second source/drain pattern SD2 may protrude more than the sidewall of the first source/drain pattern SD1.

The first and second channel patterns CH1 and CH2 may be provided thereon with gate electrodes GE. Etch of the gate electrodes GE may extend in a first direction D1, while running across the first and second channel patterns CH1 and CH2. Each of the gate electrodes GE may vertically overlap the first and second channel patterns CH1 and CH2. The gate electrodes GE may be arranged at a first pitch in the second direction D2.

The gate electrode GE may include an inner electrode IGE interposed between the nano-sheets and an outer gate electrode OGE provided outside the nano-sheets. For example, the inner electrode IGE may include a first inner electrode PO1 interposed between the active pattern AP1 or AP1 and the first semiconductor pattern SP1, a second inner electrode PO2 interposed between the first semiconductor pattern SP1 and the second semiconductor pattern SP2, and a third inner electrode PO3 interposed between the second semiconductor pattern SP2 and the third semiconductor pattern SP3. The outer gate electrode OGE may be provided on the third semiconductor pattern SP3.

In some example embodiments, one of the inner electrodes of the inner electrode IGE (e.g., the second inner electrode PO2) vertically overlapping semiconductor patterns of the first channel pattern CH1 may be referred to as a first inner electrode that is between neighboring semiconductor patterns (e.g., SP1 and SP2) of the plurality of semiconductor patterns of the first channel pattern CH1. In some example embodiments, one of the inner electrodes of the inner electrode IGE (e.g., the second inner electrode PO2) vertically overlapping (e.g., overlapping in the third direction D3) semiconductor patterns of the second channel pattern CH2 may be referred to as a second inner electrode that is between neighboring semiconductor patterns (e.g., SP1 and SP2) of the plurality of semiconductor patterns of the second channel pattern CH2. It will be understood that "neighboring" elements as described herein, for example neighboring semiconductor patterns SP1 and SP2 of the first channel pattern CH1, may be interchangeably referred to as "adjacent" elements (e.g., the first and second semiconductor patterns SP1 and SP2 of the first channel pattern CH1 may be referred to interchangeably as "neighboring" or "adjacent" semiconductor patterns of the plurality of semiconductor patterns of the first channel pattern CH1, and the first and second semiconductor patterns SP1 and SP2 of the second channel pattern CH2 may be referred to interchangeably as "neighboring" or "adjacent" semiconductor patterns of the plurality of semiconductor patterns of the first channel pattern CH2).

In some example embodiments, the first semiconductor pattern SP1 of a given channel pattern CH1 and/or CH2 and a vertically overlapping (e.g., overlapping in the third direction D3) active pattern AP1 and/or AP2 may be referred to as "neighboring" and/or "adjacent" semiconductor patterns of the plurality of semiconductor patterns of the given channel pattern CH1 and/or CH2, such that, in some example embodiments, the first inner electrode PO1 of the first channel pattern CH1 may be referred to as a first inner electrode between adjacent semiconductor patterns of the plurality of semiconductor patterns of the first channel pattern CH1 and the first inner electrode PO1 of the second channel pattern CH2 may be referred to as a second inner electrode between adjacent semiconductor patterns of the plurality of semiconductor patterns of the second channel pattern CH2.

Figure 5D:
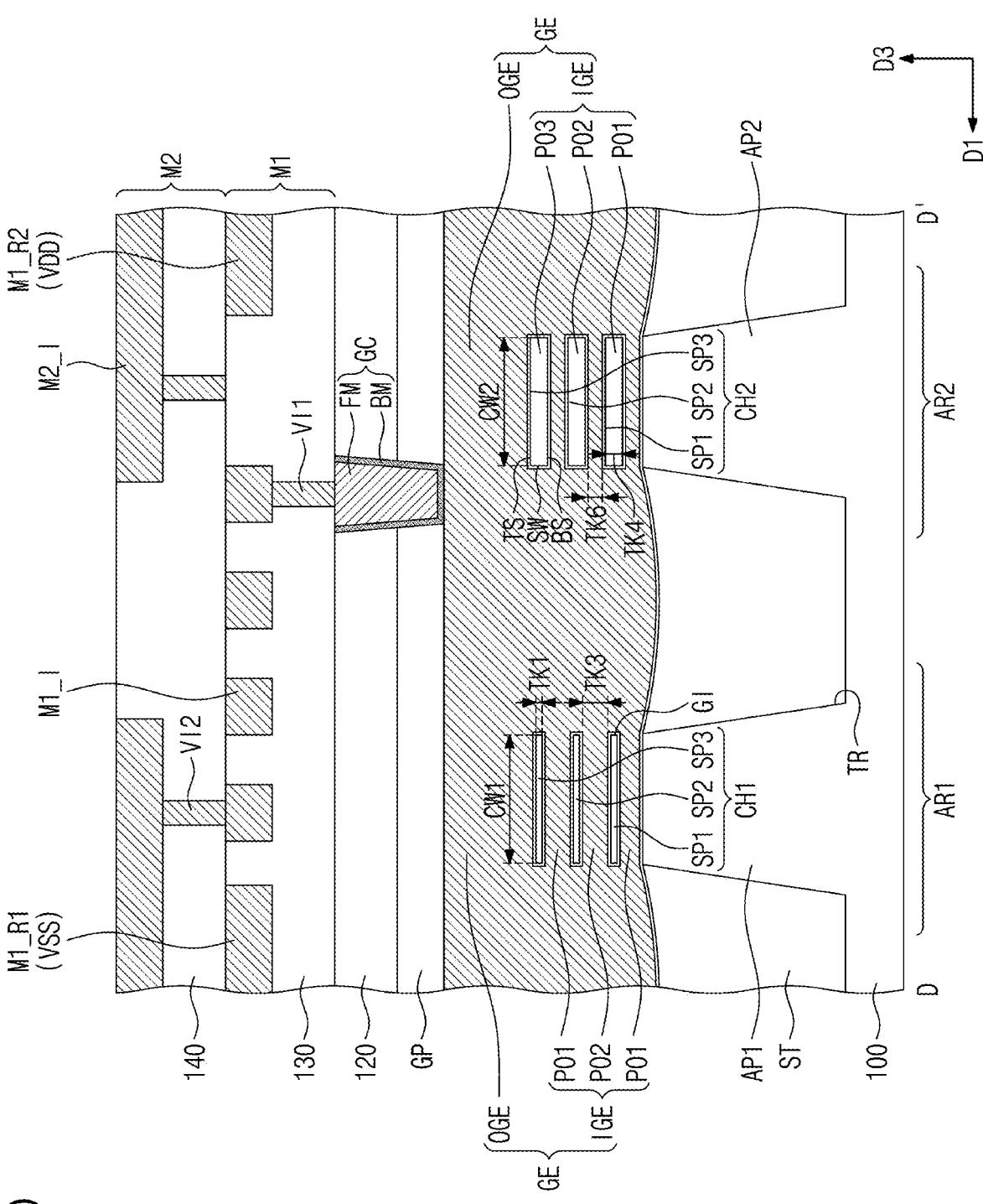
Figure 6A:
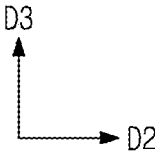
FIG. 6A illustrates an enlarged view showing an example of section M depicted in FIG. 5A according to some example embodiments of the present inventive concepts.
Figure 6B:
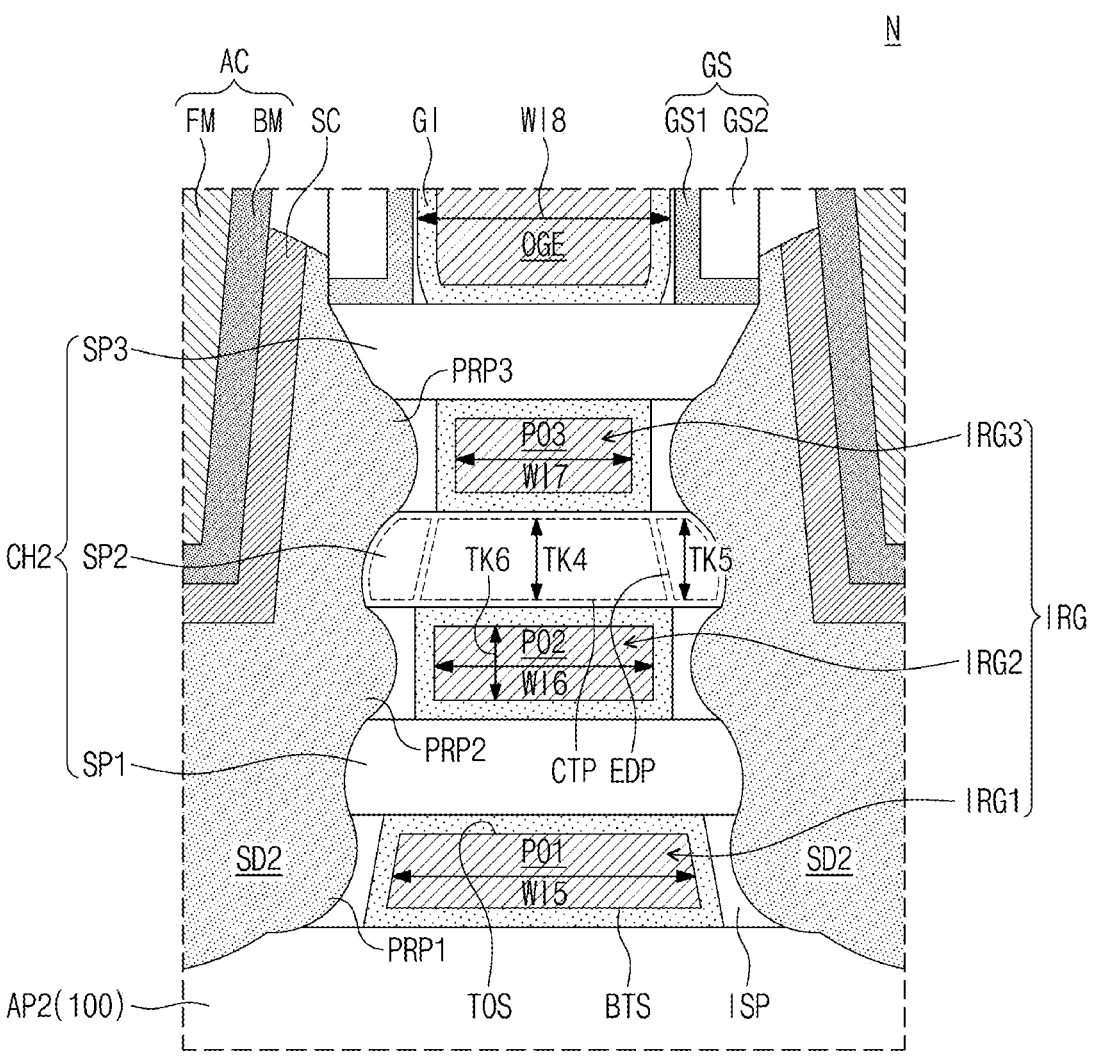
FIG. 6B illustrates an enlarged view showing an example of section N depicted in FIG. 5B according to some example embodiments of the present inventive concepts.
Figure 6B:
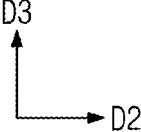

Referring to FIG. 5D, the gate electrode GE may be provided on a top surface TS, a bottom surface BS, and opposite sidewalls SW of each of the first, second, and third semiconductor patterns SP1, SP2, and SP3. For example, a transistor according to some example embodiments may be a three-dimensional field effect transistor (e.g., MBCFET or GAAFET) in which the gate electrode GE three-dimensionally surrounds the first and second channel patterns CH1 and CH2.

Referring back to FIGS. 4 and 5A to 5D, on the first active region AR1, inner spacers ISP may be correspondingly interposed between the first source/drain pattern SD1 and the first, second, and third inner electrodes PO1, PO2, and PO3. Each of the first, second, and third inner electrodes PO1, PO2, and PO3 of the gate electrode GE may be spaced apart from the first source/drain pattern SD1 across the inner spacer ISP. The inner spacer ISP may reduce or prevent leakage current from the gate electrode GE.

On the second active region AR2, inner spacers ISP may also be correspondingly interposed between the second source/drain pattern SD2 and the first, second, and third inner electrodes PO1, PO2, and PO3 of the gate electrode GE. In some example embodiments of the present inventive concepts, the inner spacers ISP may be omitted from the second active region AR2.

A pair of gate spacers GS may be correspondingly disposed on opposite sidewalls of the outer gate electrodes OGE. The gate spacers GS may extend in the first direction D1 along the gate electrode GE. The gate spacers GS may have their top surfaces higher than that of the outer gate electrode OGE. The top surfaces of the gate spacers GS may be coplanar with that of a first interlayer dielectric layer 110 which will be discussed below. In some example embodiments, the gate spacers GS may include at least one selected from SiCN, SiCON, and SiN. In some example embodiments, the gate spacers GS may include a multi-layer formed of at least two selected from SiCN, SiCON, and SiN.

In some example embodiments of the present inventive concepts, referring to FIG. 6A, the gate spacer GS may include a first spacer GS1 on a sidewall of the outer gate electrode OGE and a second spacer GS2 on the first spacer GS1. Each of the first and second spacers GS1 and GS2 may include a silicon-containing dielectric material. For example, the first spacer GS1 may include a silicon-containing low-k dielectric material, for example, SiCON. The second spacer GS2 may include a silicon-containing dielectric material with excellent resistance to etching, such SiN. The second spacer GS2 may serve as an etch stop layer when active contacts AC are formed as discussed below. The second spacer GS2 may be used to form the active contacts AC in a self-alignment manner.

Referring again to FIGS. 4 and 5A to 5D, a gate capping pattern GP may be provided on the outer gate electrode OGE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3 (see FIG. 5D). The gate dielectric layer GI may cover a top surface of the device isolation layer ST that underlies the gate electrode GE.

In some example embodiments of the present inventive concepts, the gate dielectric layer GI may include one or more of a silicon oxide layer, a silicon oxynitride layer, or a high-k dielectric layer. For example, the gate dielectric layer GI may have a structure in which a silicon oxide layer and a high-k dielectric layer are stacked. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some example embodiments, a semiconductor device according to the present inventive concepts may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, one or more of hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (HD, zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, one or more of hafnium oxide, zirconium oxide, and aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the present inventive concepts are not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

Referring still to FIGS. 4 and 5A to 5D, the gate electrode Ge may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. For example, the first, second, and third inner electrodes PO1, PO2, and PO3 of the inner electrode IGE may be formed of the first metal pattern or work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta). For example, the outer gate electrode OGE may include a first metal pattern and a second metal pattern on the first metal pattern.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

The single height cell SHC may have a first boundary BD1 and a second boundary BD2 that are opposite to each other in the second direction D2. The first and second boundaries BD1 and BD2 may extend in the first direction D1. The single height cell SHC may have a third boundary BD3 and a fourth boundary BD4 that are opposite to each other in the first direction D1. The third and fourth boundaries BD3 and BD4 may extend in the second direction D2.

The single height cell SHC may be provided on its opposite sides with a pair of separation structures DB that are opposite to each other in the second direction D2. For example, the pair of separation structures DB may be correspondingly provided on first and second boundaries BD1 and BD2 of the single height cell SHC. The separation structure DB may extend in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120 to extend into the first and second active patterns AP1 and AP2. The separation structure DB may penetrate an upper portion of each of the first and second active patterns AP1 and AP2. The separation structure DB may electrically separate an active region of the single height cell SHC from an active region of an adjacent another cell.

Active contacts AC may be provided to penetrate the first and second interlayer dielectric layers 110 and 120 to come into electrical connection with the first and second source/drain patterns SD1 and SD2. A pair of active contacts AC may be correspondingly provided on opposite sides of the gate electrode GE. When viewed in plan, the active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

A metal-semiconductor compound layer SC, such as a silicide layer, may be interposed between the active contact AC and the first source/drain pattern SD1 and between active contact AC and the second source/drain pattern SD2. The active contact AC may be electrically connected through the metal-semiconductor compound layer SC to one of the first and second source/drain patterns SD1 and SD2. For example, the metal-semiconductor compound layer SC may include at least one selected from titanium silicide, tantalum silicide, tungsten silicide, nickel silicide, and cobalt silicide.

Gate contacts GC may be provided to penetrate the second interlayer dielectric layer 120 and the gate capping pattern GP to come into electrical connection with the gate electrodes GE. When viewed in plan, the gate contacts GC may be correspondingly provided to overlap the first active region AR1 and the second active region AR2. For example, the gate contact GC may be provided on the second active pattern AP2 (see FIG. 5B).

In some example embodiments of the present inventive concepts, referring to FIG. 5B, the active contact AC may have an upper portion adjacent to the gate contact GC, and an upper dielectric pattern UIP may fill the upper portion of the active contact AC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to reduce or prevent a short circuit resulting from contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130. For example, the first metal layer M1 may include a first power line M1_R1, a second power line M1_R2, and first wiring lines M1_I. The lines M1_R1, M1_R2, and M1_I of the first metal layer M1 may parallel extend in the second direction D2.

For example, the first and second power lines M1_R1 and M1_R2 may be respectively provided on the third and fourth boundaries BD3 and BD4 of the single height cell SHC. The first power line M1_R1 may extend in the second direction D2 along the third boundary BD3. The second power line M1_R2 may extend in the second direction D2 along the fourth boundary BD4.

The first wiring lines M1_I of the first metal layer M1 may be disposed between the first and second power lines M1_R1 and M1_R2. The first wiring lines M1_I of the first metal layer M1 may be arranged at a second pitch along the first direction D1. The second pitch may be less than the first pitch. Each of the first wiring lines M1_I may have a line-width less than that of each of the first and second power lines M1_R1 and M1_R2.

The first metal layer M1 may further include first vias VIE The first vias VI1 may be correspondingly provided below the lines M1_R1, M1_R2, and M1_I of the first metal layer M1. The first via VI1 may electrically connect the active contact AC to one of the lines M1_R1, M1_R2, and M1_I of the first metal layer M1. The first via VI1 may electrically connect the gate contact GC to one of the lines M1_R1, M1_R2, and M1_I of the first metal layer M1. As shown, at least some first wiring lines M1_I may be electrically connected (e.g., via separate, respective first vias VI1) to separate, respective contacts of an active contact AC or a gate contact GC.

A certain line and its underlying first via VI1 of the first metal layer M1 may be formed by individual processes. For example, the certain line and its underlying first via VI1 of the first metal layer M1 may each be formed by a single damascene process. A sub-20 nm process may be employed to fabricate a semiconductor device according to some example embodiments.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may parallel extend in the first direction D1.

The second metal layer M2 may further include second vias VI2 that are correspondingly provided below the second wiring lines M23. A certain line of the first metal layer M1 may be electrically through the second via VI2 to a corresponding line of the second metal layer M2. For example, a wiring line and its underlying second via VI2 of the second metal layer M2 may be simultaneously formed by a dual damascene process.

The first and second metal layers M1 and M2 may have their wiring lines that include the same or different conductive materials. For example, the wiring lines of the first and second metal layers M1 and M2 may include at least one metallic material selected from aluminum, copper, tungsten, molybdenum, ruthenium, and cobalt. Although not shown, other metal layers (e.g., M3, M4, M5, etc.) may be additionally stacked on the fourth interlayer dielectric layer 140. Each of the stacked metal layers may include wiring lines for routing between cells.

With reference to FIG. 6A, the following will describe in detail the gate electrode GE and the first channel pattern CH1 on the first active pattern AP1.

Each of the first, second, and third semiconductor patterns SP1, SP2, and SP3 of the first channel pattern CH1 may include channel recesses formed on lower and upper portions thereof. For example, the first semiconductor pattern SP1 may include (e.g., may include one or more surfaces that define) a first channel recess RS1 on the lower portion thereof and a second channel recess RS2 on the upper portion thereof. The second semiconductor pattern SP2 may include (e.g., may include one or more surfaces that define) a third channel recess RS3 on the lower portion thereof and a fourth channel recess RS4 on the upper portion thereof. The third semiconductor pattern SP3 may include (e.g., may include one or more surfaces that define) a fifth channel recess RS5 on the lower portion thereof and a sixth channel recess RS6 on the upper portion thereof. In some example embodiments of the present inventive concepts, the first active pattern AP1 may include (e.g., may include one or more surfaces that define) a body recess BRS on the upper portion thereof. In some example embodiments, the above-noted recesses may be understood to be defined, one or more surfaces of the one or more semiconductor patterns described to include such recesses, by one or more surfaces of one or more inner electrodes adjacent to the one or more semiconductor patterns described to include such recesses.

The channel recesses RS1 to RS6 may be caused to give dumbbell shapes to the first, second, and third semiconductor patterns SP1, SP2, and SP3 of the first channel pattern CH1. An element ("structure") described herein to have a "dumbbell shape" may be understood to refer to a structure having concave top and bottom surfaces TOS and BTS. For example, the second semiconductor pattern SP2 of the first channel pattern CH1 may include a central part CTP and side parts EDP on opposite sides of the central part CTP. The central part CTP may be interposed between the second inner electrode PO2 and the third inner electrode PO3. The side part EDP may be interposed between the inner spacer ISP adjacent to the second inner electrode PO2 and the inner spacer ISP adjacent to the third inner electrode PO3.

The central part CTP may have a first thickness TK1, and the side part EDP may have a second thickness TK2 greater than the first thickness TK1. The central part CTP may have a thickness that is minimum (e.g., a minimum value), and thus is a minimum thickness of the second semiconductor pattern SP2 at a center (e.g., horizontal center, in the second direction D2) of the central part CTP and progressively (e.g., gradually, continuously, etc.) increases in a direction (e.g., in the second direction D2 from the center of the center part CTP toward the side part EDP. The minimum thickness at the center of the central part CTP of the second semiconductor pattern SP2 may be referred to as a minimum thickness at the central part CTP of the second semiconductor pattern SP2 and may thus further be a minimum thickness of the second semiconductor pattern SP2 and may be indicated as the first thickness TK1. Thus, the first thickness TK1 may be defined to indicate a minimum thickness of the central part CTP and may be further defined to indicate a minimum thickness at the central part CTP of the second semiconductor pattern SP2. In some example embodiments of the present inventive concepts, a ratio TK1/TK2 of the first thickness TK1 to the second thickness TK2 may range from about 0.2 to about 0.8.

As described herein, a thickness of a structure may refer to a thickness of the structure in the third direction D3. A thickness "at" a central part of a given semiconductor pattern may refer to a thickness in the third direction D3 of the given semiconductor pattern at the central part of the given semiconductor pattern, which may further refer to a thickness in the third direction D3 at a center, in the second direction D2, of the central part of the given semiconductor pattern. As shown in FIG. 6A, the thickness at the central part CTP of a semiconductor pattern (e.g., the first thickness TK1) may be a minimum thickness of the central part CTP and thus a minimum thickness of the semiconductor pattern. As described herein, a thickness "at" a part of a structure may be interchangeably referred to as a thickness "of" the part of the structure.

The first to sixth channel recesses RS1 to RS6 may respectively have first to sixth recess depths DE1 to DE6. According to some example embodiments of the present inventive concepts, the first to sixth recess depths DE1 to DE6 may be the same as each other or different from each other (e.g., same or different in magnitude in the third direction D3). In this description, each of the recess depths DE1 to DE6 may be defined to denote a vertical length (e.g., in the third direction D3) from the side part EDP to a center of the central part CTP. Each of the recess depths DE1 to DE6 may be approximately (TK2−TK1)/2 or half the difference between the first thickness TK1 and the second thickness TK2.

The body recess BRS and the channel recesses RS1 to RS6 may be the same or different in recess depth. For example, the body recess BRS may have a recess depth BDE substantially the same as the first recess depth DE1 of the first channel recess RS1.

The first, second, and third inner electrodes PO1, PO2, and PO3 on the first active pattern AP1 may each have an eye shape. For example, the first inner electrode PO1 may be convex at each of a bottom surface BTS and a top surface TOS thereof. An element ("structure") described herein to have an "eye shape" may be understood to refer to a structure having convex top and bottom surfaces TOS and BTS. The first inner electrode PO1 may be flat at a lateral surface SIS thereof. As described herein, a surface of a structure (e.g., the bottom surface BTS and the top surface TOS of the first inner electrode PO1) may be understood to be "convex" where the surface has a curvature such that a parallel/horizontal direction (e.g., in the second direction D2) central portion (also referred to herein as a horizontally central portion, a central part, or the like) of the surface is a furthest protrusion of the surface and/or structure in a perpendicular/vertical direction (e.g., in the third direction D3).

The first, second, and third inner electrodes PO1, PO2, and PO3 on the first active pattern AP1 may their sizes (or volumes) that progressively decrease in a direction from a lower tier toward an upper tier. In the present inventive concepts, the lower tier may be a level close to that of a top surface 100a of the substrate 100. The upper tier may be a level far from that of the top surface 100a of the substrate 100. Elements described herein to be at a "same tier" may be at a same level in the third direction D3 with respect to a reference location (e.g., the top surface of the substrate 100) and/or may at least partially overlap in a horizontal direction (e.g., the second direction D2). For example, the first inner electrodes PO1 on the respective first and second active patterns AP1 and AP2, at least partially overlapping in the second direction D2, may be understood to be at a same tier.

A maximum width W12 of the second inner electrode PO2 may be less than a maximum width WI1 of the first inner electrode PO1. A maximum width W13 of the third inner electrode PO3 may be less than the maximum width W12 of the second inner electrode PO2. The maximum width W13 of the third inner electrode PO3 may be greater than a maximum width W14 of the outer gate electrode OGE. As described herein, a width of a structure may refer to a width of the structure in a horizontal direction (e.g., the second direction D2 and/or the first direction D1).

Each of the first, second, and third inner electrodes PO1, PO2, and PO3 may have a maximum thickness TK3 in the third direction D3. The first, second, and third inner electrodes PO1, PO2, and PO3 may have their maximum thicknesses TK3 that are the same as each other or different from each other.

The first source/drain pattern SD1 may include first, second, and third protrusion parts PRP1, PRP2, and PRP3 that respectively protrude toward the first, second, and third inner electrodes PO1, PO2, and PO3 of the gate electrode GE. The first, second, and third protrusion parts PRP1, PRP2, and PRP3 may have their protrusion lengths that progressively decrease in a direction from a lower tier toward an upper tier. For example, a second protrusion length PRL2 of the second protrusion part PRP2 may be less than a first protrusion length PRL1 of the first protrusion part PRP1. A third protrusion length PRL3 of the third protrusion part PRP3 may be less than the second protrusion length PRL2 of the second protrusion part PRP2.

Each of the first, second, and third semiconductor patterns SP1, SP2, and SP3 according to some example embodiments of the present inventive concepts may each include channel recesses on the upper and lower portions thereof, which may result in an increase in effective channel length (ECL). Therefore, the present inventive concepts may reduce or prevent leakage current and short channel effect, such as drain induced barrier lowering (DIBL). In the present inventive concepts, a hot carrier effect may be reduced or prevented to increase reliability of devices.

As the body recess BRS according to the present inventive concepts is formed on the upper portion of the first active pattern AP1, a three-dimensional structure may be given to a channel formed on the upper portion of the first active pattern APE For example, it may be possible to increase the effective channel length (ECL) on the upper portion of the first active pattern AP1 and to reduce the short channel effect. In addition, it may also be possible to reduce or prevent the leakage current that occurs in the upper portion of the first active pattern APE With reference to FIG. 6B, the following will describe in detail the gate electrode GE and the second channel pattern CH2 on the second active pattern AP2.

Unlike the first channel pattern CH1, each of the first, second, and third semiconductor patterns SP1, SP2, and SP3 of the second channel pattern CH2 may include no channel recess. Unlike the first active pattern AP1, the second active pattern AP2 may include no body recess on the upper portion thereof.

As the second channel pattern CH2 includes no channel recess, the first, second, and third semiconductor patterns SP1, SP2, and SP3 of the second channel pattern CH2 may each have a rod shape. For example, the second semiconductor pattern SP2 of the second channel pattern CH2 may include a central part CTP and side parts EDP on opposite sides of the central part CTP. The central part CTP may be interposed between the second inner electrode PO2 and the third inner electrode PO3. The side part EDP may be interposed between the inner spacer ISP adjacent to the second inner electrode PO2 and the inner spacer ISP adjacent to the third inner electrode PO3. The central part CTP may have a fourth thickness TK4, and the side part EDP may have a fifth thickness TK5 substantially the same as the fourth thickness TK4. In some example embodiments of the present inventive concepts, a ratio TK4/TK5 of the fourth thickness TK4 to the fifth thickness TK5 may range from about 0.8 to about 1.0.

In some example embodiments, a thickness at the side part EDP of the second semiconductor pattern SP2 of the first channel pattern CH1 (e.g., the second thickness TK2) may be the same or substantially the same thickness as a thickness at the side part EDP of the second semiconductor pattern SP2 of the second channel pattern CH2 (e.g., the fifth thickness TK5). Restated, in some example embodiments the second thickness TK2 may be the same or substantially the same (e.g., the same or substantially the same in magnitude) as the fifth thickness TK5.

In some example embodiments, a thickness at the central part CTP of the second semiconductor pattern SP2 of the first channel pattern CH1 (e.g., the first thickness TK1), which may be a minimum thickness of said central part CTP, may be less (e.g., smaller than) a thickness at (e.g., minimum thickness of) the central part CTP of the second semiconductor pattern SP2 of the second channel pattern CH2 (e.g., the fourth thickness TK4). Restated, in some example embodiments the first thickness TK1 may be smaller than (e.g., smaller in magnitude than) the fourth thickness TK4. As shown in FIGS. 6A and 6B, the minimum thickness of the central part CPT of the second semiconductor pattern SP2 of the first channel pattern CH1 may be different from (e.g., smaller than) the minimum thickness of the central part CPT of the second semiconductor pattern SP2 of the second channel pattern CH2.

The first, second, and third inner electrodes PO1, PO2, and PO3 on the second active pattern AP2 may each have a rectangular shape. For example, the first inner electrode PO1 on the second active pattern AP2 may be flat (e.g., planar) or convex at each of a bottom surface BTS and a top surface TOS thereof. Referring back to FIG. 6A, the bottom surface BTS and the top surface TOS of the first inner electrode PO1 on the first active pattern AP1 may be more convex respectively than the bottom surface BTS and the top surface TOS of the first inner electrode PO1 on the second active pattern AP2. The first inner electrode PO1 on the second active pattern AP2 may be flat on a lateral surface SIS thereof. In some example embodiments, the first inner electrode PO1 may be inclined at the lateral surface SIS thereof.

As described herein, a first surface may be more convex than a second surface where the first surface has a greater convex curvature (e.g., greater maximum convex curvature, for example at a horizontally central portion that is also referred to herein interchangeably as a central part, at a greatest vertically protruding portion, etc.) than a convex curvature (e.g., maximum convex curvature, for example at a horizontally central portion that is also referred to herein interchangeably as a central part, at a greatest vertically protruding portion, etc.) of the second surface. Similarly, a first surface may be less convex than a second surface where the first surface has a smaller convex curvature (e.g., smaller maximum convex curvature, for example at a horizontally central portion that is also referred to herein interchangeably as a central part, at a greatest vertically protruding portion, etc.) than a convex curvature (e.g., maximum convex curvature, for example at a horizontally central portion that is also referred to herein interchangeably as a central part, at a greatest vertically protruding portion, etc.) of the second surface.

It may be understood that a magnitude of a curvature of a surface may inversely correspond to the radius of curvature of the surface. For example, a first surface may be more convex than a second surface based on the first surface having a radius of curvature (e.g., a smallest radius of curvature corresponding to the maximum convex curvature of the first surface) that is smaller than a radius of curvature (e.g., a smallest radius of curvature corresponding to the maximum convex curvature) of the second surface.

Referring back to FIGS. 6A and 6B, the top surface TOS of the first inner electrode PO1 on the first active pattern AP1 may be more convex than the top surface TOS of the first inner electrode PO1 on the second active pattern AP2 based on the top surface TOS of the first inner electrode PO1 on the first active pattern AP1 having a greater curvature, greater maximum curvature, smaller minimum radius of curvature, etc. than the top surface TOS of the first inner electrode PO1 on the second active pattern AP2. Similarly, still referring to FIGS. 6A and 6B, the bottom surface BTS of the first inner electrode PO1 on the first active pattern AP1 may be more convex than the bottom surface BTS of the first inner electrode PO1 on the second active pattern AP2 based on the bottom surface BTS of the first inner electrode PO1 on the first active pattern AP1 having a greater curvature, greater maximum curvature, smaller minimum radius of curvature, etc. than the bottom surface BTS of the first inner electrode PO1 on the second active pattern AP2.

The first, second, and third inner electrodes PO1, PO2, and PO3 on the second active pattern AP2 may have respective sizes (or volumes) that progressively decrease in a direction from a lower tier (e.g., inner electrodes closer to the substrate 100 in the third direction D3) toward an upper tier (e.g., inner electrodes further from the substrate 100 in the third direction D3). A maximum width WI6 of the second inner electrode PO2 may be less (e.g., smaller) than a maximum width WI5 of the first inner electrode PO1. A maximum width WI7 of the third inner electrode PO3 may be less than the maximum width WI6 of the second inner electrode PO2. The maximum width WI7 of the third inner electrode PO3 may be greater than a maximum width WI8 of the outer gate electrode OGE.

The first, second, and third inner electrodes PO1, PO2, and PO3 on the second active pattern AP2 may have their sizes (or volumes) respectively less than those of the first, second, and third inner electrodes PO1, PO2, and PO3 on the first active pattern APE For example, the maximum width WI6 of the second inner electrode PO2 on the second active pattern AP2 may be less than the maximum width WI2 of the second inner electrode PO2 on the first active pattern AP1. A maximum thickness TK6 of the second inner electrode PO2 on the second active pattern AP2 may be less than the maximum thickness TK3 of the second inner electrode PO2 on the first active pattern AP1.

The second source/drain pattern SD2 may include first, second, and third protrusion parts PRP1, PRP2, and PRP3 that respective protrude toward the first, second, and third inner electrodes PO1, PO2, and PO3 of the gate electrode GE. The first, second, and third protrusion parts PRP1, PRP2, and PRP3 may have their protrusion lengths that are the same as each other or different from each other.

It may be required that an NMOSFET should have a channel thickness less than that of a PMOSFET to give improved or optimum performance to a logic transistor of the single height cell SHC depicted in FIG. 4. The present inventive concepts may selectively adjust the NMOSFET to have a small channel thickness while allowing the PMOSFET to maintain its relatively large channel thickness. Accordingly, it may be possible to improve electrical properties of the NMOSFET without degradation of performance of the PMOSFET, thereby improving performance of a device (e.g., a semiconductor device) including the NMOSFET and PMOSFET.

An NMOSFET is used by way of example as a three-dimensional transistor discussed with reference to FIG. 6A and a PMOSFET is used by way of example as a three-dimensional transistor discussed with reference to FIG. 6B, but the present inventive concepts are not limited thereto. In some example embodiments, the description of the three-dimensional transistor of FIG. 6A may be applicable to the PMOSFET. In some example embodiments, the description of the three-dimensional transistor of FIG. 6B may be applicable to the NMOSFET.

FIGS. 7A, 7B, 8A, 8B, 9A, 9B, 9C, 10A, 10B, 10C, 11A, 11B, 11C, 12A, 12B, and 12C illustrate cross-sectional views showing a method of fabricating a semiconductor device according to some example embodiments of the present inventive concepts. In detail, FIGS. 7A, 8A, 9A, 10A, 11A, and 12A are cross-sectional views taken along line A-A' of FIG. 4. FIGS. 9B, 10B, 11B, and 12B are cross-sectional views taken along line B-B' of FIG. 4. FIGS. 9C and 10C illustrate cross-sectional views taken along line C-C' of FIG. 4. FIGS. 7B, 8B, 11C, and 12C are cross-sectional views taken along line D-D' of FIG. 4.

Figure 7A:
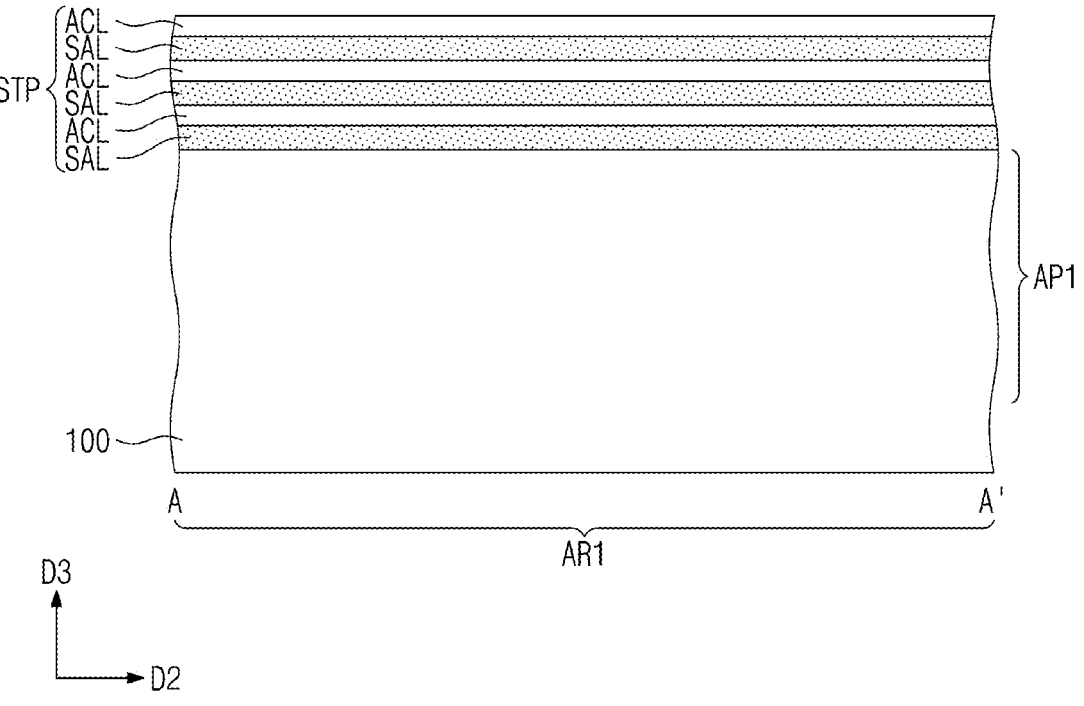
FIGS. 7A, 7B, 8A, 8B, 9A, 9B, 9C, 10A, 10B, 10C, 11A, 11B, 11C, 12A, 12B, and 12C illustrate cross-sectional views showing a method of fabricating a semiconductor device according to some example embodiments of the present inventive concepts.
Figure 7B:
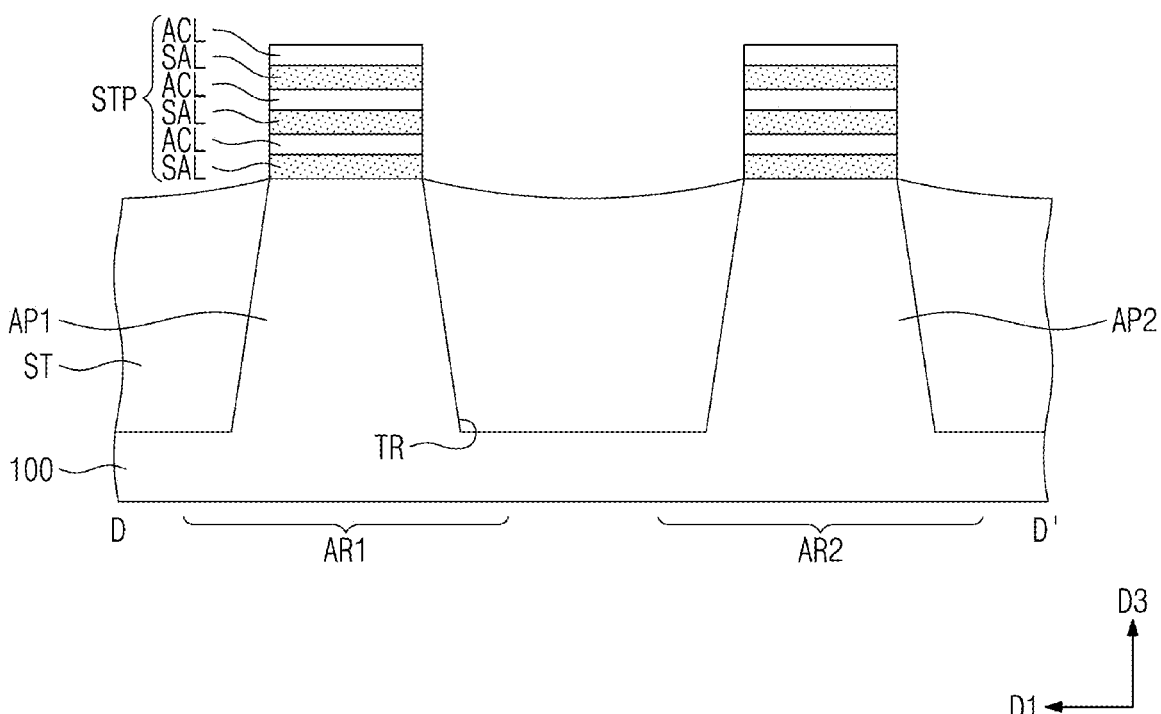

Referring to FIGS. 7A and 7B, a substrate 100 may be provided which includes a first active region AR1 and a second active region AR2. Active layers ACL and sacrificial layers SAL may be alternately stacked on the substrate 100. The active layers ACL may include one of silicon (Si), germanium (Ge), and silicon-germanium (SiGe), and the sacrificial layers SAL may include another of silicon (Si), germanium (Ge), and silicon-germanium (SiGe).

The sacrificial layer SAL may include a material having an etch selectivity with respect to the active layer ACL. For example, the sacrificial layers SAL may include silicon-germanium (SiGe), and the active layers ACL may include silicon (Si). Each of the sacrificial layers SAL may have a germanium concentration of about 10 at % to about 30 at %.

Mask patterns may be formed on each of the first and second active regions AR1 and AR2 of the substrate 100. The mask pattern may have a linear or bar shape that extends in a second direction D2.

A patterning process may be performed in which the mask patterns are used as an etching mask to form a trench TR that defines a first active pattern AP1 and a second active pattern AP2. The first active patterns AP1 may be formed on the first active region AR1. The second active pattern AP2 may be formed on the second active region AR2.

A stack pattern STP may be formed on each of the first and second active patterns AP1 and AP2. The stack pattern STP may include the active layers ACL and the sacrificial layers SAL that are alternately stacked. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the stack patterns STP and the first and second active patterns AP1 and AP2. The dielectric layer may be recessed until the stack patterns STP are exposed, and thus the device isolation layer ST may be formed.

The device isolation layer ST may include a dielectric material, such as a silicon oxide layer. The stack patterns STP may be exposed from the device isolation layer ST. For example, the stack patterns STP may vertically protrude upwards from the device isolation layer ST.

Figure 8A:
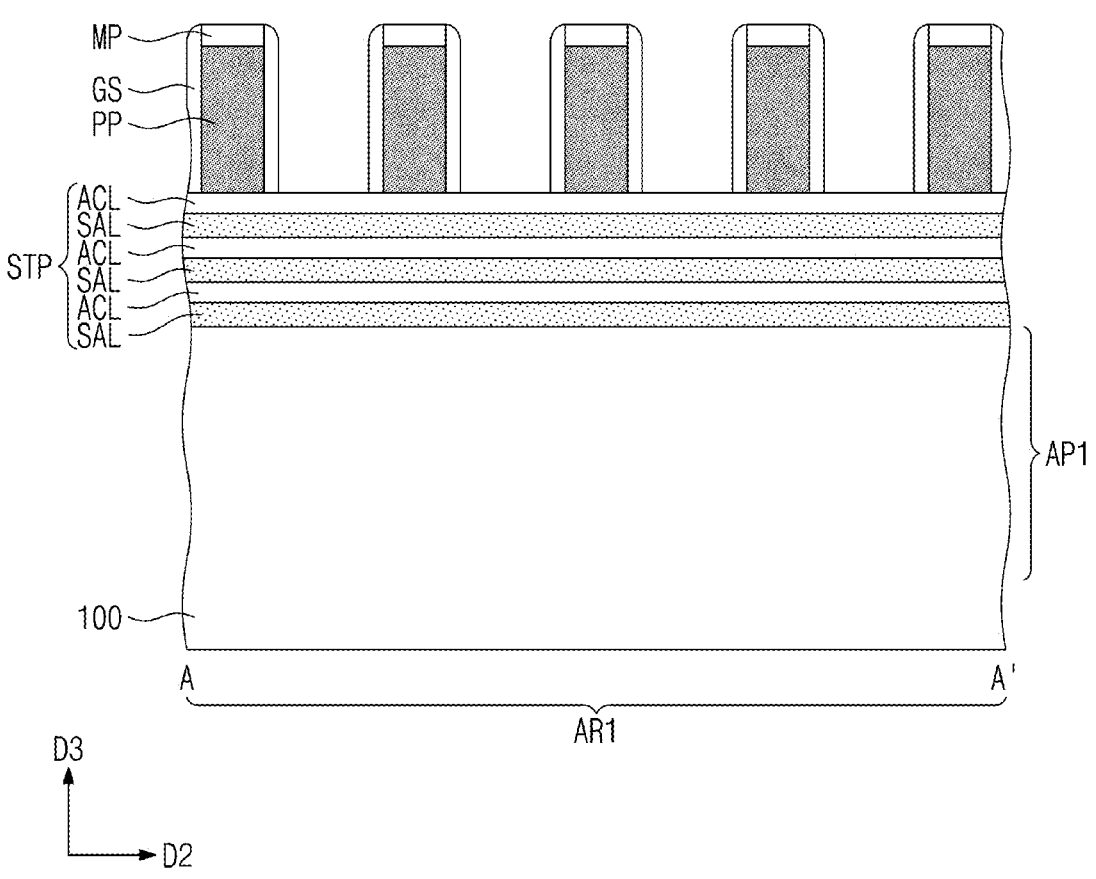
Figure 8B:
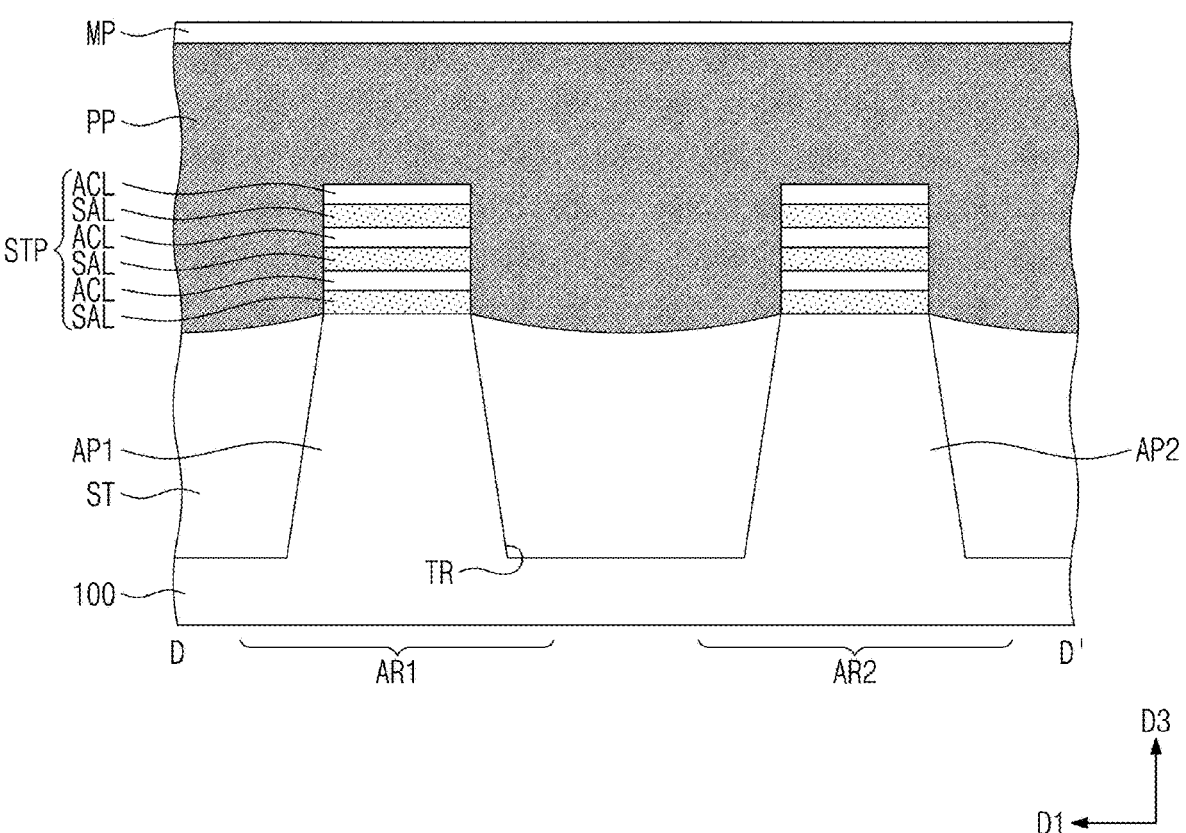

Referring to FIGS. 8A and 8B, sacrificial patterns PP may be formed on the substrate 100, running across the stack patterns STP. Each of the sacrificial patterns PP may be formed to have a linear or bar shape that extends in a first direction DE The sacrificial patterns PP may be arranged at a first pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. In some example embodiments of the present inventive concepts, the gate spacer GS may be a multiple layer including at least two layers.

Figure 9A:
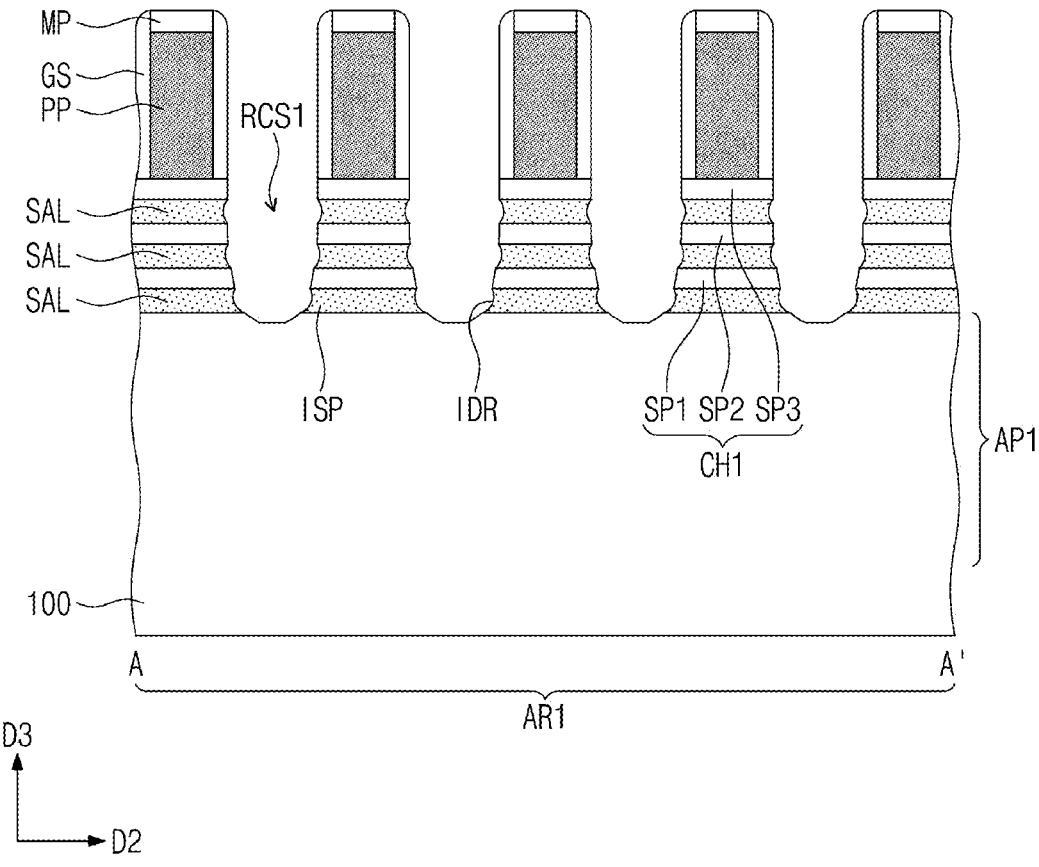
Figure 9B:
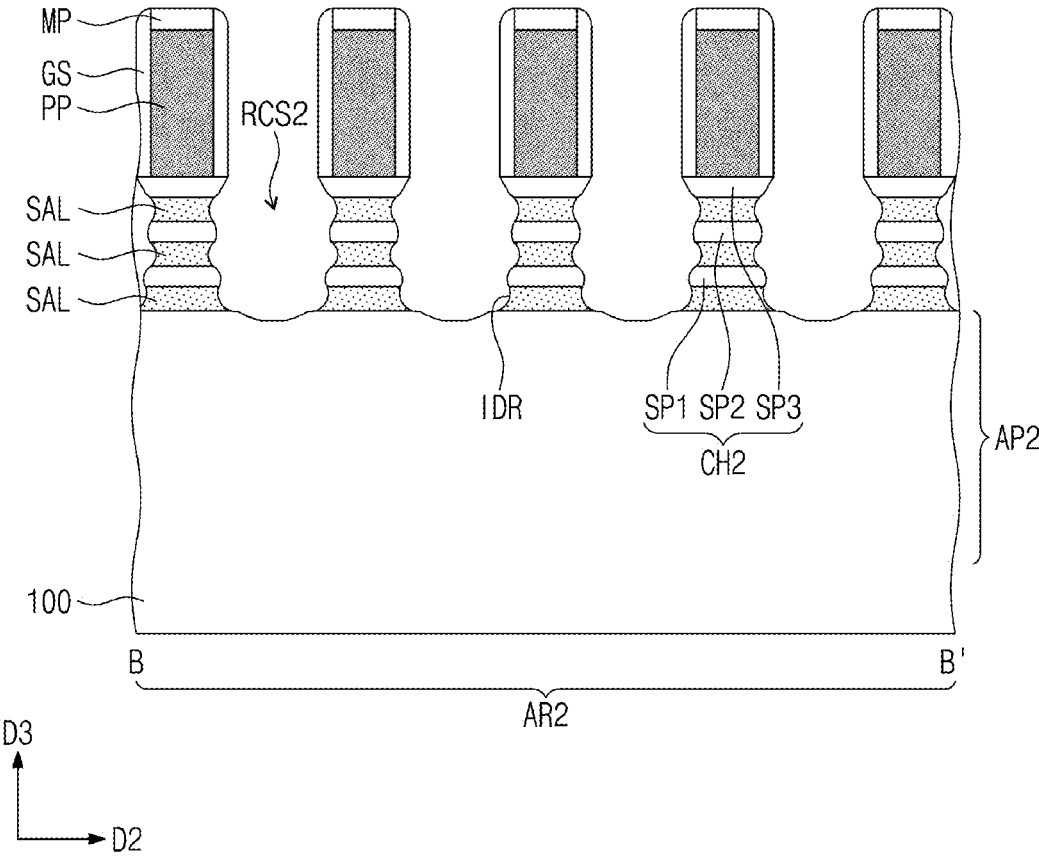
Figure 9C:
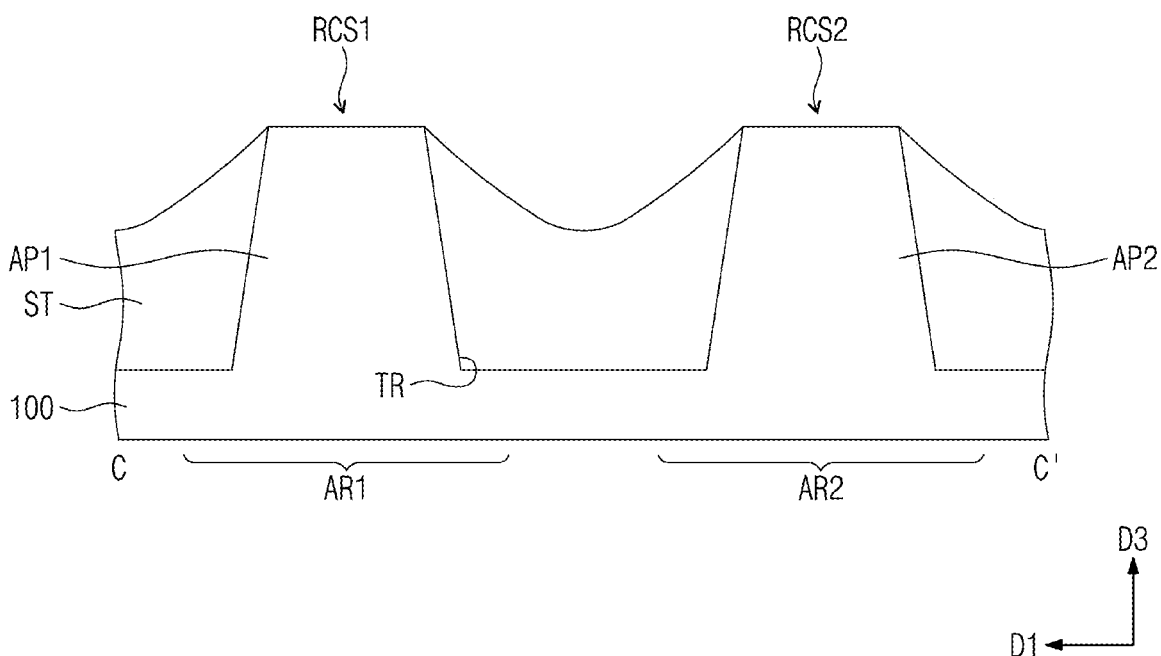

Referring to FIGS. 9A to 9C, first recesses RCS1 may be formed in the stack pattern STP on the first active pattern APE Second recesses RCS2 may be formed in the stack pattern STP on the second active pattern AP2. During the formation of the first and second recesses RCS1 and RCS2, the device isolation layer ST may be further recessed on opposite sides of each of the first and second active patterns AP1 and AP2 (see FIG. 9C).

For example, the hardmask patterns MP and the gate spacers GS may be used as an etching mask to etch the stack pattern STP on the first active pattern AP1, and thus the first recesses RCS1 may be formed. The first recess RCS1 may be formed between a pair of sacrificial patterns PP. A width in the second direction D2 of the first recess RCS1 may decrease with decreasing distance from the substrate 100.

The active layers ACL may be formed into first to fourth semiconductor patterns SP1, SP2, and SP3 that are sequentially stacked between neighboring first recesses RCS1. A first channel pattern CH1 may be constituted by the first, second, and third semiconductor patterns SP1, SP2, and SP3 between neighboring first recesses RCS1.

The first recess RCS1 may expose the sacrificial layers SAL. A selective etching process may be performed on the exposed sacrificial layers SAL. The etching process may include a wet etching process that selectively etches silicongermanium. In the etching process, each of the sacrificial layers SAL may be indented to form an indent region IDR. The indent region IDR may allow the sacrificial layer SAL to have a concave sidewall.

Referring still to FIGS. 9A to 9C, the second recesses RCS2 in the stack pattern STP on the second active pattern AP2 may be formed by a method similar to that used for forming the first recesses RCS1. A selective etching process may be performed on the sacrificial layers SAL exposed by the second recess RCS2, thereby forming indent regions IDR in the second recess RCS2. The indent regions IDR may cause the second recess RCS2 to have an inner sidewall shaped like a wave. A second channel pattern CH2 may be constituted by the first, second, and third semiconductor patterns SP1, SP2, and SP3 between neighboring second recesses RCS2.

Figure 10A:
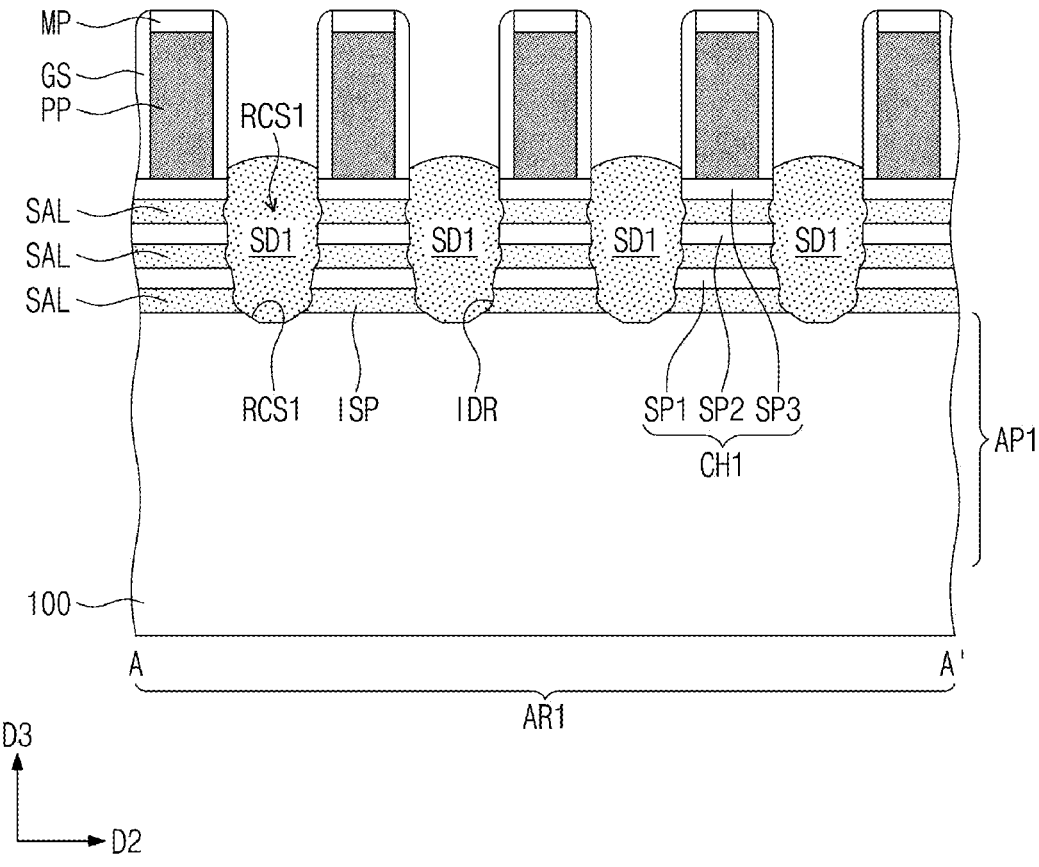
Figure 10B:
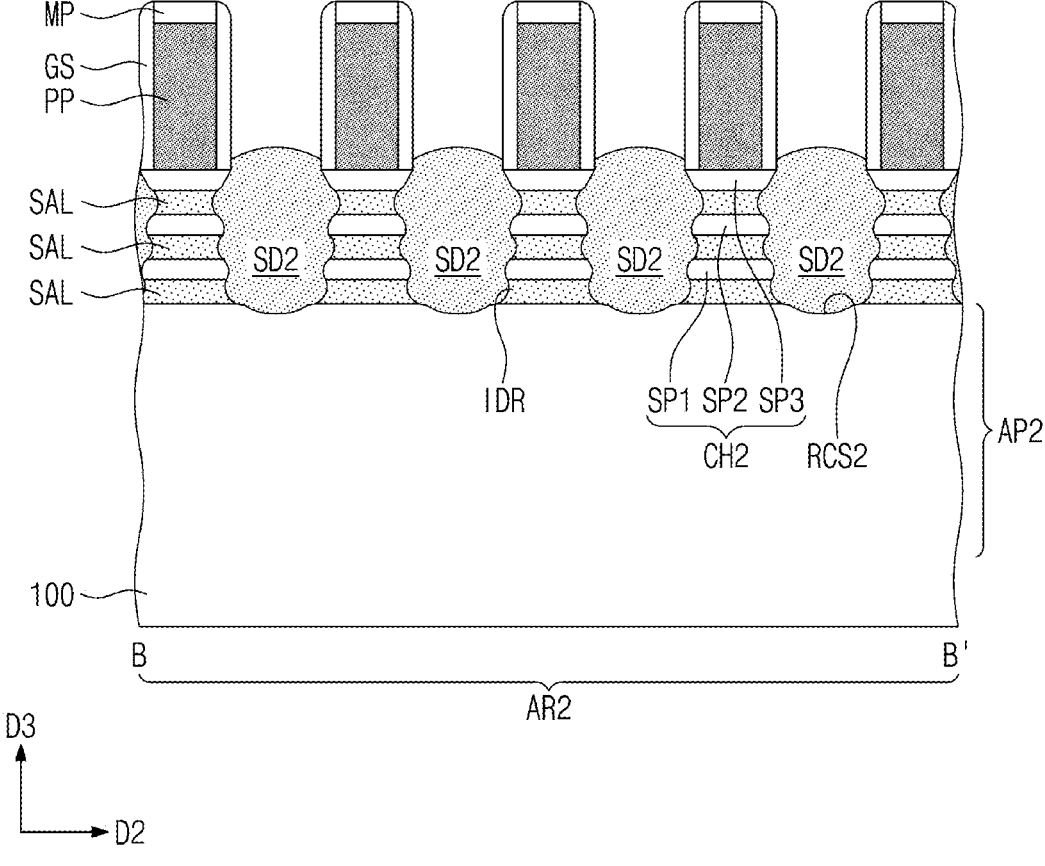
Figure 10C:
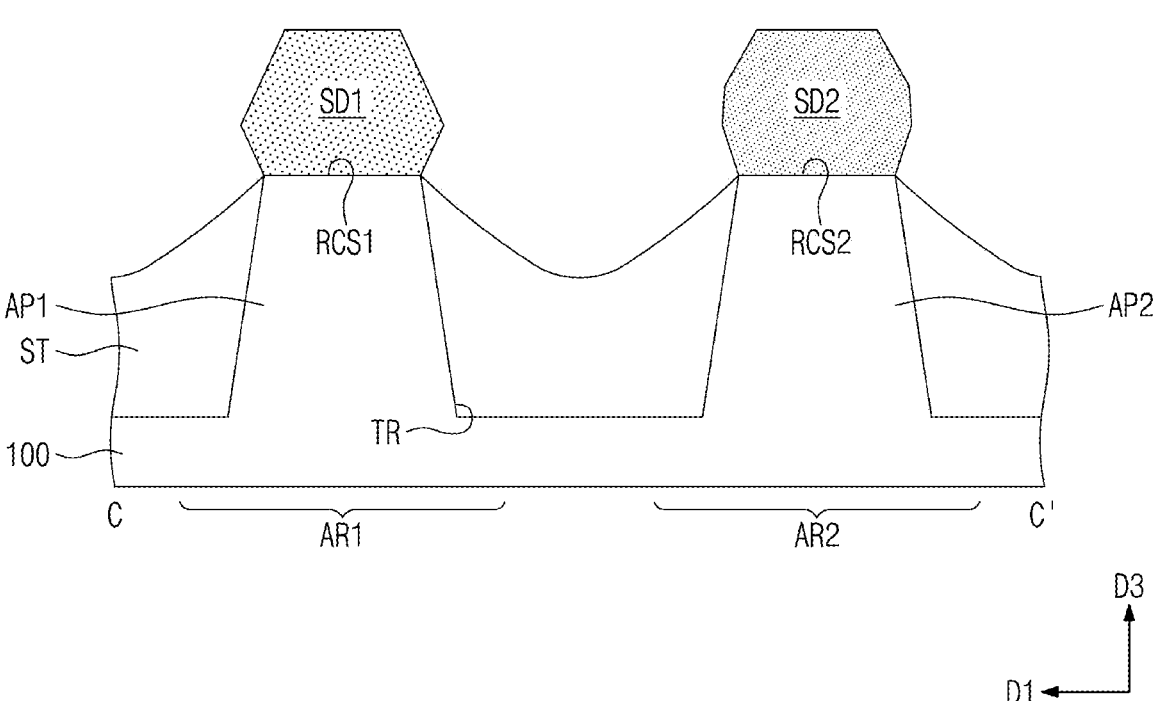

Referring to FIGS. 10A to 10C, first source/drain patterns SD1 may be correspondingly formed in the first recesses RCS1. For example, a first selective epitaxial growth (SEG) process may be performed such that an inner sidewall of the first recess RCS1 is used as a seed layer to form an epitaxial layer that fills the first recess RCS1. The epitaxial layer may be grown from the first, second, and third semiconductor patterns SP1, SP2, and SP3, the sacrificial layer SAL, and the first active pattern AP1 (or an upper portion of the substrate 100), which are exposed by the first recess RCS1, as a seed. For example, the first SEG process may include chemical vapor deposition (CVD) or molecular beam epitaxy (MBE).

In some example embodiments of the present inventive concepts, the first source/drain pattern SD1 may include the same semiconductor element (e.g., Si) as that of the substrate 100. While the first source/drain pattern SD1 is formed, impurities (e.g., phosphorus, arsenic, or antimony) may be in-situ implanted to allow the first source/drain pattern SD1 to have an n-type. In some example embodiments, after the first source/drain pattern SD1 is formed, impurities may be implanted into the first source/drain pattern SD1.

Second source/drain patterns SD2 may be correspondingly formed in the second recesses RCS2. For example, a second SEG process may be performed such that an inner sidewall of the second recess RCS2 is used as a seed layer to form the second source/drain pattern SD2. The second source/drain pattern SD2 may be grown from a seed, or the first, second, and third semiconductor patterns SP1, SP2, and SP3, the sacrificial layers SAL, and the second active pattern AP2 (or an upper portion of the substrate 100) that are exposed by the second recess RCS2.

In some example embodiments of the present inventive concepts, the second source/drain patterns SD2 may include a semiconductor element (e.g., SiGe) whose lattice constant is greater than that of a semiconductor element of the substrate 100. While the second source/drain pattern SD2 is formed, impurities (e.g., boron, gallium, or indium) may be in-situ implanted to allow the second source/drain pattern SD2 to have a p-type. In some example embodiments, after the second source/drain pattern SD2 is formed, impurities may be implanted into the second source/drain pattern SD2.

Figure 11A:
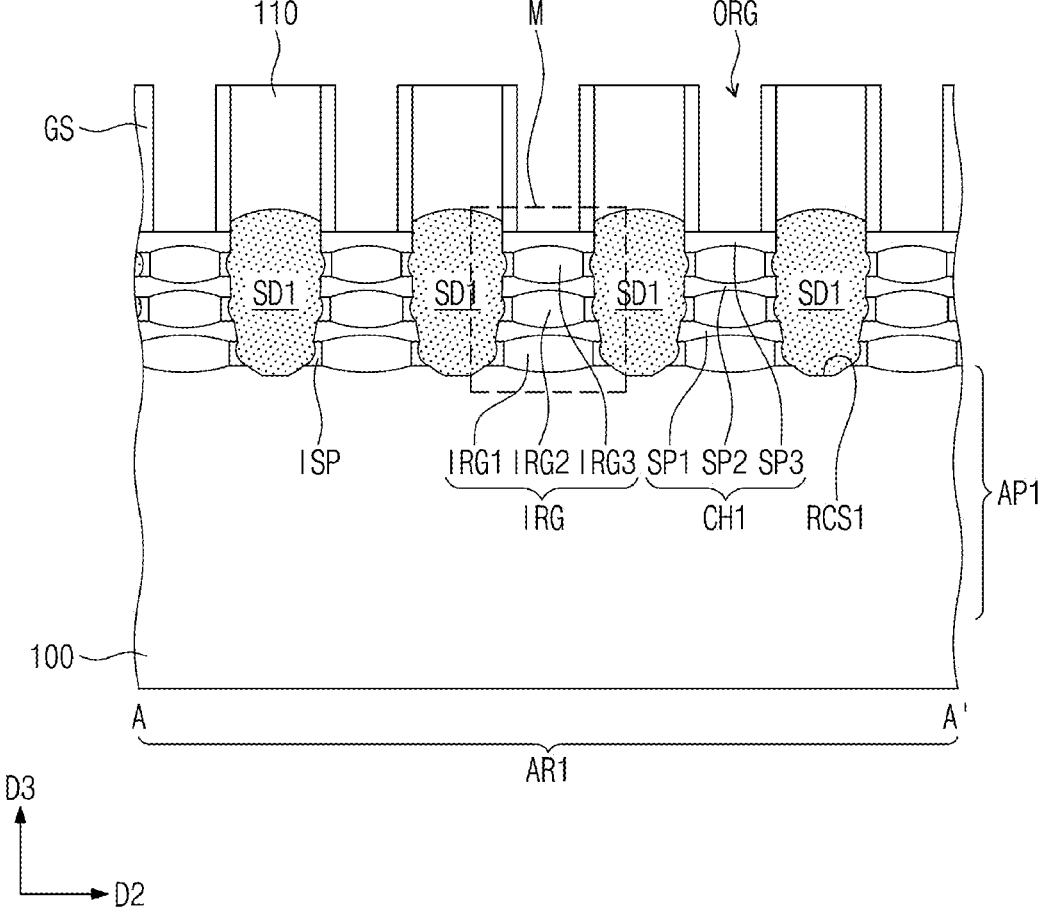
Figure 11B:
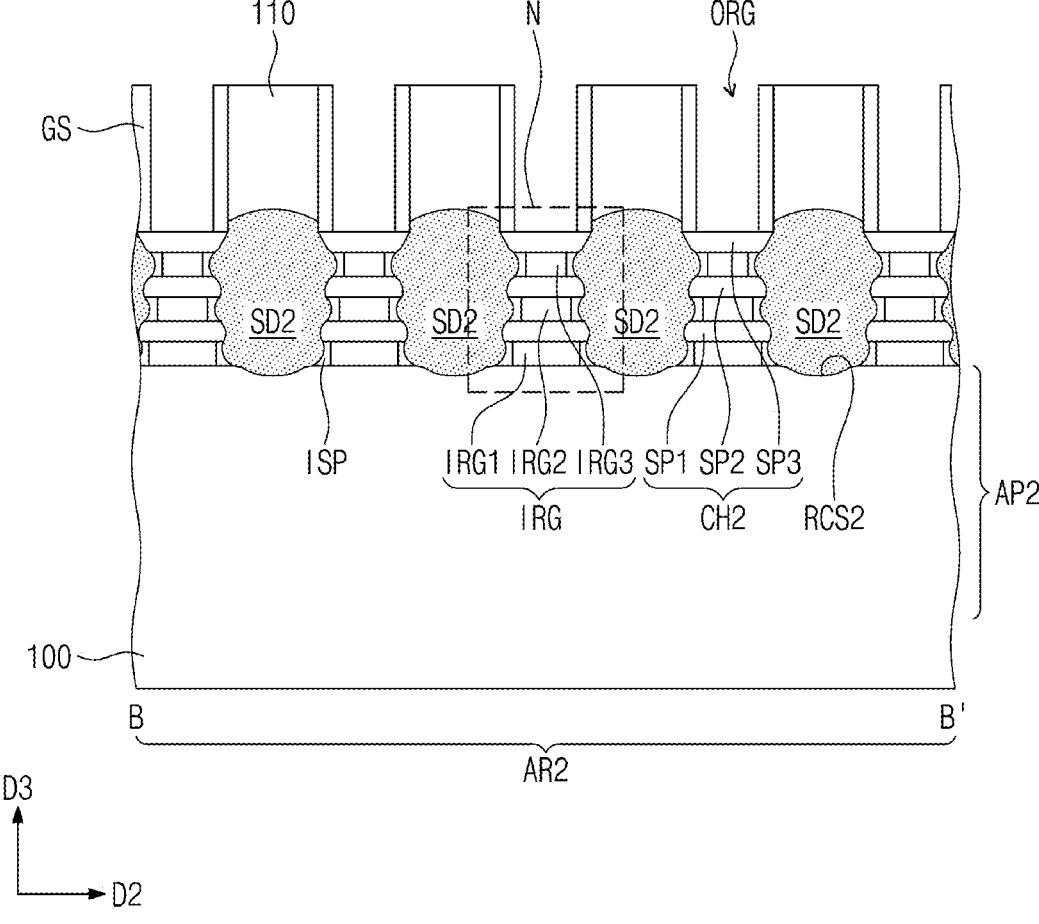
Figure 11C:
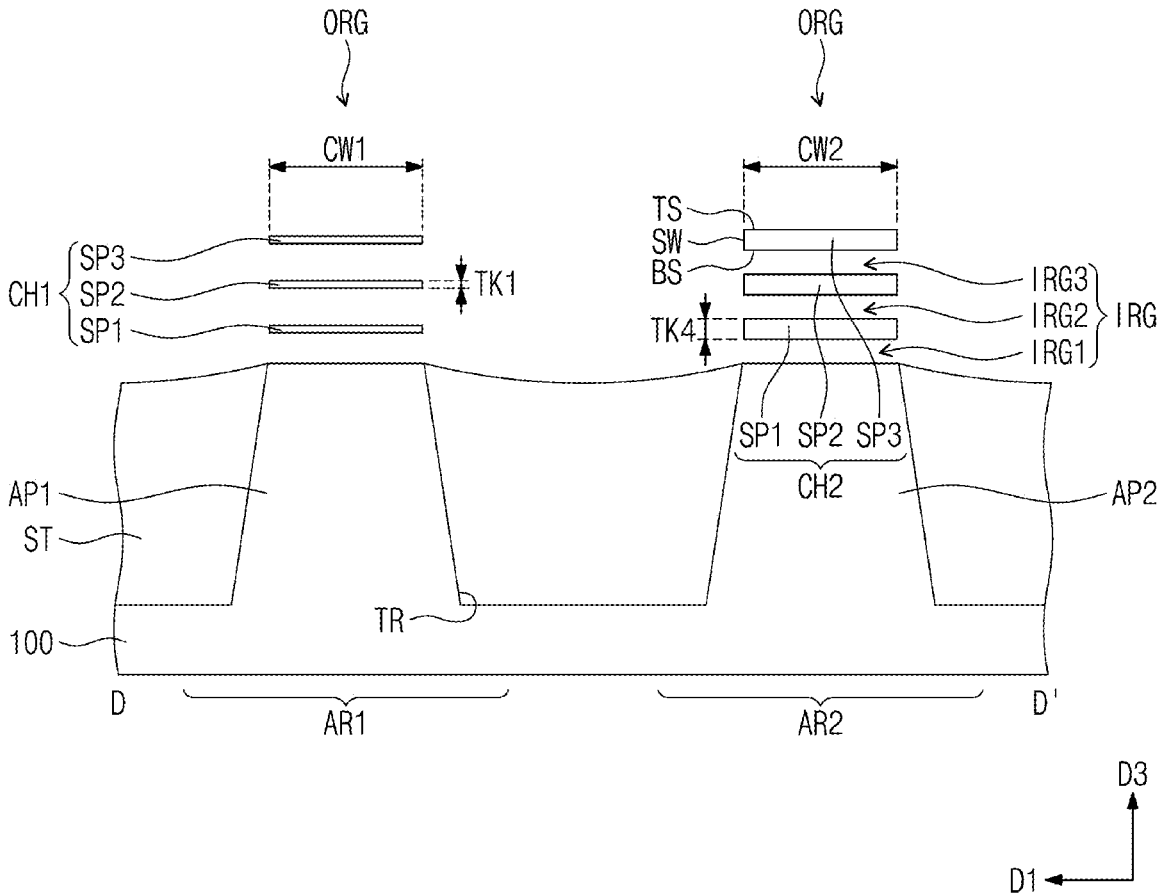

Referring to FIGS. 11A to 11C, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

The exposed sacrificial patterns PP may be selectively removed. The removal of the sacrificial patterns PP may form an outer region ORG that exposes the first and second channel patterns CH1 and CH2 (see FIG. 11C). The removal of the sacrificial patterns PP may include performing a wet etching process that uses an etchant selectively etching polysilicon.

The sacrificial layers SAL exposed through the outer region ORG may be selectively removed to form inner regions IRG (see FIG. 11C). For example, an etching process that selectively etches the sacrificial layers SAL may be performed such that only the sacrificial layers SAL is removed while leaving the first, second, and third semiconductor patterns SP1, SP2, and SP3. The etching process may have a high etch rate with respect to silicon-germanium having a relatively high germanium concentration. For example, the etching process may have a high etch rate with respect to silicon-germanium whose germanium concentration is greater than about 10 at %.

The etching process may remove the sacrificial layers SAL on the first and second active regions AR1 and AR2. The etching process may be a wet etching process. An etching material used for the etching process may promptly etch the sacrificial layer SAL whose germanium concentrate is relatively high.

Referring back to FIG. 11C, as the sacrificial layers SAL are selectively removed, only the first, second, and third semiconductor patterns SP1, SP2, and SP3 may remain on each of the first and second active patterns AP1 and AP2. The removal of the sacrificial layers SAL may form first, second, and third inner regions IRG1, IRG2, and IRG3.

For example, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring back to FIGS. 11A and 11C, there may be further vertical expansion of the first, second, and third inner regions IRG1, IRG2, and IRG3 on the first active pattern AP1 according to some example embodiments of the present inventive concepts. Therefore, an eye shape may be given to each of the first, second, and third inner regions IRG1, IRG2, and IRG3 on the first active pattern AP1 (see FIG. 11A). The expansion of the inner region IRG on the first active pattern AP1 may include recessing the first, second, and third semiconductor patterns SP1, SP2, and SP3 exposed by the inner region IRG. With reference to FIGS. 13A to 16B, the following will describe in detail a method of selectively expanding the inner region IRG on the first active pattern APE FIGS. 13A, 14A, 15A, and 16A illustrate enlarged views showing a method of forming section M depicted in FIG. 11A according to some example embodiments of the present inventive concepts. FIGS. 13B, 14B, 15B, and 16B illustrate enlarged views showing a method of forming section N depicted in FIG. 11B according to some example embodiments of the present inventive concepts.

Figure 13A:
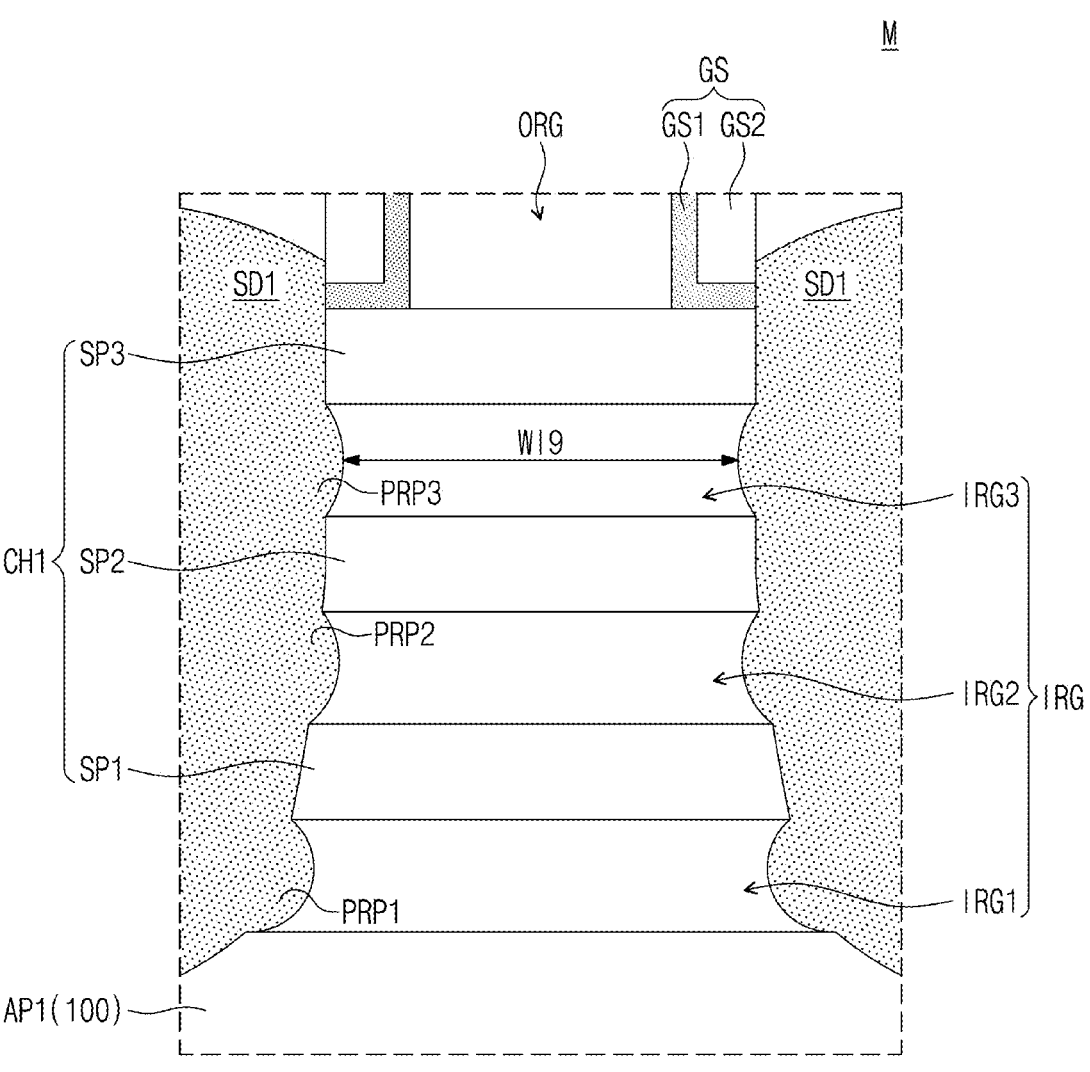
FIGS. 13A, 14A, 15A, and 16A illustrate enlarged views showing a method of forming section M depicted in FIG. 11A according to some example embodiments of the present inventive concepts.
Figure 13A:
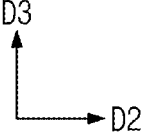
Figure 13B:
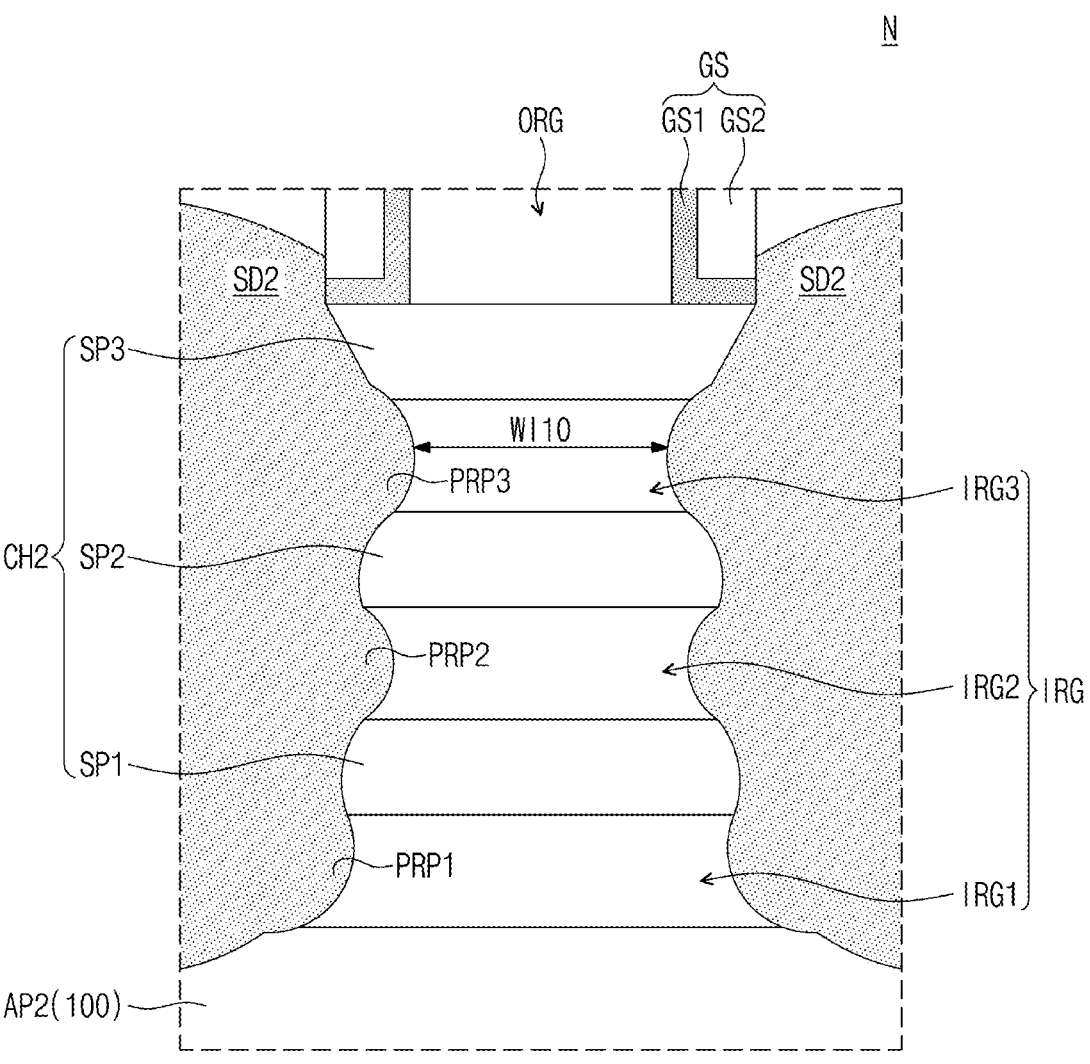
FIGS. 13B, 14B, 15B, and 16B illustrate enlarged views showing a method of forming section N depicted in FIG. 11B according to some example embodiments of the present inventive concepts.
Figure 13B:
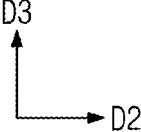

Referring to FIGS. 13A and 13B, the sacrificial pattern PP may be selectively removed to form an outer region ORG. The outer region ORG may expose the sacrificial layers SAL between the first source/drain patterns SD1. The outer region ORG may expose the sacrificial layers SAL between the second source/drain patterns SD2. The sacrificial layers SAL exposed by the outer region ORG may be selectively removed. There may thus be formed first, second, and third inner regions IRG1, IRG2, and IRG3 that are sequentially stacked. Each of the first, second, and third inner regions IRG1, IRG2, and IGR3 may be an empty space. The first, second, and third inner regions IRG1, IRG2, and IRG3 may expose the first, second, and third semiconductor patterns SP1, SP2, and SP3.

The inner region on the first active pattern AP1 may have a width in the second direction D2 greater than a width in the second direction D2 of the inner region IRG on the second active pattern AP2. For example, the third inner region IRG3 on the first active pattern AP1 may have a ninth width WI9, and the third inner region IRG3 on the second active pattern AP2 may have a tenth width WHO less than the ninth width WI9. This may be because that an interval between neighboring second source/drain patterns SD2 is less than an interval between neighboring first source/drain patterns SD1.

Figure 14A:
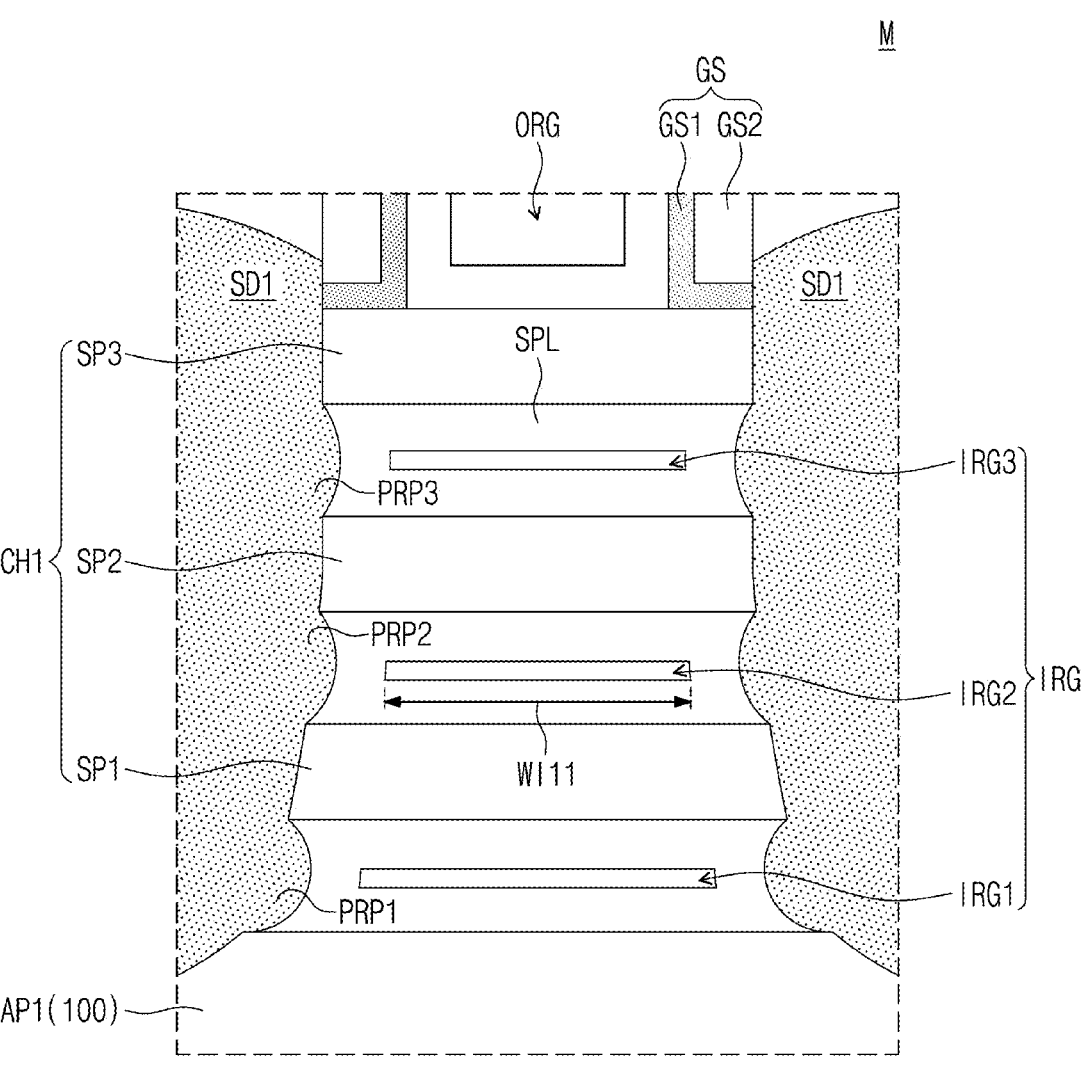
Figure 14A:
Figure 14B:
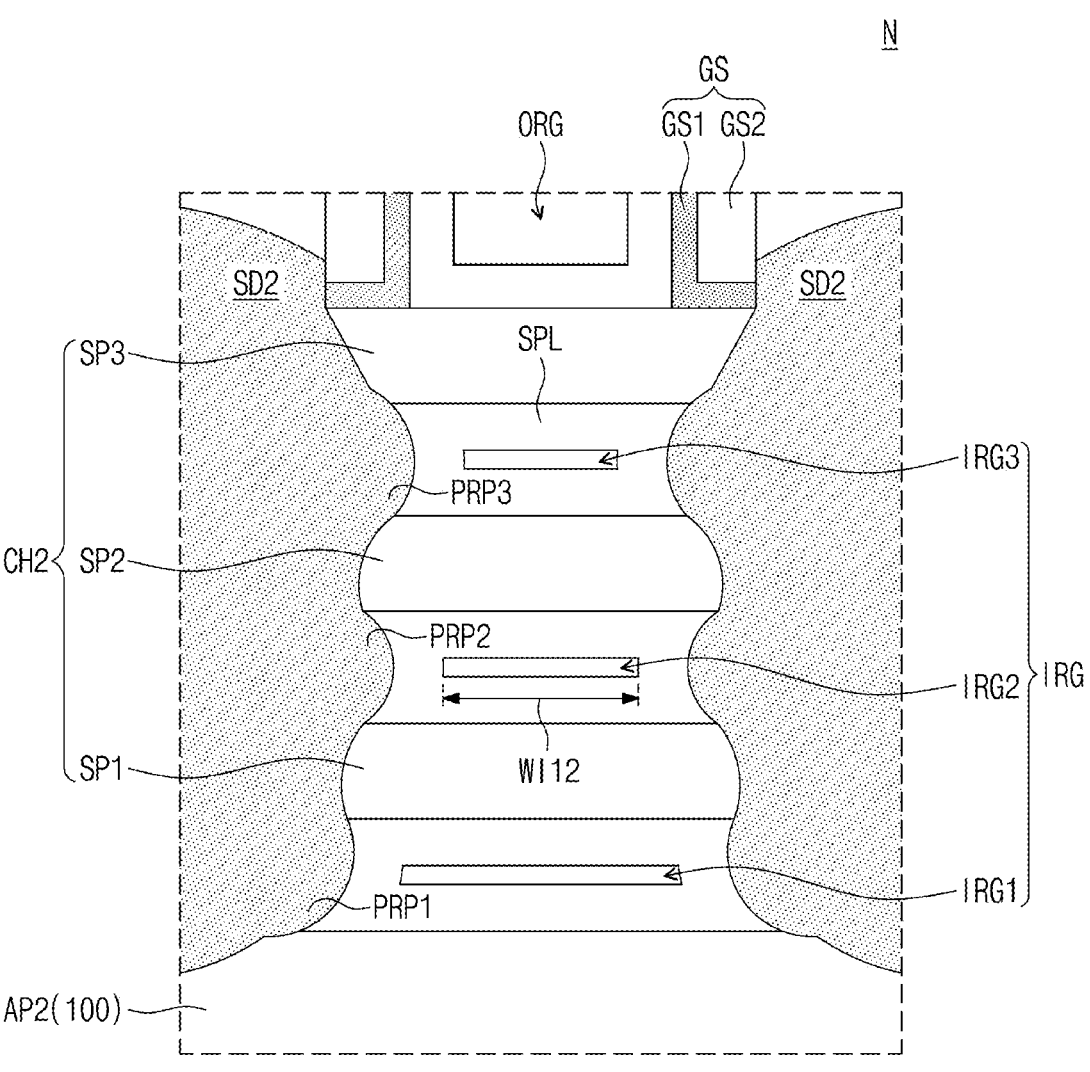
Figure 14B:

Referring to FIGS. 14A and 14B, a spacer layer SPL may be conformally formed in the first, second, and third inner regions IRG1, IRG2, and IRG3. The spacer layer SPL may also be formed on the outer region ORG. The spacer layer SPL may be formed by using a deposition process, such as atomic layer deposition (ALD) or chemical vapor deposition (CVD). The spacer layer SPL may include at least one selected from a silicon nitride layer or a silicon oxynitride layer. The spacer layer SPL may be formed to have a thickness not to completely fill the inner region IRG.

A size of the inner region IRG surrounded by the spacer layer SPL on the first active pattern AP1 may be greater than a size of the inner region IRG surrounded by the spacer layer SPL on the second active pattern AP2. For example, an eleventh width WM may be given to the inner region IRG surrounded by the spacer layer SPL on the first active pattern AP1, and a twelfth width WI12, which is less than the eleventh width WU_1, may be given to the inner region IRG surrounded by the spacer layer SPL on the second active pattern AP2.

Figure 15A:
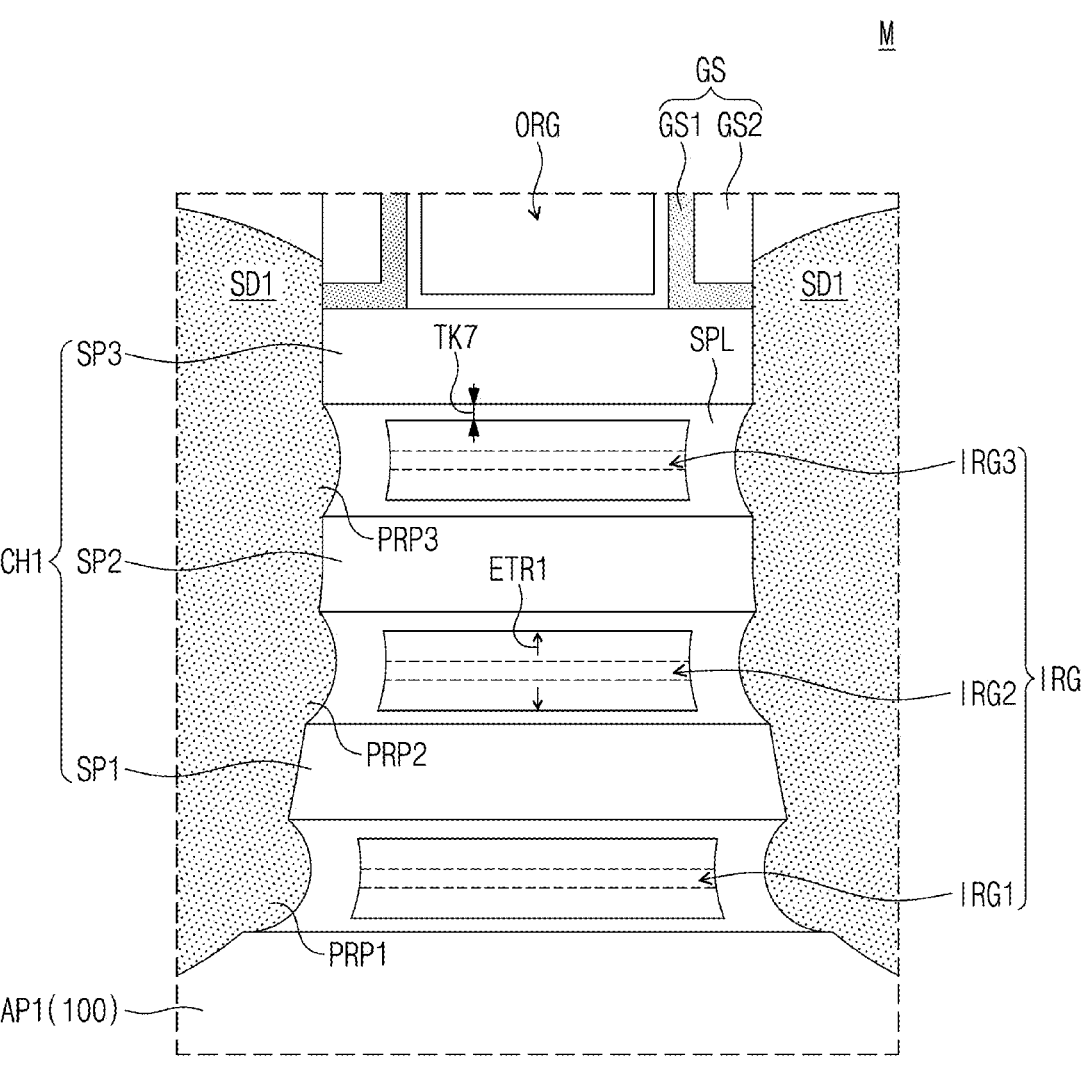
Figure 15A:
Figure 15B:
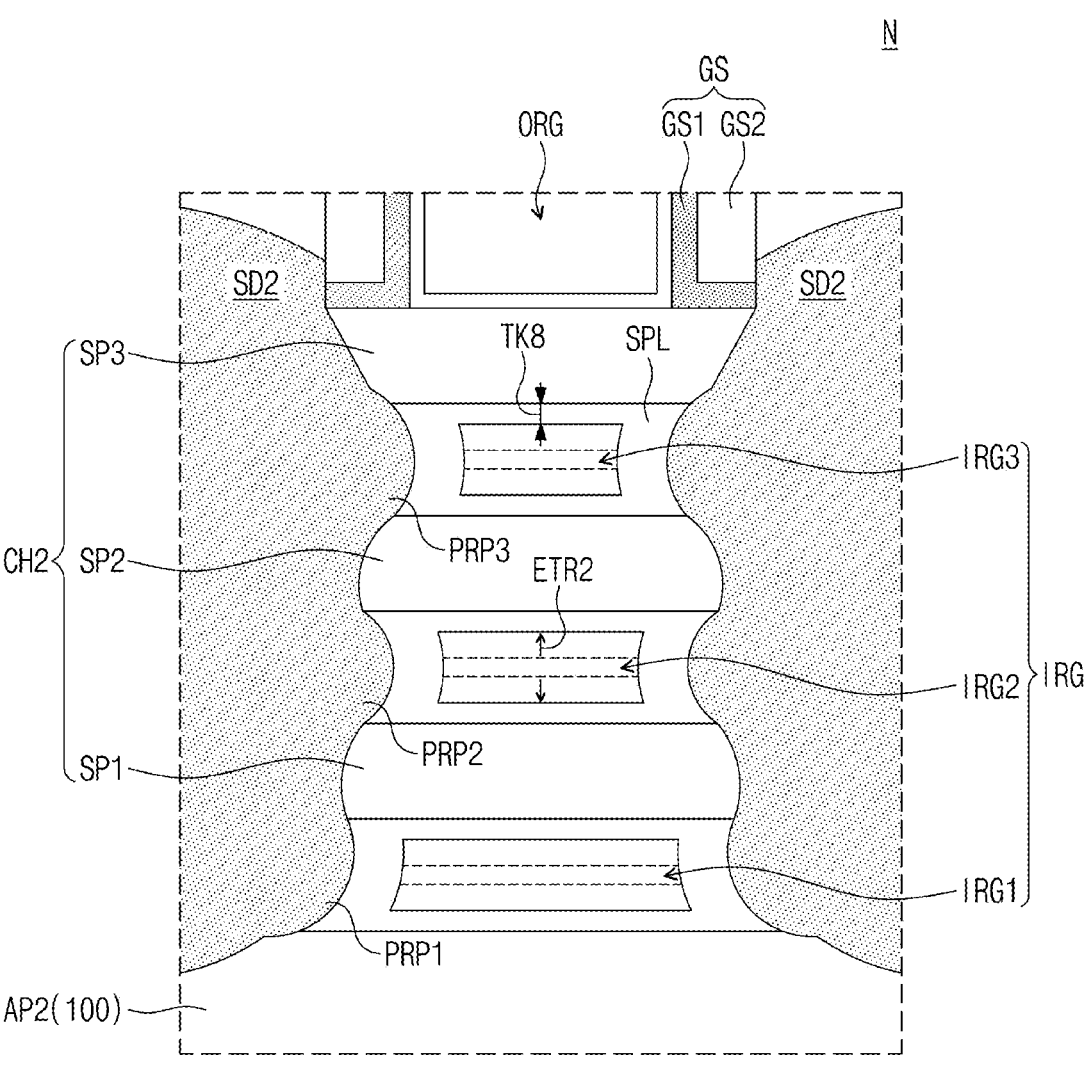
Figure 15B:

Referring to FIGS. 15A and 15B, a dry etching process may be performed on the spacer layer SPL. The dry etching process may be performed such that the spacer layer SPL is etched in a vertical direction parallel to a third direction D3. The dry etching process may cause the spacer layer SPL to have a reduced thickness in the third direction D3. However, the dry etching process may cause no significant variation in thickness in the second direction D2 of the spacer layer SPL.

An etch rate ETR1 in a vertical direction of the spacer layer SPL on the first active pattern AP1 may be greater than an etch rate ETR2 in the vertical direction of the spacer layer SPL on the second active pattern AP2. This may be because that a size of the inner region IRG surrounded by the spacer layer SPL on the first active pattern AP1 is greater than a size of the inner region IRG surrounded by the spacer layer SPL on the second active pattern AP2 (WM>WI12). Therefore, an etching gas may be more easily introduced into the inner region IRG on the first active pattern AP1 than into the inner region IRG on the second active pattern AP2.

The difference between the etch rate ETR1 on the first active pattern AP1 and the etch rate ETR2 on the second active pattern AP2 may cause that a thickness TK7 in a vertical direction of the spacer layer SPL on the first active pattern AP1 is less than a thickness TK8 in the vertical direction of the spacer layer SPL on the second active pattern AP2.

Figure 16A:
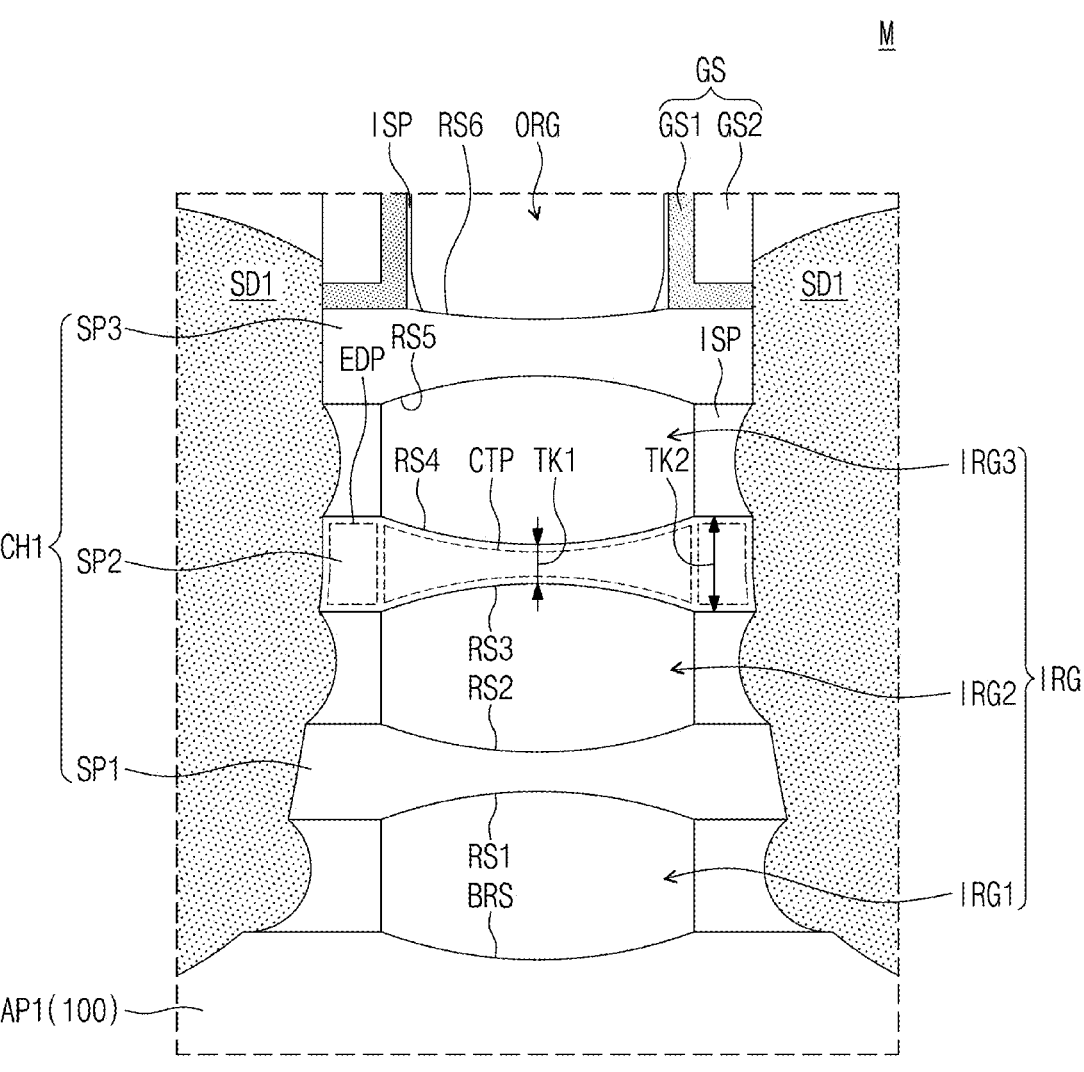
Figure 16A:
Figure 16B:
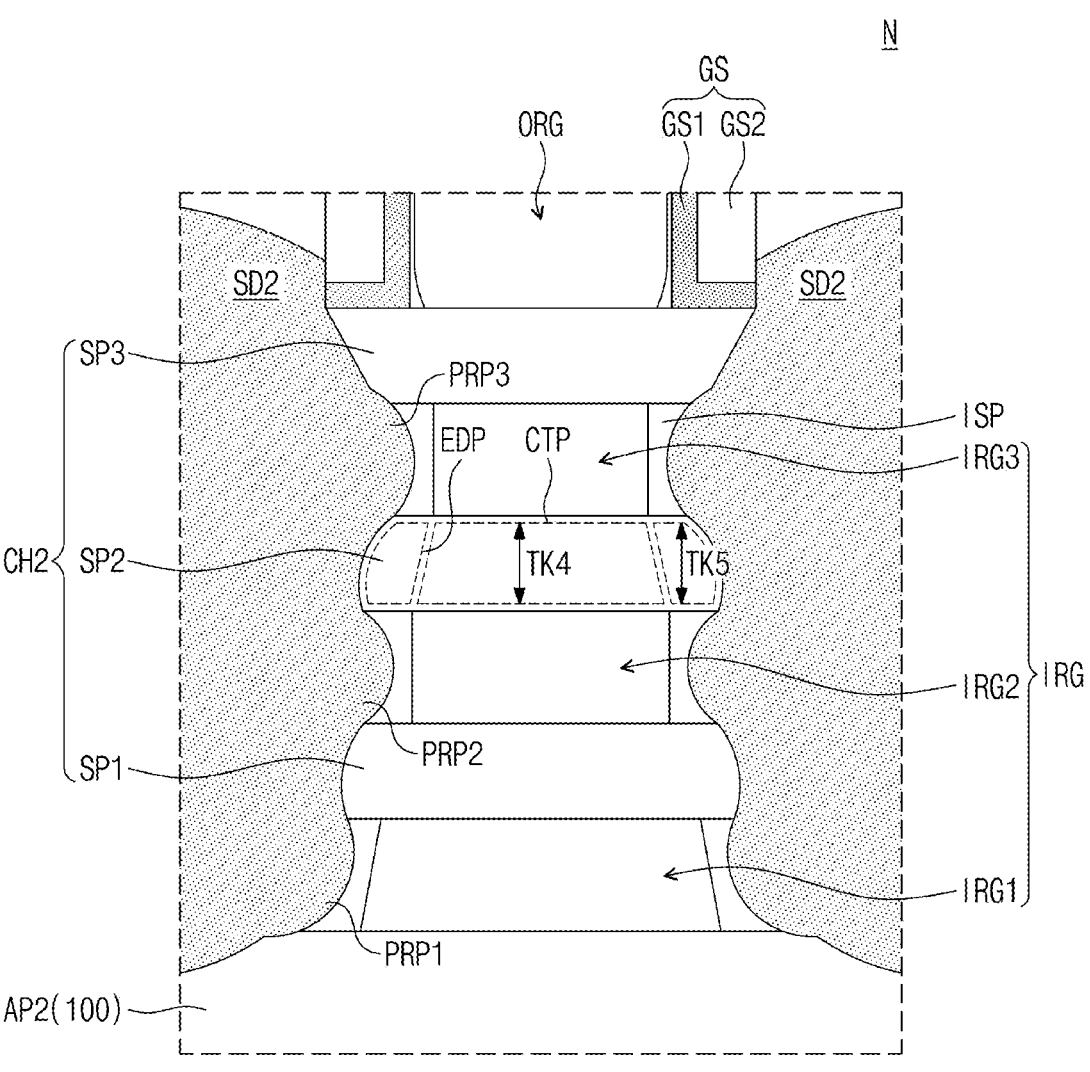
Figure 16B:

Referring to FIGS. 16A and 16B, a wet etching process may be performed on the spacer layer SPL. The wet etching process may isotropically etch the spacer layer SPL. The wet etching process may be executed until the spacer layer SPL on the second channel pattern CH2 is removed.

Because, as discussed above, a thickness (see TK8 of FIG. 15B) of the spacer layer SPL on the second channel pattern CH2 is greater than a thickness (see TK7 of FIG. 15A) of the spacer layer SPL on the first channel pattern CH1, when the wet etching process is performed until exposure of the semiconductor patterns SP1 to SP3 of the second channel pattern CH2, an over-etching may occur in the semiconductor patterns SP1 to SP3 of the first channel pattern CH1.

For example, when the wet etching process completely removes the spacer layer SPL on the semiconductor patterns SP1 to SP3 of the first channel pattern CH1, the semiconductor patterns SP1 to SP3 of the first channel pattern CH1 may be oxidized. Oxides of the semiconductor patterns SP1 to SP3 may be removed. Therefore, first to sixth channel recesses RS1 to RS6 may be formed on the first to third semiconductor patterns SP1 to SP3 of the first channel pattern CH1. An upper portion of the first active pattern AP1 exposed by the wet etching process may be oxidized and removed to form a body recess BRS.

The wet etching process may be terminated when the semiconductor patterns SP1 to SP3 of the second channel pattern CH2 are exposed, no channel recess may be formed on the semiconductor patterns SP1 to SP3 of the second channel pattern CH2. In some example embodiments, the second channel pattern CH2 may be provided thereon with a channel recess that is formed to have a recess depth less than those of the channel recesses RS1 to RS6 of the first channel pattern CH1.

The dry etching process discussed above in FIGS. 15A and 15B may allow the spacer layer SPL to have a horizontal thickness that remains almost unchanged. Thus, even after the wet etching process, a portion of the spacer layer SPL may remain to form an inner spacer ISP. The inner spacer ISP may cover a surface of one of the source/drain patterns SD1 and SD2, and may also cover a side part EDP of one of the semiconductor patterns SP1 to SP3.

The channel recesses RS1 to RS6 may be caused to give dumbbell shapes to the first, second, and third semiconductor patterns SP1, SP2, and SP3 of the first channel pattern CH1. For example, the second semiconductor pattern SP2 of the first channel pattern CH1 may include a central part CTP and side parts EDP on opposite sides of the central part CTP. The central part CTP of a given semiconductor pattern may be referred to interchangeably as a horizontally central portion (e.g., central portion in the second direction D2) of the given semiconductor pattern, and the side parts EDP of the given semiconductor pattern may be referred to interchangeably as a horizontally edge portions (e.g., edge portions in the second direction D2) of the given semiconductor pattern such that the central part CTP of the given semiconductor pattern is between the side parts EDP of the given semiconductor pattern. In the wet etching process, the central part CTP may be recessed to have a first thickness TK1. The side part EDP may be protected by the inner spacer ISP and thus may maintain a second thickness TK2 greater than the first thickness TK1. In some example embodiments of the present inventive concepts, a ratio TK1/TK2 of the first thickness TK1 to the second thickness TK2 may range from about 0.2 to about 0.8.

During the wet etching process, the spacer layer SPL may protect the first, second, and third semiconductor patterns SP1, SP2, and SP3 of the second channel pattern CH2. Therefore, each of the first, second, and third semiconductor patterns SP1, SP2, and SP3 of the second channel pattern CH2 may maintain a rod shape. For example, a fourth thickness TK4 may be given to the central part CTP of the second semiconductor pattern SP2 of the second channel pattern CH2. The side part EDP of the second semiconductor pattern SP2 of the second channel pattern CH2 may have a fifth thickness TK5 substantially the same as the fourth thickness TK4. In some example embodiments of the present inventive concepts, a ratio TK4/TK5 of the fourth thickness TK4 to the fifth thickness TK5 may range from about 0.8 to about 1.0.

According to some example embodiments of the present inventive concepts, there may be repeatedly performed the formation of the spacer layer SPL, the dry etching process of the spacer layer SPL, and the wet etching process of the spacer layer SPL that are discussed above with reference to FIGS. 14A to 16B. The formation of the spacer layer SPL, the dry etching process of the spacer layer SPL, and the wet etching process of the spacer layer SPL may constitute a cycle, and whenever the cycle is performed, the channel recesses RS1 to RS6 may become deeper and the inner spacer ISP may become thicker.

Referring again to FIG. 11C, as discussed above with reference to FIGS. 16A and 16B, the semiconductor patterns SP1 to SP3 of the first channel pattern CH1 may have their thicknesses that become reduced during the wet etching process of the spacer layer SPL. However, the semiconductor patterns SP1 to SP3 of the second channel pattern CH2 may have their thicknesses that are not substantially changed during the wet etching process of the spacer layer SPL. For example, the semiconductor patterns SP1 to SP3 of the first channel pattern CH1 may have a first thickness TK1, and the semiconductor patterns SP1 to SP3 of the second channel pattern CH2 may have a fourth thickness TK4 greater than the first thickness TK1. A width CW1 in the first direction D1 of the semiconductor patterns SP1 to SP3 of the first channel pattern CH1 may be substantially the same as a width CW2 in the first direction D1 of the semiconductor patterns SP1 to SP3 of the second channel pattern CH2.

Figure 12A:
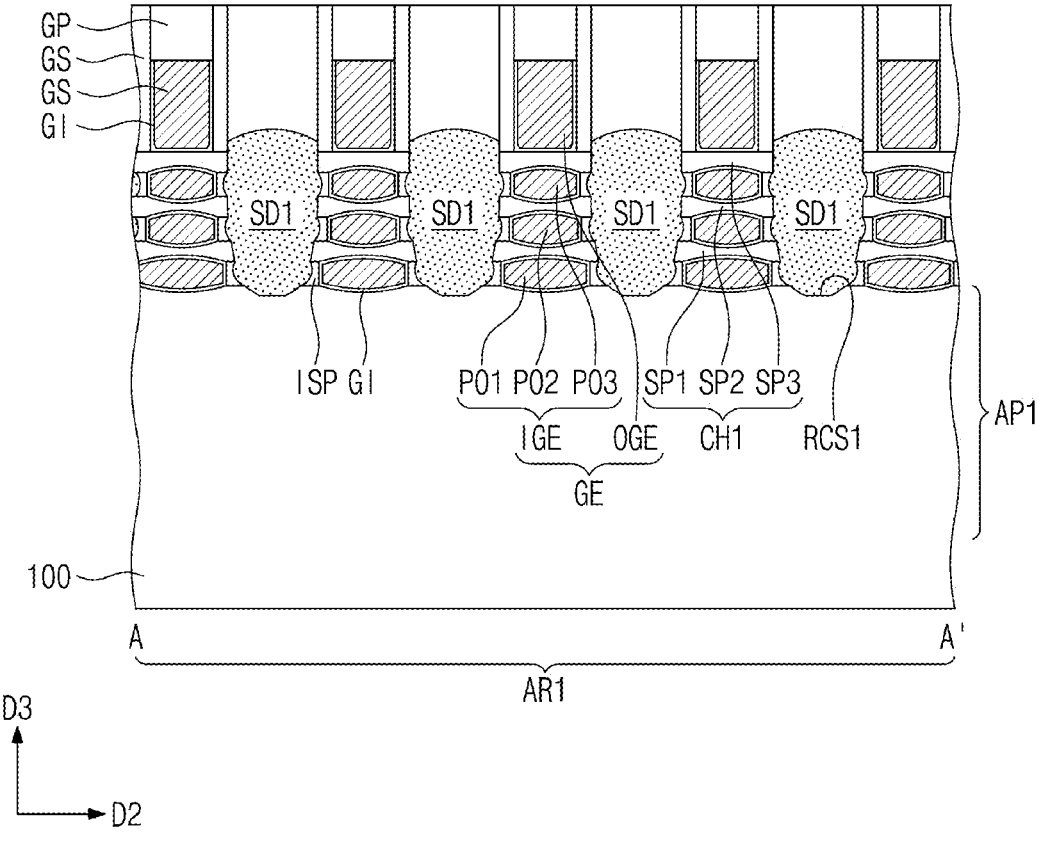
Figure 12B:
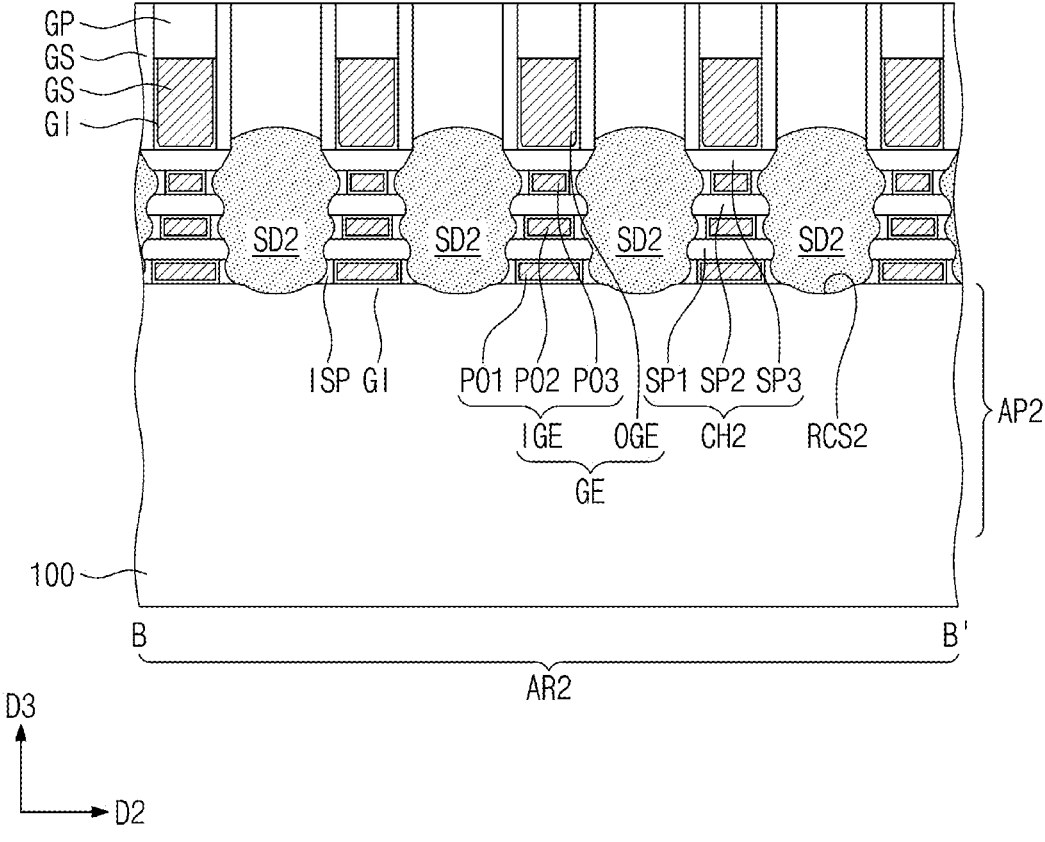
Figure 12C:
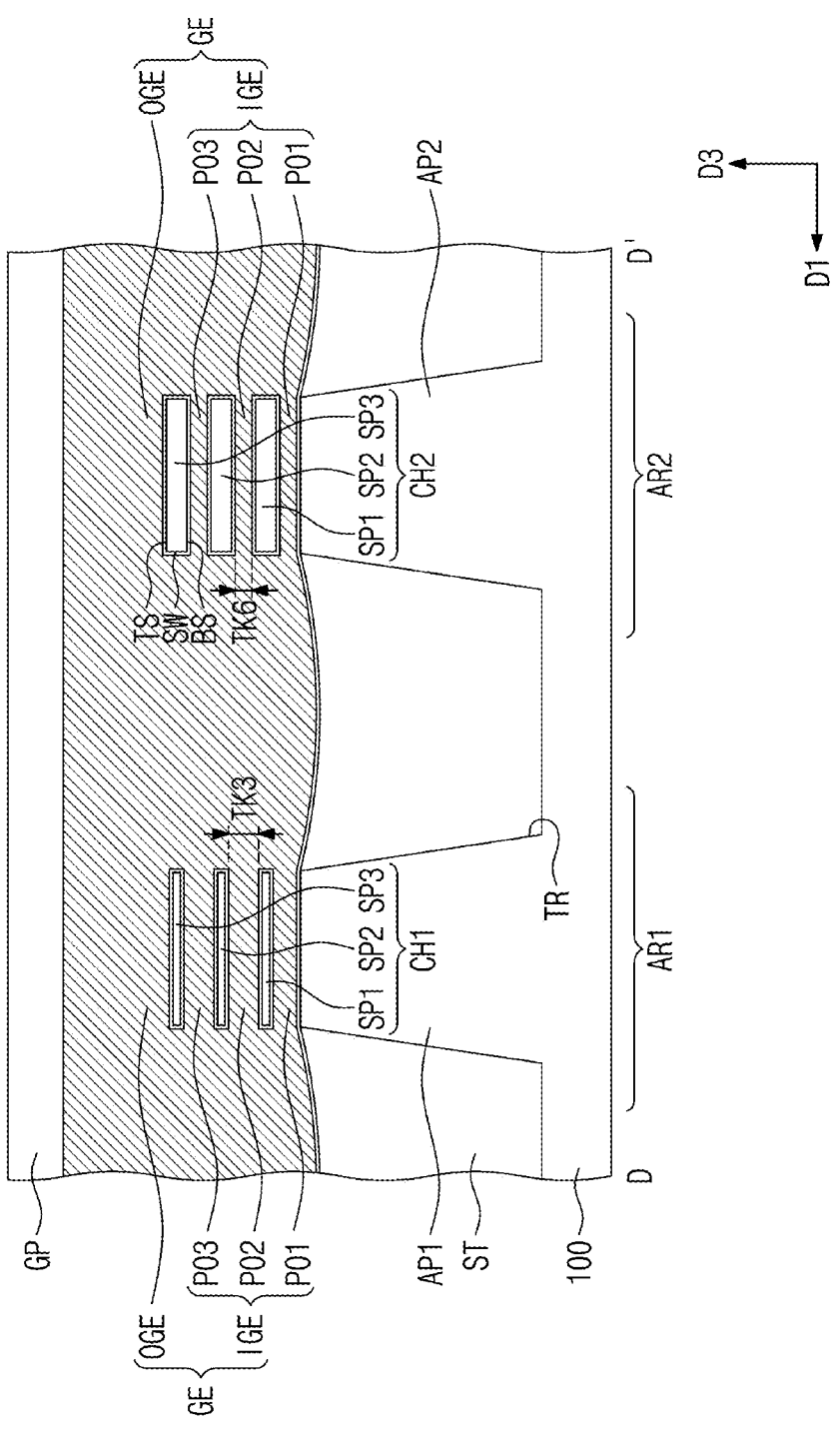

Referring to FIGS. 12A to 12C, a gate dielectric layer GI may be formed on the exposed first, second, and third semiconductor patterns SP1, SP2, and SP3. The gate dielectric layer GI may be formed to surround each of the first, second, and third semiconductor patterns SP1, SP2, and SP3. The gate dielectric layer GI may be formed in each of the first, second, and third inner regions IRG1, IRG2, and IRG3. The gate dielectric layer GI may be formed in the outer region ORG. The formation of the gate dielectric layer GI may include sequentially forming a silicon oxide layer and a high-k dielectric layer.

A gate electrode GE may be formed on the gate dielectric layer GI. The gate electrode GE may include first, second, and third inner electrodes PO1, PO2, and PO3 that are respectively formed in the first, second, and third inner regions IRG1, IRG2, and IRG3, and may also include an outer gate electrode OGE formed in the outer region ORG.

On the first active pattern AP1, the body recess BRS and the channel recesses RS1 to RS6 may cause that an inner electrode IGE adjacent to a channel is formed to have a three-dimensional gate structure. Therefore, the gate electrode GE according to the present inventive concepts may increase an effective channel length (ECL) and reduce or prevent issues caused by a short channel effect.

The gate electrode GE may be recessed to have a top surface lower than that of the gate spacer GS. A gate capping pattern GP may be formed on the recessed gate electrode GE. The gate capping pattern GP may have a top surface coplanar with that of the gate spacer GS.

Referring back to FIGS. 5A to 5D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 to come into electrical connection with the first and second source/drain patterns SD1 and SD2. A gate contact GC may be formed to penetrate the second interlayer dielectric layer 120 and the gate capping pattern GP to come into electrical connection with the gate electrode GE.

The formation of each of the active contact AC and the gate contact GC may include forming a barrier pattern BM and forming a conductive pattern FM on the barrier pattern BM. The barrier pattern BM may be conformally formed to include a metal layer and a metal nitride layer. The conductive patterns FM may include metal whose resistance is low.

Separation structures DB may be correspondingly formed on first and second boundaries BD1 and BD2 of the single height cell SHC. The separation structure DB may extend from the second interlayer dielectric layer 120 through the gate electrode GE into the active pattern AP1 or AP2. The separation structure DB may include a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

In the embodiments that follow, a detailed description of technical features repetitive to those discussed with reference to FIGS. 1 to 6B will be omitted, and a difference thereof will be discussed in detail.

Figure 17:
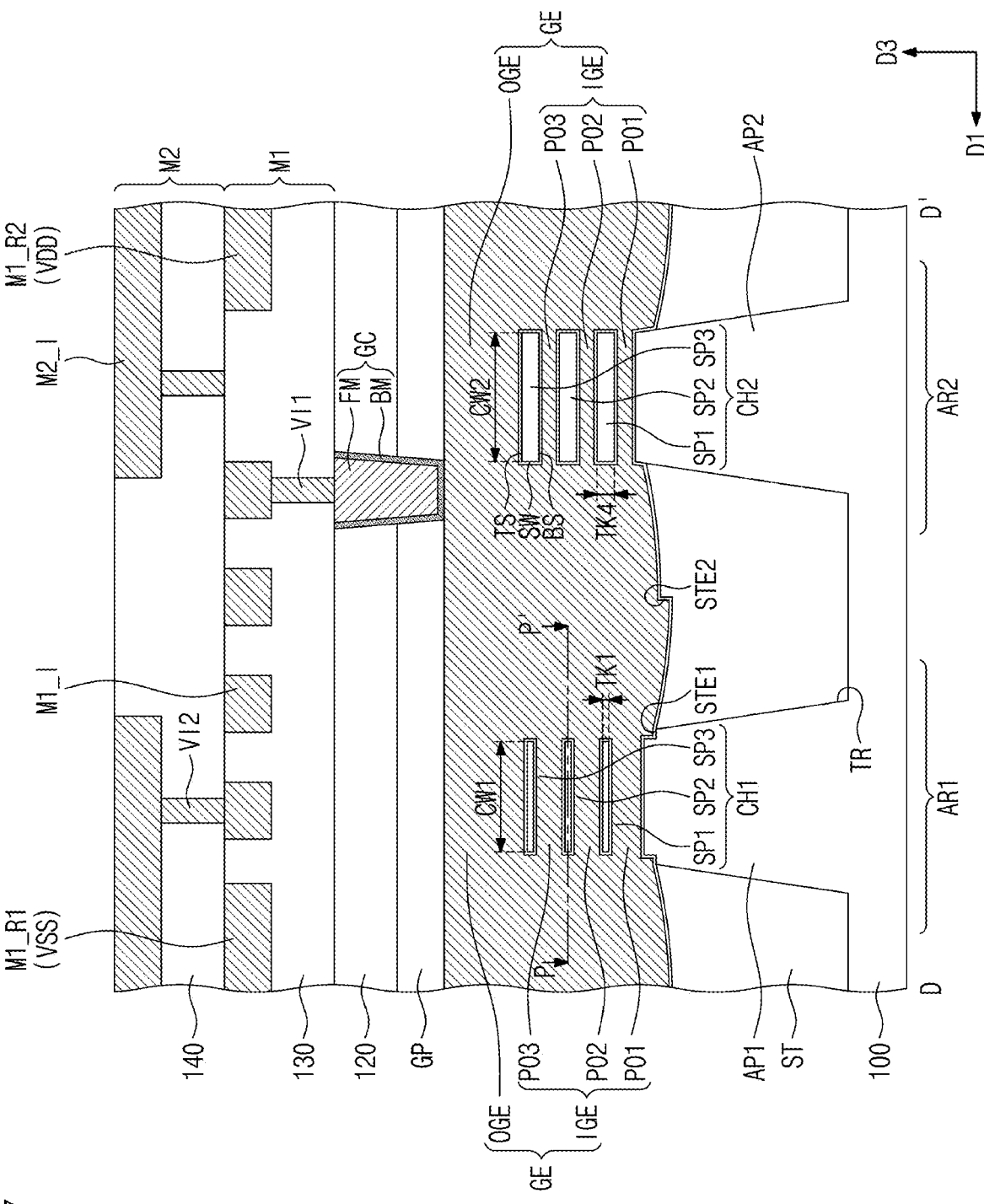
FIG. 17 illustrates a cross-sectional view taken along line D-D' of FIG. 4, showing a semiconductor device according to some example embodiments of the present inventive concepts.
Figure 18:
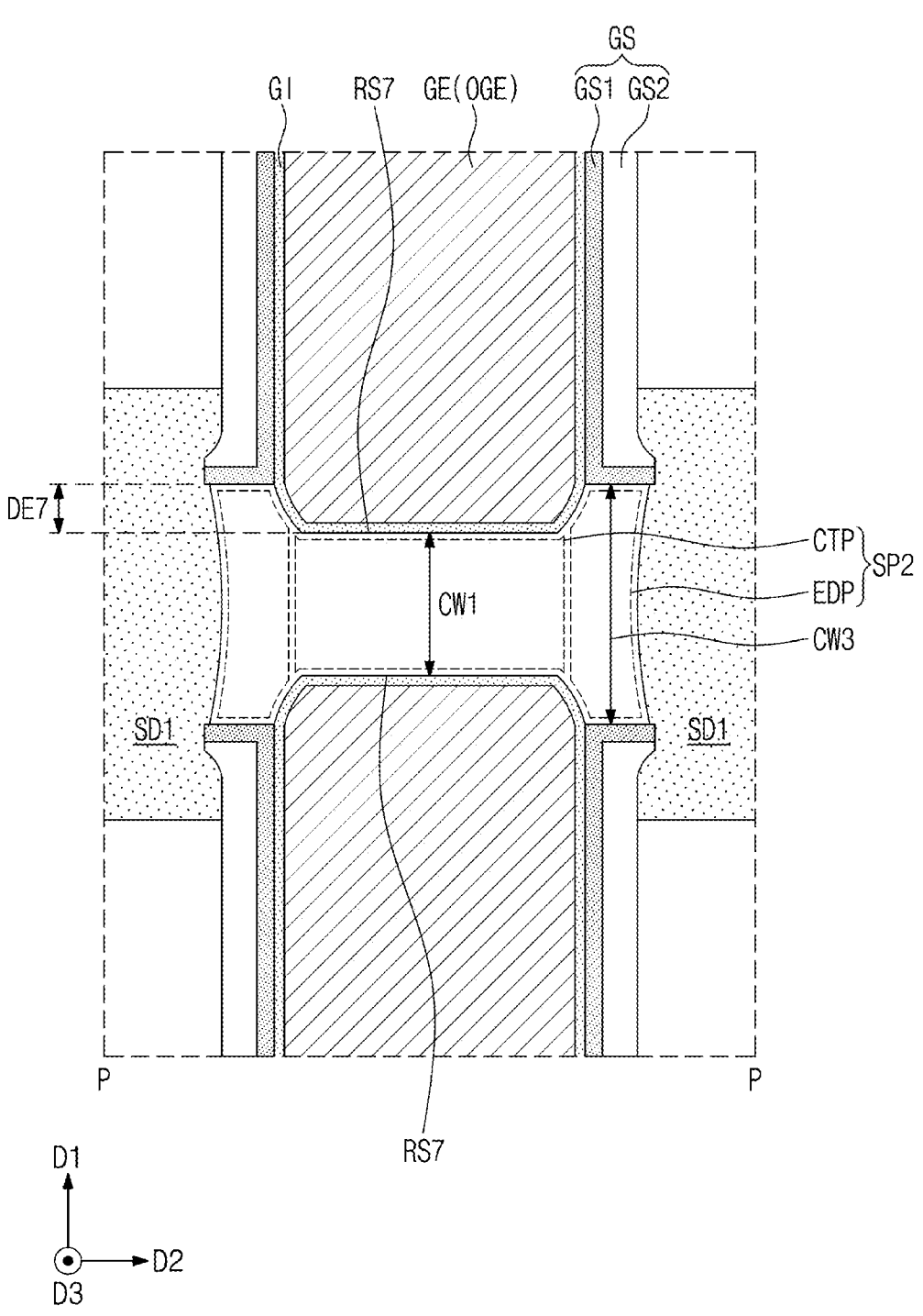
FIG. 18 illustrates a plan view taken along line P-P' of FIG. 17 according to some example embodiments of the present inventive concepts.

FIG. 17 illustrates a cross-sectional view taken along line D-D' of FIG. 4, showing a semiconductor device according to some example embodiments of the present inventive concepts. FIG. 18 illustrates a plan view taken along line P-P' of FIG. 17 according to some example embodiments of the present inventive concepts.

Referring to FIG. 17, a width CW1 in the first direction D1 of the first channel pattern CH1 may be less than a width CW2 in the first direction D1 of the second channel pattern CH2. A thickness TK1 of the nano-sheet of the first channel pattern CH1 may be less than a thickness TK4 of the nano-sheet of the second channel pattern CH2.

The first active pattern AP1 may have a discontinuously changed width at its upper portion. Thus, the upper portion of the first active pattern AP1 may include a first stepwise structure STE1. The device isolation layer ST between the first and second active patterns AP1 and AP2 may have a top surface whose height (or level) is discontinuously changed. Thus, a second stepwise structure STE2 may be included at the top surface of the device isolation layer ST between the first and second active patterns AP1 and AP2. For example, as shown in at least FIG. 17, the top surface of the device isolation layer ST below the gate electrode GE (e.g., closer to the top surface 100a and/or the bottom surface 100b of the substrate 100 in the third direction D3) includes a stepwise structure having a discontinuous change in height in the third direction D3 (e.g., vertical height) along a horizontal width (e.g., in the first direction D1) of the device isolation layer ST (e.g., at the first stepwise structure STE1 and/or the second stepwise structure STE2).

FIG. 18 depicts by way of representative example a planar shape of the second semiconductor pattern SP2 as the nano-sheet of the first channel pattern CH1. The second semiconductor pattern SP2 may include a seventh channel recess RS7 on each of opposite sides thereof. The gate dielectric layer GI and the outer gate electrode OGE may be provided in the seventh channel recess RS7.

The seventh channel recess RS7 may cause the second semiconductor pattern SP2 to have a dumbbell shape when viewed in plan. For example, the second semiconductor pattern SP2 may include a central part CTP and side parts EDP on opposite sides of the central part CTP. The central part CTP may be interposed between the outer gate electrodes OGE, where the outermost side (e.g., lateral) side surfaces of the second semiconductor pattern SP2 in the first direction D1 is a difference distance DE7 in the first direction D1. The side part EDP may be interposed between the gate spacers GS.

A width CW3 in the first direction D1 of the side part EDP may be greater than a width CW1 in the first direction D1 of the central part CTP. The difference between widths CW1 and CW3 may be twice the magnitude of the difference distance DE7. In some example embodiments of the present inventive concepts, a ratio CW1/CW3 of the width CW1 of the central part CTP to the width CW3 of the side part EDP may range from 0.2 to about 0.8.

Figure 19:
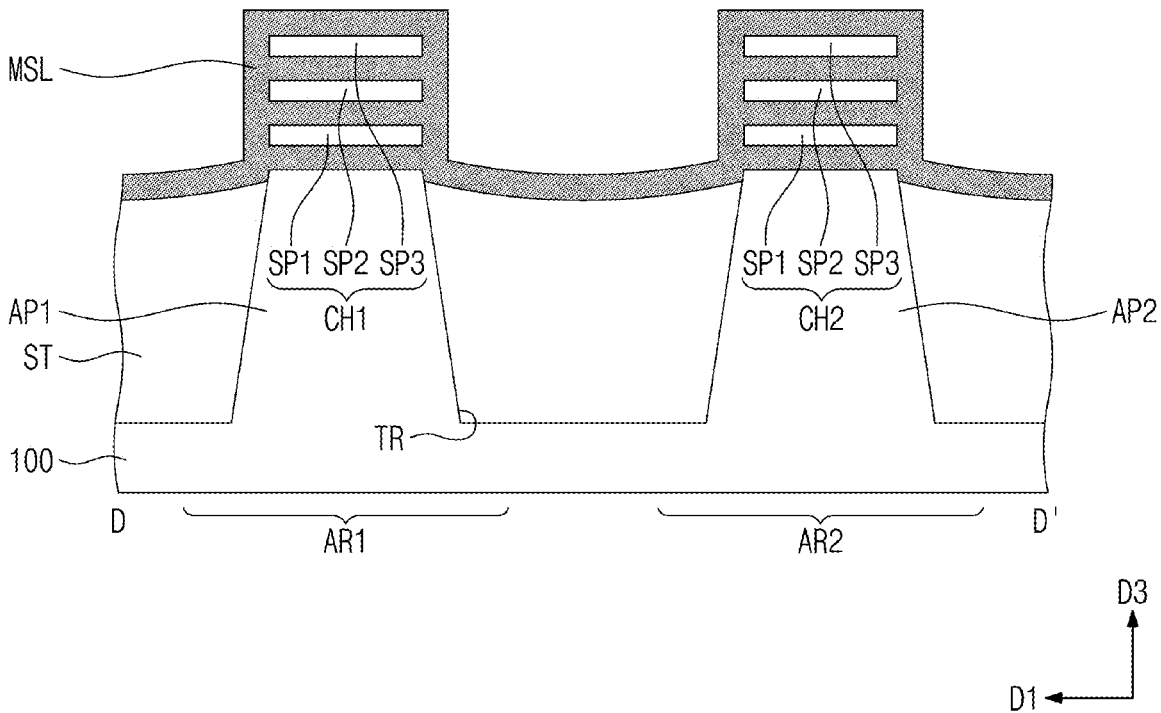
FIGS. 19, 20, and 21 illustrate cross-sectional views showing a method of fabricating a semiconductor device depicted in FIGS. 17 and 18 according to some example embodiments of the present inventive concepts.
Figure 20:
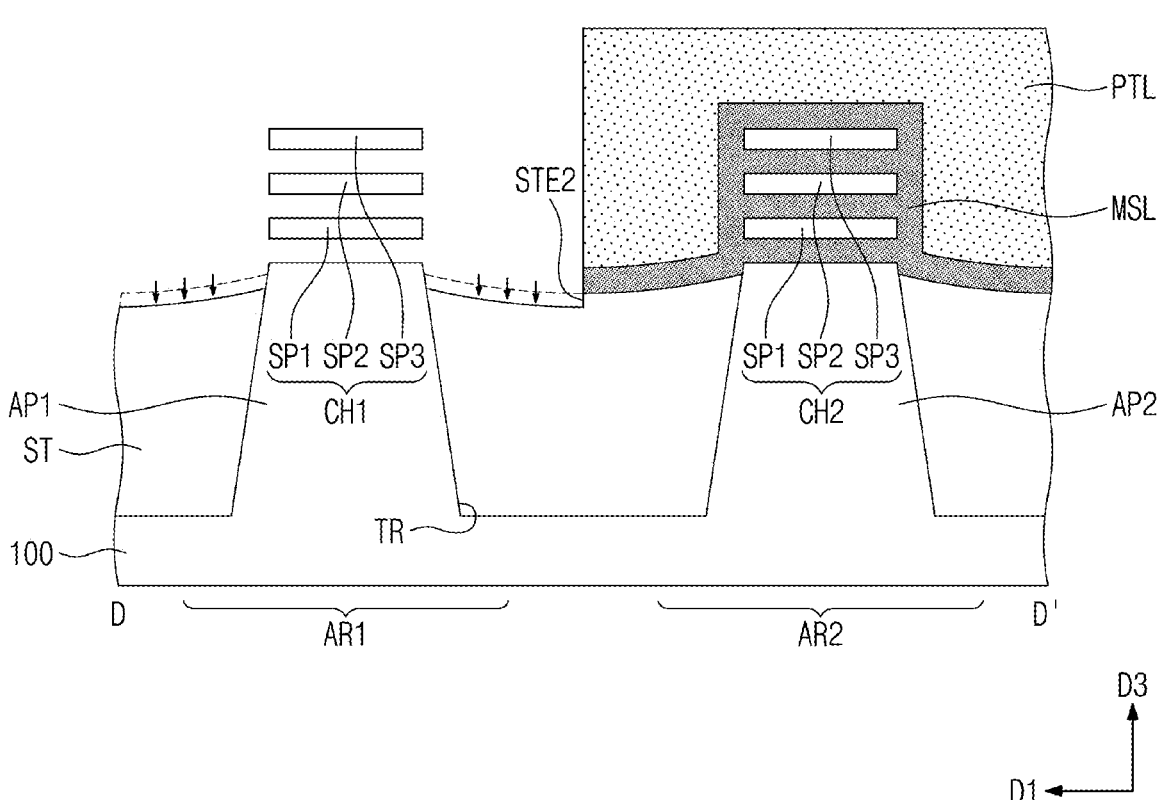
Figure 21:
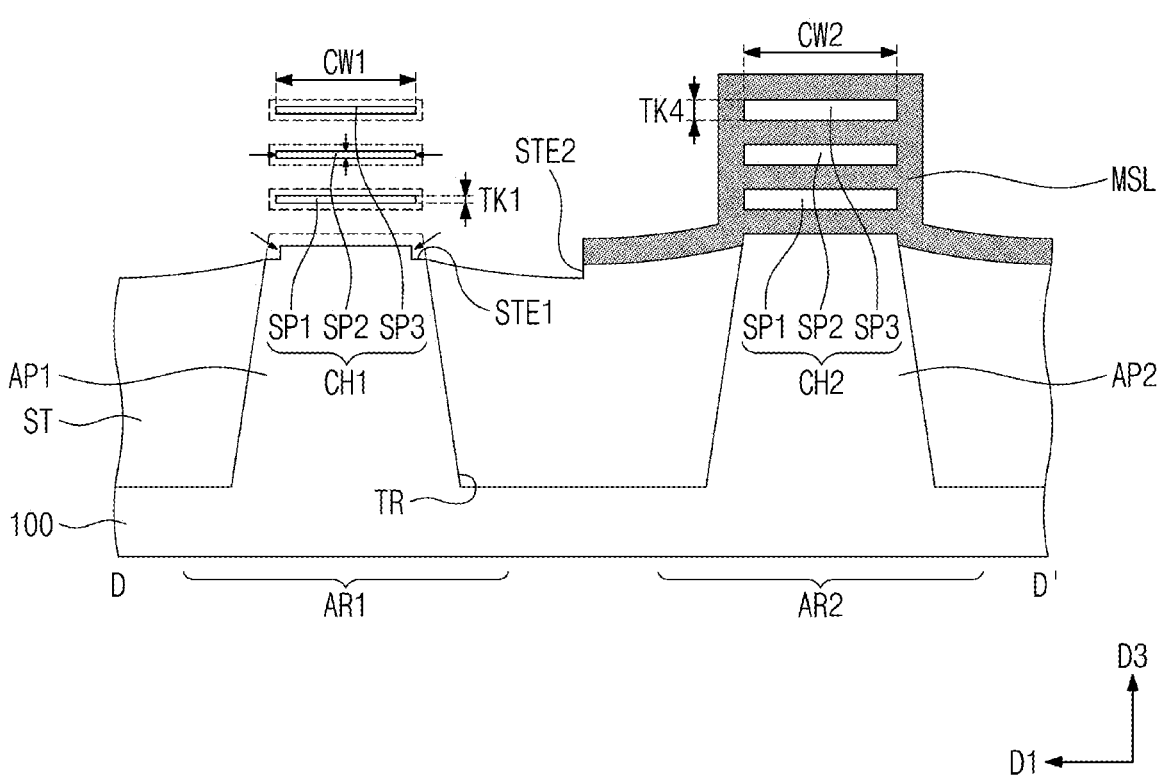

FIGS. 19, 20, and 21 illustrate cross-sectional views showing a method of fabricating a semiconductor device depicted in FIGS. 17 and 18 according to some example embodiments of the present inventive concepts. In detail, FIGS. 19 to 21 are cross-sectional views taken along line D-D' of FIG. 4.

Referring to FIG. 19, a resultant structure discussed above with reference to FIGS. 10A to 10C may undergo a process to selectively remove the sacrificial patterns PP and the sacrificial layers SAL. Afterwards, a first mask layer MSL may be formed on the first and second channel patterns CH1 and CH2.

Referring to FIG. 20, a second mask layer PTL may be formed on the first mask layer MSL, selectively covering only the second active region AR2. The second mask layer PTL may expose the first active region AR1.

The second mask layer PTL may be used as an etching mask to selectively remove the exposed first mask layer MSL. Therefore, the first mask layer MSL may all be removed from the first active region AR1. While the first mask layer MSL is selectively removed, an upper portion of the device isolation layer ST may be over-etched and removed from the first active region AR1. Thus, the device isolation layer ST may have a second stepwise structure STE2 formed on a top surface thereof. The second stepwise structure STE2 may be formed at a boundary between the first and second active regions AR1 and AR2.

Referring to FIG. 21, the second mask layer PTL may be selectively removed. For example, an ashing process may be performed to remove the second mask layer PTL. While the second mask layer PTL is removed, the first channel pattern CH1 and an exposed upper portion of the first active pattern AP1 may be partially removed. For example, there may be loss of semiconductor (e.g., Si) exposed during the ashing process. However, while the second mask layer PTL is removed, the first mask layer MSL may protect the second active pattern AP2 and the second channel pattern CH2.

The exposed upper portion of the first active pattern AP1 may be removed to form a first stepwise structure STE1 on the upper portion of the first active pattern APE The exposed first channel pattern CH1 may be partially removed. Therefore, a width CW1 of the nano-sheet of the first channel pattern CH1 may be less than a width CW2 of the nano-sheet of the second channel pattern CH2. A thickness TK1 of the nano-sheet of the first channel pattern CH1 may be less than a thickness TK4 of the nano-sheet of the second channel pattern CH2.

A remaining first mask layer MSL may all be selectively removed. A subsequent process may be substantially the same as that discussed above with reference to FIGS. 12A to 12C.

Figure 22:
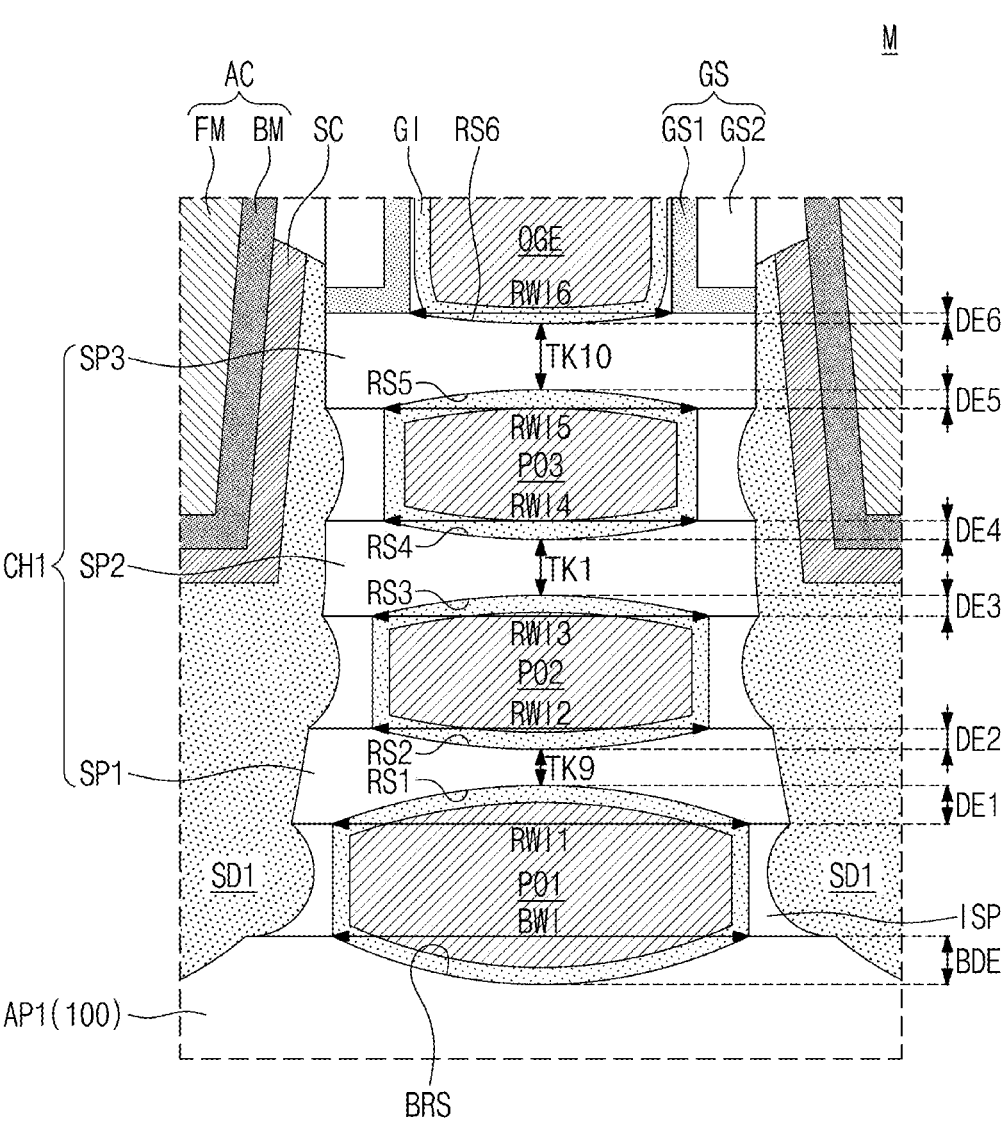
FIGS. 22, 23, and 24 illustrate enlarged views of section M depicted in FIG. 5A, showing a semiconductor device according to some example embodiments of the present inventive concepts.
Figure 22:
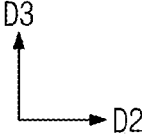
Figure 23:
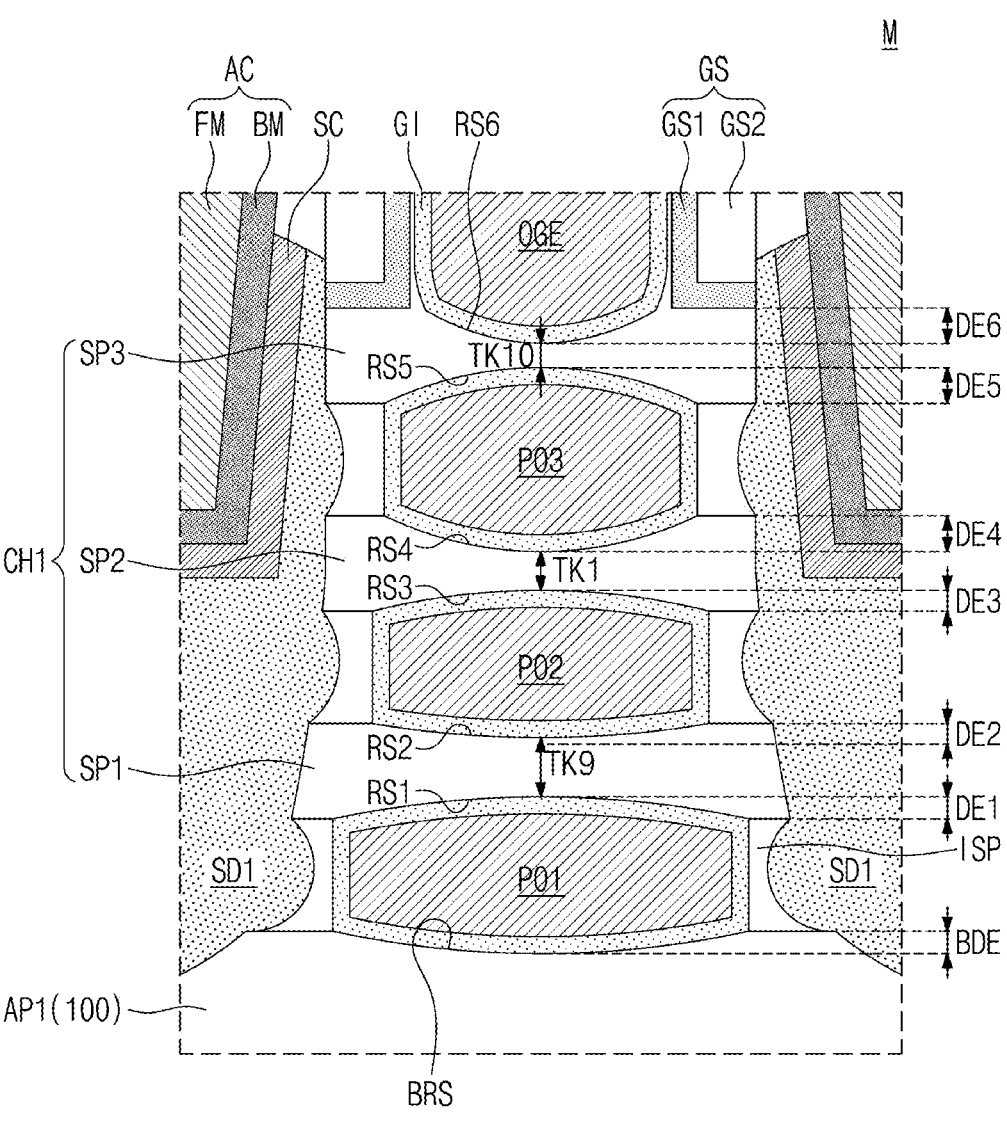
Figure 23:
Figure 24:
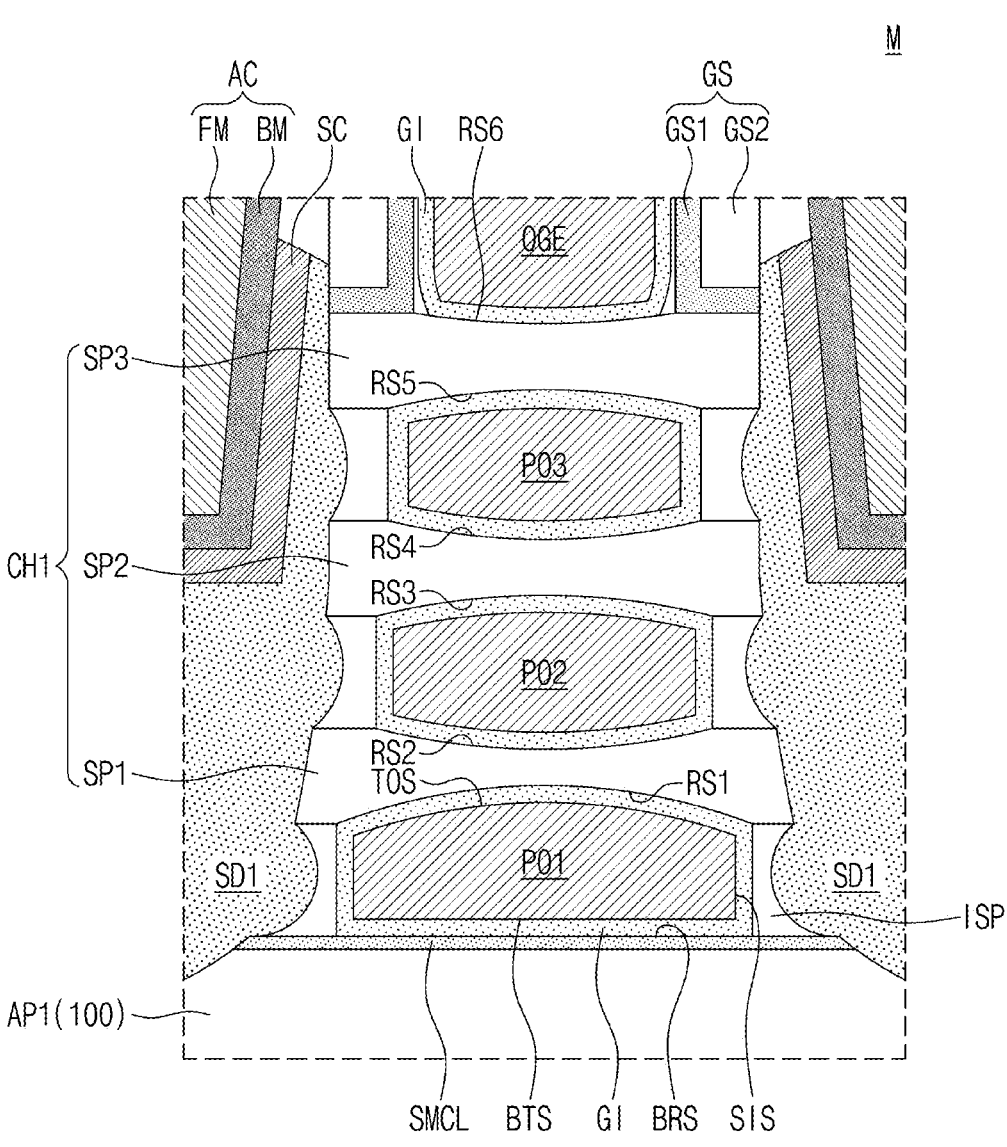
Figure 24:
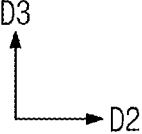

FIGS. 22, 23, and 24 illustrate enlarged views of section M depicted in FIG. 5A, showing a semiconductor device according to some example embodiments of the present inventive concepts.

Referring to FIG. 22, the first to sixth channel recesses RS1 to RS6 may have their recess depths that progressively decrease in a direction from a lower tier toward an upper tier. The first to sixth channel recesses RS1 to RS6 may have their recess depths in the second direction D2 that progressively decrease in a direction from a lower tier toward an upper tier.

For example, a second recess depth DE2 of the second channel recess RS2 may be less than a first recess depth DE1 of the first channel recess RS1. A third recess depth DE3 of the third channel recess RS3 may be less than the second recess depth DE2 of the second channel recess RS2. A fourth recess depth DE4 of the fourth channel recess RS4 may be less than the third recess depth DE3 of the third channel recess RS3. A fifth recess depth DE5 of the fifth channel recess RS5 may be less than the fourth recess depth DE4 of the fourth channel recess RS4. A sixth recess depth DE6 of the sixth channel recess RS6 may be less than the fifth recess depth DE5 of the fifth channel recess RS5.

A second recess width RWI2 of the second channel recess RS2 may be less than a first recess width RWI1 of the first channel recess RS1. A third recess width RWI3 of the third channel recess RS3 may be less than the second recess width RWI2 of the second channel recess RS2. A fourth recess width RWI4 of the fourth channel recess RS4 may be less than the third recess width RWI3 of the third channel recess RS3. A fifth recess width RWI5 of the fifth channel recess RS5 may be less than the fourth recess width RWI4 of the fourth channel recess RS4. A sixth recess width RWI6 of the sixth channel recess RS6 may be less than the fifth recess width RWI5 of the fifth channel recess RS5.

The body recess BRS may have a recess width greater than those of the channel recesses RS1 to RS6. The body recess BRS may have a recess depth greater than those of the channel recesses RS1 to RS6. For example, the body recess BRS may have a recess depth BDE greater than the first recess depth DE1 of the first channel recess RS1. The body recess BRS may have a recess width BWI greater than the first recess width RWI1 of the first channel recess RS1.

The central parts CTP of the first, second, and third semiconductor patterns SP1, SP2, and SP3 may have their widths that progressively increase in a direction from a lower tier toward an upper tier. For example, a thickness TK1 of the second semiconductor pattern SP2 may be greater than a thickness TK9 of the first semiconductor pattern SP1. A thickness TK10 of the third semiconductor pattern SP3 may be greater than the thickness TK1 of the second semiconductor pattern SP2.

As discussed above with reference to FIGS. 15A and 16A, an increase in size of the inner region IRG may induce an increase in etch rate of the spacer layer SPL. Therefore, an increase in size of the inner region IRG may induce an increase in amount of over-etching. The over-etching may form the body recess BRS and the channel recesses RS1 to RS6 on the first channel pattern CH1. Therefore, a channel recess may be formed larger at a lower tier at which the inner region IRG has a large size than at an upper tier at which the inner region IRG has a small size.

Referring to FIG. 23, differently from that discussed above with reference to FIG. 22, the first to sixth channel recesses RS1 to RS6 may have their recess depths that progressively increase in a direction from a lower tier toward an upper tier.

For example, a second recess depth DE2 of the second channel recess RS2 may be greater than a first recess depth DE1 of the first channel recess RS1. A third recess depth DE3 of the third channel recess RS3 may be greater than the second recess depth DE2 of the second channel recess RS2. A fourth recess depth DE4 of the fourth channel recess RS4 may be greater than the third recess depth DE3 of the third channel recess RS3. A fifth recess depth DE5 of the fifth channel recess RS5 may be greater than the fourth recess depth DE4 of the fourth channel recess RS4. A sixth recess depth DE6 of the sixth channel recess RS6 may be greater than the fifth recess depth DE5 of the fifth channel recess RS5.

The body recess BRS may have a recess depth less than those of the channel recesses RS1 to RS6. For example, the body recess BRS may have a recess depth BDE less than the first recess depth DE1 of the first channel recess RS1.

The central parts CTP of the first, second, and third semiconductor patterns SP1, SP2, and SP3 may have their widths that progressively decrease in a direction from a lower tier toward an upper tier. For example, a thickness TK1 of the second semiconductor pattern SP2 may be less than a thickness TK9 of the first semiconductor pattern SP1. A thickness TK10 of the third semiconductor pattern SP3 may be less than the thickness TK1 of the second semiconductor pattern SP2.

The dry and wet etching processes of the spacer layer SPL discussed above with reference to FIGS. 15A and 16A may each have an etch rate that is greater at an upper tier than at a lower tier. When an etch recipe is adjusted to induce an increase in etch rate difference according to tier (or height from the substrate 100), a channel recess may be formed larger at an upper tier than at a lower tier as shown in FIG. 23.

Referring to FIG. 24, the body recess BRS may be omitted from the upper portion of the first active pattern APE For example, the first active pattern AP1 between neighboring first source/drain patterns SD1 may have a flat top surface. The first inner electrode PO1 may have a convex top surface TOS and a flat bottom surface BTS. As the body recess BRS is omitted, a size (or volume) of the first inner electrode PO1 of the gate electrode GE may be less than that of the second inner electrode PO2 of the gate electrode GE. The body recess BRS may also be omitted from the upper portion of the second active pattern AP2.

A semiconductor layer SMCL may be provided on the top surface of the first active pattern APE The semiconductor layer SMCL may be an epitaxial layer grown from the top surface of the first active pattern APE The semiconductor layer SMCL may include one of silicon (Si), germanium (Ge), and silicon-germanium (SiGe). For example, when the semiconductor layer SMCL includes silicon (Si), no distinct boundary may be provided between the semiconductor layer SMCL and the first active pattern APE The semiconductor layer SMCL may serve to reduce or prevent the formation of a body recess.

Figure 25:
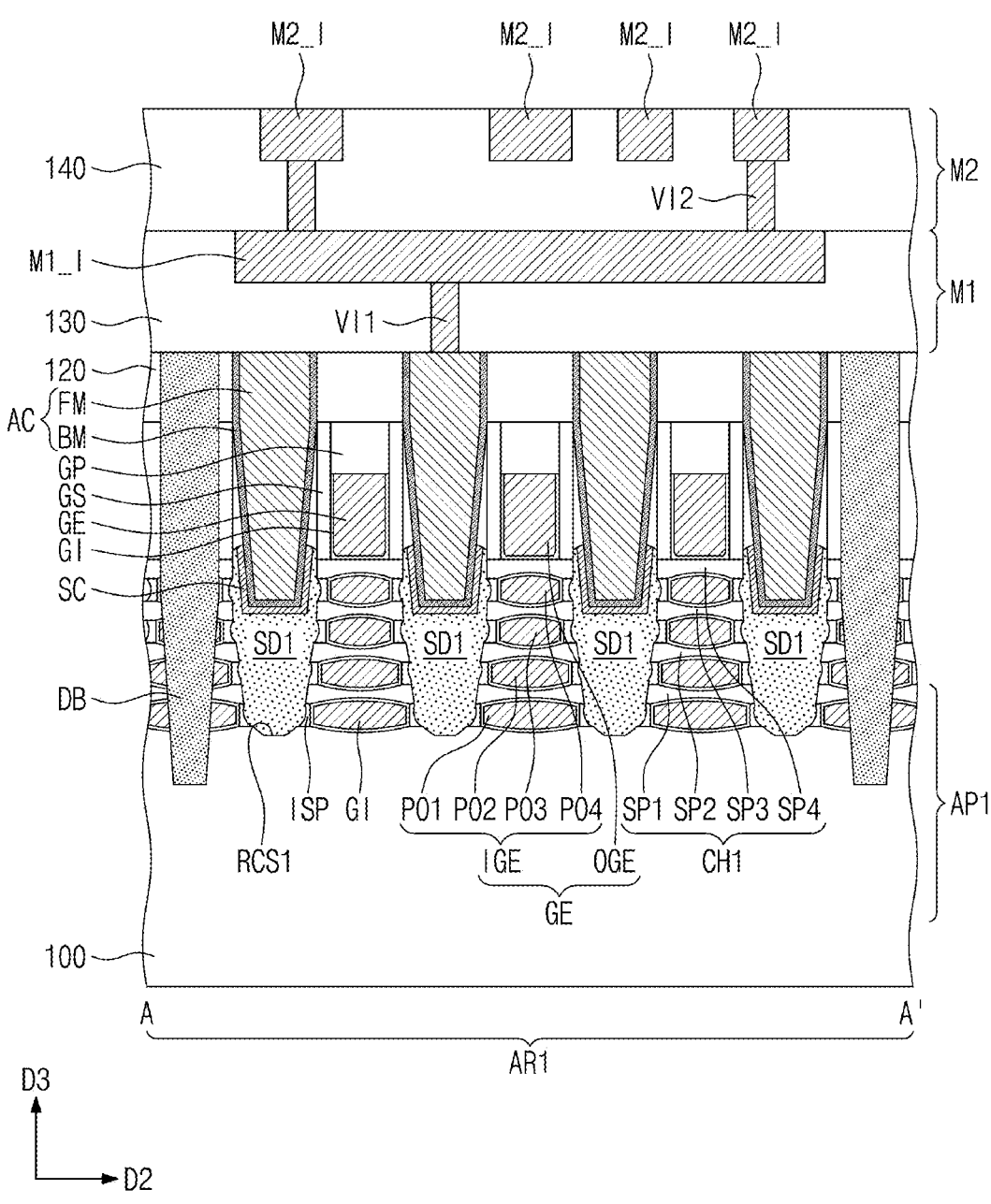
FIG. 25 illustrates a cross-sectional view taken along line A-A' of FIG. 4, showing a semiconductor device according to some example embodiments of the present inventive concepts.

FIG. 25 illustrates a cross-sectional view taken along line A-A' of FIG. 4, showing a semiconductor device according to some example embodiments of the present inventive concepts. Referring to FIG. 25, the first channel pattern CH1 may include first to fourth semiconductor patterns SP1 to SP4 that are sequentially stacked. For example, the first channel pattern CH1 may include four nano-sheets that connect a pair of first source/drain patterns SD1 to each other.

A three-dimensional semiconductor device according to some example embodiments of the present inventive concepts may include an MBCFET or GAAFET in which N number of nano-sheets are stacked. The N may be an integer equal to or greater than 2. For example, a transistor according to the present inventive concepts may include two, three, four, five, or more than five nano-sheets.

The gate electrode GE may include first to four inner electrodes PO1 to PO4 that are respectively provided below (e.g., respectively closer to the top surface 100a and/or bottom surface 100b of the substrate 100 than) the first to fourth semiconductor patterns SP1 to SP4. The gate electrode GE may further include an outer gate electrode OGE on an uppermost semiconductor pattern, or the fourth semiconductor pattern SP4. The first to fourth inner electrodes PO2 to PO4 may have their sizes (or volumes) that gradually decrease in a direction from a lower tier toward an upper tier.

Figure 26A:
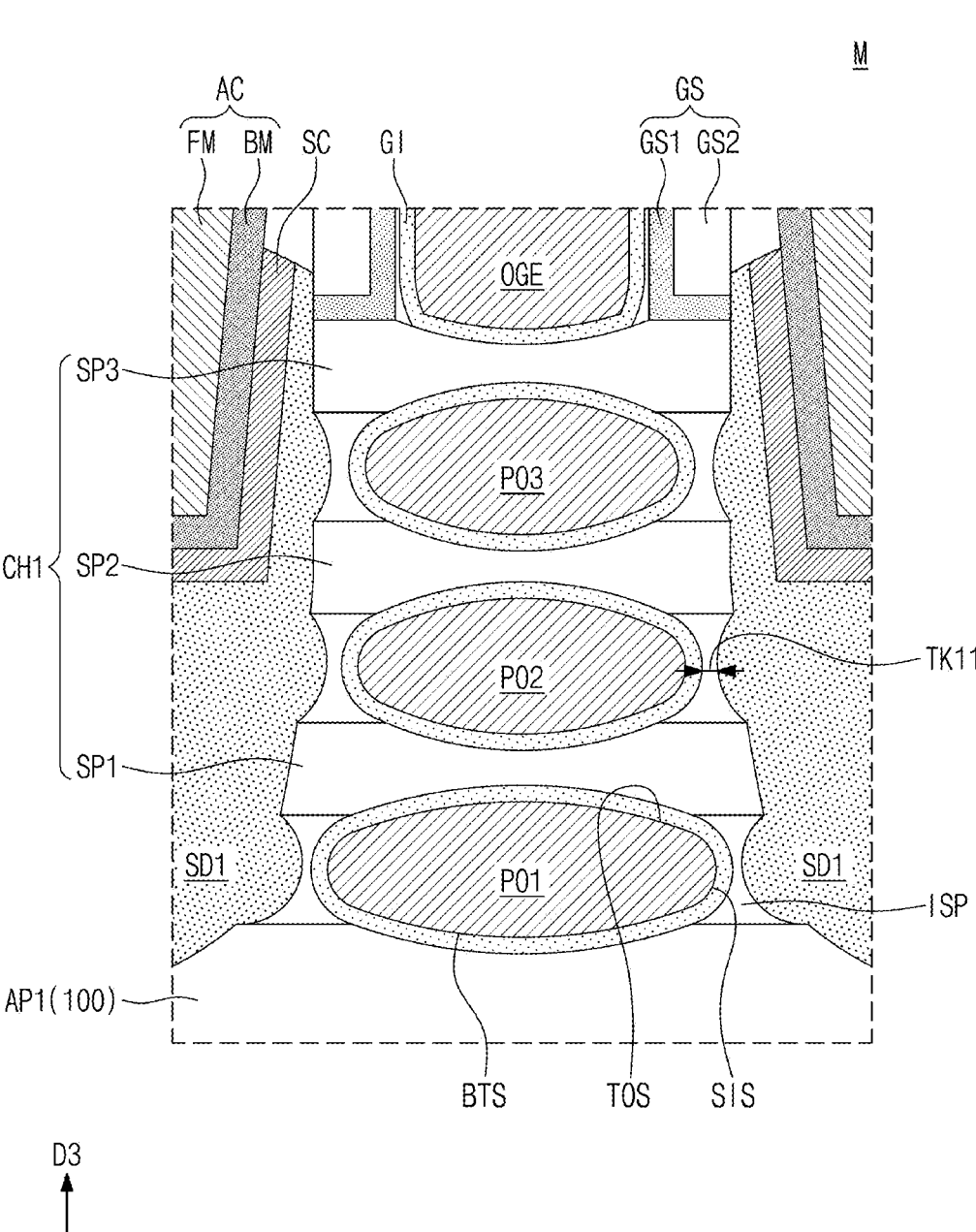
FIGS. 26A and 26B illustrate enlarged views respectively showing section M of FIG. 5A and section N of FIG. 5B according to some example embodiments of the present inventive concepts.
Figure 26B:
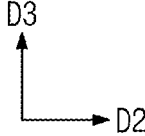

FIGS. 26A and 26B illustrate enlarged views respectively showing section M of FIG. 5A and section N of FIG. 5B according to some example embodiments of the present inventive concepts. Referring to FIGS. 26A and 26B, each of the first, second, and third inner electrodes PO1, PO2, and PO3 on the first active pattern AP1 may each have a lateral surface SIS that convexly protrudes toward the first source/drain pattern SD1. The first, second, and third inner electrodes PO1, PO2, and PO3 on the second active pattern AP2 may each have a lateral surface SIS that convexly protrudes toward the second source/drain pattern SD2.

The inner spacer ISP interposed between the second inner electrode PO2 and the source/drain pattern SD1 or SD2 may have a sandglass shape. A thickness in the second direction D2 of the inner spacer ISP may decrease and then increase in a direction from the first semiconductor pattern SP1 toward the second semiconductor pattern SP2.

The inner spacer ISP on the first active pattern AP1 may have an eleventh thickness TK11 at a center thereof, and the inner spacer ISP on the second active pattern AP2 may have a twelfth thickness TK12 at a center thereof. The eleventh thickness TK11 and the twelfth thickness TK12 may be different from each other.

In some example embodiments of the present inventive concepts, the eleventh thickness TK11 may be less than the twelfth thickness TK12. For example, the lateral surfaces SIS of the inner electrodes PO1 to PO3 on the first active pattern AP1 may horizontally protrude more than the lateral surfaces SIS of the inner electrodes PO1 to PO3 on the second active pattern AP2.

Figure 27A:
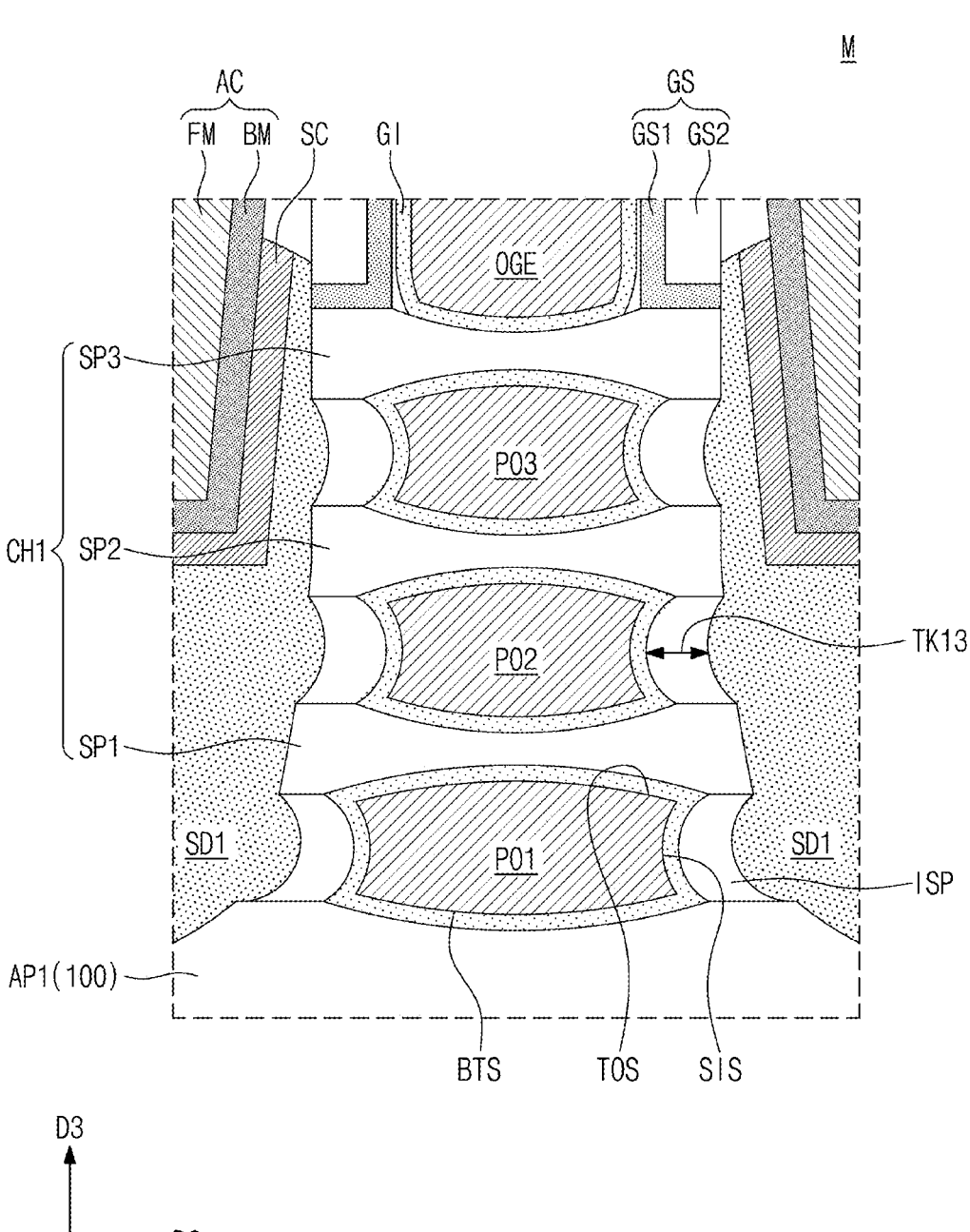
FIGS. 27A and 27B illustrate enlarged views respectively showing section M of FIG. 5A and section N of FIG. 5B according to some example embodiments of the present inventive concepts.
Figure 27B:

FIGS. 27A and 27B illustrate enlarged views respectively showing section M of FIG. 5A and section N of FIG. 5B according to some example embodiments of the present inventive concepts. Referring to FIGS. 27A and 27B, each of the first, second, and third inner electrodes PO1, PO2, and PO3 on the first active pattern AP1 may have a lateral surface SIS that is concavely recessed in a direction away from the first source/drain pattern SD1. Each of the first, second, and third inner electrodes PO1, PO2, and PO3 on the second active pattern AP2 may have a lateral surface SIS that is concavely recessed in a direction away from the second source/drain pattern SD2.

The inner spacer ISP interposed between the second inner electrode PO2 and the source/drain pattern SD1 or SD2 may have a half-moon shape or a crescent shape.

The inner spacer ISP on the first active pattern AP1 may have a thirteenth thickness TK13 at a center thereof, and the inner spacer ISP on the second active pattern AP2 may have a fourteenth thickness TK14 at a center thereof. The thirteenth thickness TK13 and the fourteenth thickness TK14 may be different from each other.

In some example embodiments of the present inventive concepts, the thirteenth thickness TK13 may be greater than the fourteenth thickness TK14. For example, the lateral surfaces SIS of the inner electrodes PO1 to PO3 on the first active pattern AP1 may be horizontally recessed more than the lateral surfaces SIS of the inner electrodes PO1 to PO3 on the second active pattern AP2.

In a three-dimensional field effect transistor according to the present inventive concepts, as a nano-sheet of NMOS-FET includes a channel recess, an effective channel length (ECL) may increase. Therefore, the present inventive concepts may reduce or prevent a short channel effect and improve electrical properties of devices.

The present inventive concepts may selectively adjust an NMOSFET to have a small channel thickness while allowing a PMOSFET to maintain its relatively large channel thickness. Accordingly, it may be possible to improve electrical properties of the NMOSFET without degradation of performance of the PMOSFET, thereby improving performance of a semiconductor device including the NMOSFET and PMOSFET.

Although some example embodiments of the present inventive concepts have been discussed with reference to accompanying figures, it will be understood that various changes in form and details may be made therein without departing from the spirit and scope of the present inventive concepts. It will be apparent to those skilled in the art that various substitution, modifications, and changes may be thereto without departing from the scope and spirit of the present inventive concepts.

What is claimed is:

1. A semiconductor device, comprising:
   a substrate including an NMOSFET region and a PMOS-FET region that are opposite to each other;
   a first channel pattern on the NMOSFET region and a second channel pattern on the PMOSFET region, each of the first and second channel patterns including a plurality of semiconductor patterns that are spaced apart from and vertically stacked on each other;
   a first source/drain pattern on the NMOSFET region and a second source/drain pattern on the PMOSFET region, the first source/drain pattern being connected to the first channel pattern, and the second source/drain pattern being connected to the second channel pattern; and
   a gate electrode on the first and second channel patterns, wherein the gate electrode includes
      a first inner electrode between neighboring semiconductor patterns of the plurality of semiconductor patterns of the first channel pattern, and
      a second inner electrode between neighboring semiconductor patterns of the plurality of semiconductor patterns of the second channel pattern, and
   wherein a convex top surface of the first inner electrode is more convex than a top surface of the second inner electrode.

2. The semiconductor device of claim 1, wherein the first inner electrode and the second inner electrode are at a same tier.

3. The semiconductor device of claim 1, wherein a bottom surface of the first inner electrode is more convex than a bottom surface of the second inner electrode.

4. The semiconductor device of claim 1, wherein a width of the first inner electrode is greater than a width of the second inner electrode.

5. The semiconductor device of claim 1, wherein the plurality of semiconductor patterns of the first channel pattern includes a first semiconductor pattern adjacent to the top surface of the first inner electrode, the plurality of semiconductor patterns of the second channel pattern includes a second semiconductor pattern adjacent to the top surface of the second inner electrode, and a thickness at a central part of the first semiconductor pattern is less than a thickness at a central part of the second semiconductor pattern.

6. The semiconductor device of claim 5, wherein a ratio of the thickness at the central part of the first semiconductor pattern to a thickness at a side part of the first semiconductor pattern is in a range of about 0.2 to about 0.8.

7. The semiconductor device of claim 5, wherein a ratio of the thickness at the central part of the second semiconductor pattern to a thickness at a side part of the second semiconductor pattern is in a range of about 0.8 to about 1.0.

8. The semiconductor device of claim 5, wherein a thickness at a side part of the first semiconductor pattern is substantially a same thickness as a thickness at a side part of the second semiconductor pattern.

9. The semiconductor device of claim 5, wherein the first inner electrode has an eye shape, and the first semiconductor pattern has a dumbbell shape.

10. The semiconductor device of claim 1, further comprising:

a device isolation layer that fills a trench between the NMOSFET region and the PMOSFET region, wherein a top surface of the device isolation layer below the gate electrode includes a stepwise structure having a discontinuous change in vertical height along a horizontal width of the device isolation layer.

11. A semiconductor device, comprising:

a substrate that includes an active pattern;

a channel pattern on the active pattern, the channel pattern including a plurality of semiconductor patterns that are spaced apart from and vertically stacked on each other;

a source/drain pattern that connects the plurality of semiconductor patterns to each other; and a gate electrode on the plurality of semiconductor patterns, wherein the gate electrode includes a first inner electrode and a second inner electrode that are adjacent to each other, wherein the plurality of semiconductor patterns include a first semiconductor pattern between the first and second inner electrodes, wherein the first semiconductor pattern includes a central part between a convex top surface of the first inner electrode and a convex bottom surface of the second inner electrode, and a side part connected to the source/drain pattern, wherein the convex top surface of the first inner electrode defines a first channel recess on a bottom surface of the first semiconductor pattern, wherein the convex bottom surface of the second inner electrode defines a second channel recess on a top surface of the first semiconductor pattern, wherein a recess depth of the first channel recess is different from a recess depth of the second channel recess, wherein a thickness of the central part has a minimum value at a center of the central part of the first semiconductor pattern and progressively increases in a direction from the center of the central part of the first semiconductor pattern toward the side part of the first semiconductor pattern, the minimum value of the thickness of the central part of the first semiconductor pattern being a minimum thickness of the central part of the first semiconductor pattern, and wherein a ratio of the minimum thickness of the central part of the first semiconductor pattern to a thickness of the side part of the first semiconductor pattern is in a range of about 0.2 to about 0.8.

12. The semiconductor device of claim 11, wherein each of the first and second inner electrodes has an eye shape, and the first semiconductor pattern has a dumbbell shape.

13. The semiconductor device of claim 11, wherein the gate electrode further includes a third inner electrode on the second inner electrode, the plurality of semiconductor patterns further includes a second semiconductor pattern between the second and third inner electrodes, and a minimum thickness of a central part of the second semiconductor pattern is different from the minimum thickness of the central part of the first semiconductor pattern.

14. The semiconductor device of claim 13, wherein a thickness of a side part of the second semiconductor pattern is substantially a same thickness as the thickness of the side part of the first semiconductor pattern.

15. A semiconductor device, comprising:

a substrate including an NMOSFET region and a PMOSFET region that are opposite to each other;

a device isolation layer that fills a trench between the NMOSFET region and the PMOSFET region;

a first channel pattern on the NMOSFET region and a second channel pattern on the PMOSFET region, each of the first and second channel patterns including a plurality of semiconductor patterns that are spaced apart from and vertically stacked on each other;

a first source/drain pattern on the NMOSFET region and a second source/drain pattern on the PMOSFET region, the first source/drain pattern connected to the first channel pattern, and the second source/drain pattern connected to the second channel pattern;

a gate electrode on the first and second channel patterns, the gate electrode including a first inner electrode between neighboring semiconductor patterns of the plurality of semiconductor patterns of the first channel pattern and a second inner electrode between neighboring semiconductor patterns of the plurality of semiconductor patterns of the second channel pattern;

a gate dielectric layer that surrounds each of the first and second inner electrodes;

a gate spacer on a sidewall of the gate electrode;

a gate capping pattern on a top surface of the gate electrode;

an interlayer dielectric layer on the gate capping pattern;

an active contact that penetrates the interlayer dielectric layer to come into electrical connection with one of the first source/drain pattern or the second source/drain pattern;

a metal-semiconductor compound layer between the active contact and the one of the first source/drain pattern or the second source/drain pattern;

a gate contact that penetrates the interlayer dielectric layer and the gate capping pattern to come into electrical connection with the gate electrode;

a first metal layer on the interlayer dielectric layer, the first metal layer including a power line and first wiring lines, the first wiring lines electrically connected to separate, respective contacts of the active contact or the gate contact; and a second metal layer on the first metal layer, wherein the second metal layer includes second wiring lines electrically connected to the first metal layer, wherein the first channel pattern includes a first semiconductor pattern adjacent to a convex top surface of the first inner electrode, wherein the second channel pattern includes a second semiconductor pattern adjacent to a top surface of the second inner electrode, wherein a maximum thickness of the first inner electrode is greater than a maximum thickness of the second inner electrode, and wherein a minimum thickness of the first semiconductor pattern is less than a minimum thickness of the second semiconductor pattern.

16. The semiconductor device of claim 15, wherein the first semiconductor pattern includes a side part connected to the first source/drain pattern, and a ratio of the minimum thickness of the first semiconductor pattern to a thickness of the side part of the first semiconductor pattern is in a range of about 0.2 to about 0.8.

17. The semiconductor device of claim 15, wherein the second semiconductor pattern includes a side part connected to the second source/drain pattern, and a ratio of the minimum thickness of the second semiconductor pattern to a thickness of the side part of the second semiconductor pattern is in a range of about 0.8 to about 1.0.

18. The semiconductor device of claim 15, wherein the first semiconductor pattern includes a first side part connected to the first source/drain pattern, the second semiconductor pattern includes a second side part connected to the second source/drain pattern, and a thickness of the first side part is substantially a same thickness as a thickness of the second side part.

19. The semiconductor device of claim 15, wherein the convex top surface of the first inner electrode is more convex than the top surface of the second inner electrode.

* * * * *